(12) United States Patent
Ryu et al.

(10) Patent No.: US 11,968,898 B2
(45) Date of Patent: Apr. 23, 2024

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Hye-Gun Ryu, Paju-si (KR); Ik-Rang Choe, Paju-si (KR); Jun-Yun Kim, Paju-si (KR); Seong-Keun Kim, Paju-si (KR); Ju-Young Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 747 days.

(21) Appl. No.: 17/077,240

(22) Filed: Oct. 22, 2020

(65) Prior Publication Data
US 2021/0126205 A1   Apr. 29, 2021

(30) Foreign Application Priority Data

Oct. 24, 2019  (KR) .................. 10-2019-0133040
Sep. 7, 2020   (KR) .................. 10-2020-0113939

(51) Int. Cl.
| *H10K 85/60* | (2023.01) |
| *H10K 50/11* | (2023.01) |
| *H10K 50/18* | (2023.01) |
| *H10K 101/10* | (2023.01) |
| *H10K 101/40* | (2023.01) |

(52) U.S. Cl.
CPC ....... *H10K 85/6574* (2023.02); *H10K 85/622* (2023.02); *H10K 85/631* (2023.02); *H10K 85/6572* (2023.02); *H10K 50/11* (2023.02); *H10K 50/18* (2023.02); *H10K 2101/10* (2023.02); *H10K 2101/40* (2023.02)

(58) Field of Classification Search
None
See application file for complete search history.

(56) References Cited

U.S. PATENT DOCUMENTS

| 2016/0079314 A1* | 3/2016 | Seo ................. H10K 85/633 257/40 |
| 2016/0248032 A1 | 8/2016 | Seo et al. |

FOREIGN PATENT DOCUMENTS

| CN | 105431439 A | 3/2016 |
| CN | 109524558 A | 3/2019 |
| KR | 10-2019-0071971 A | 6/2019 |
| KR | 2019071971 A * | 6/2019 ........... C07D 209/86 |

OTHER PUBLICATIONS

KR20190071971A English Machine translation, prepared Sep. 8, 2023. (Year: 2023).*

* cited by examiner

*Primary Examiner* — Christopher M Rodd
(74) *Attorney, Agent, or Firm* — Birch, Stewart, Kolasch & Birch, LLP

(57) ABSTRACT

An organic light emitting diode (OLED) includes a first emitting material layer disposed adjacently to a first electrode and a second emitting material layer disposed adjacently to a second electrode. The first emitting material layer includes a first compound having high affinity to holes and a second compound of thermally activated delayed fluorescent material, and the second emitting material layer includes a fourth compound having high affinity to electrons and implementing triplet-triplet annihilation. Two emitting material layers having adjusted energy levels allow the OLED to lower its driving voltages and improve its luminous efficiency and luminous lifetime.

20 Claims, 12 Drawing Sheets

ORGANIC LIGHT EMITTING DIODE AND ORGANIC LIGHT EMITTING DEVICE INCLUDING THE SAME

CROSS-REFERENCE TO RELATED APPLICATIONS

This application claims the benefit under 35 U.S.C. § 119(a) to Korean Patent Application No. 10-2019-0133040, filed in the Republic of Korea on Oct. 24, 2019 and Korean Patent Application No. 10-2020-0113939, filed in the Republic of Korea on Sep. 7, 2020, the entire contents of all these applications are incorporated herein by reference in its entirely into the present application.

BACKGROUND

Technical Field

The present disclosure relates to an organic light emitting diode, and more specifically, to an organic light emitting diode having excellent luminous properties and an organic light emitting device having the organic light emitting diode.

Discussion of the Related Art

An organic light emitting diode (OLED) has come into spotlight as a light emitting diode rapidly replacing a liquid crystal display device (LCD). The OLED can be formed as a thin film having a thickness less than 2000 Å and can be implement unidirectional or bidirectional images as electrode configurations. In addition, OLEDs can be formed on a flexible transparent substrate such as a plastic substrate so that OLED can implement a flexible or foldable display with ease. Moreover, the OLED can be driven at a lower voltage, has excellent color purity compared to the LCD.

In the OLED, when electrical charges are injected into an emitting material layer between an electron injection electrode (i.e., cathode) and a hole injection electrode (i.e., anode), electrical charges are recombined to form excitons, and then emit light as the recombined excitons are shifted to a stable ground state.

Conventional fluorescent materials have shown low luminous efficiency because only the singlet excitons are involved in the luminescence process thereof. The phosphorescent materials in which triplet excitons as well as the singlet excitons are involved in the luminescence process have relatively high luminous efficiency compared to the fluorescent material. However, the metal complex as the representative phosphorescent material has too short luminous lifetime to be applicable into commercial devices. Particularly, the blue phosphorescent material has showed low luminous efficiency and color purity.

SUMMARY

Accordingly, embodiments of the present disclosure are directed to an OLED and an organic light emitting device including the OLED that substantially obviates one or more of the problems due to the limitations and disadvantages of the related art.

An object of the present disclosure is to provide an OLED that can lower its driving voltage and to enhance its luminous efficiency and lifetime and an organic light emitting device including the diode.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concept, as embodied and broadly described, an organic light emitting diode comprises a first electrode; a second electrode facing the first electrode; and an emitting material layer disposed between the first and second electrodes, wherein the emitting material layer comprises a first emitting material layer disposed between the first and second electrodes and a second emitting material layer disposed between the first emitting material layer and the second electrode, wherein the first emitting material layer comprises a first compound, a second compound and a third compound, and the second emitting material layer comprises a fourth compound and a fifth compound, and wherein the first compound comprises an organic compound having the following structure of Chemical Formula 1, the second compound comprises an organic compound having the following structure of Chemical Formula 3 and the fourth compound comprises an organic compound having the following structure of Chemical Formula 9:

Chemical Formula 1

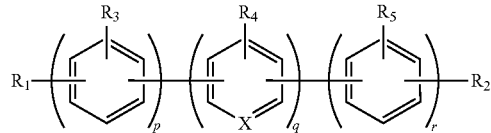

wherein $R_1$ is an unsubstituted or substituted fused hetero aromatic group selected from the group consisting of a carbazolyl group, an acridinyl group, a dihydro acridinyl group, a phenazinyl group, a phenoxazinyl group and a benzo-benzo-imidazo-imidazole group; $R_2$ is selected from the group consisting of an unsubstituted or substituted phenyl group, an unsubstituted or substituted naphthyl group, an unsubstituted or substituted anthracenyl group, an unsubstituted or substituted carbazolyl group, an unsubstituted or substituted carbonyl group, an unsubstituted or substituted $C_6$-$C_{20}$ aryl amino group and an unsubstituted or substituted $C_4$-$C_{20}$ hetero aryl amino group; each of $R_3$ to $R_5$ is independently protium, deuterium, tritium, an unsubstituted or substituted $C_1$-$C_{10}$ alkyl group or a cyano group; and each of p, q and r is zero or 1;

Chemical Formula 3

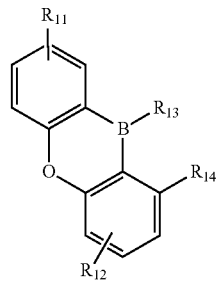

wherein each of $R_{11}$ and $R_{12}$ is independently protium, deuterium, tritium, an unsubstituted or substituted $C_1$-$C_{10}$ alkyl group or an unsubstituted or substituted fused hetero aromatic group selected from the group consisting of a carbazole moiety, an acridinyl moiety, a dihydro acridinyl moiety, a phenazinyl moiety and a phenoxazinyl moiety, wherein the fused hetero aromatic group can form a spiro structure, and at least one of $R_{11}$ and $R_{12}$ is the fused hetero aromatic group; and each of $R_{13}$ and $R_{14}$ is independently an unsubstituted or substituted $C_6$-$C_{20}$ aryl group or an unsubstituted or substituted $C_3$-$C_{30}$ hetero aryl group, wherein each of $R_{13}$ and $R_{14}$ is independently link directly or via a $C_6$-$C_{20}$ arylene ring to boron atom or to the benzene ring, or $R_{13}$ and $R_{14}$ form a fused hetero aromatic ring containing at least one oxygen atom; and Chemical Formula 9

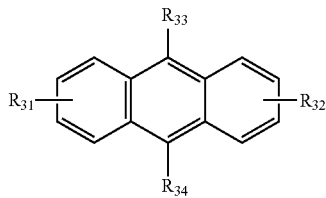

wherein each of $R_{31}$ and $R_{32}$ is independently an unsubstituted or substituted $C_6$-$C_{20}$ aryl group or an unsubstituted or substituted $C_3$-$C_{20}$ hetero aryl group; and each of $R_{33}$ and $R_{34}$ is independently protium, deuterium, tritium or an unsubstituted or substituted $C_1$-$C_{10}$ alkyl group.

In another aspect, an organic light emitting diode comprises a first electrode; a second electrode facing the first electrode; and an emitting material layer disposed between the first and second electrodes, wherein the emitting material layer comprises a first emitting material layer disposed between the first and second electrodes and a second emitting material layer disposed between the first emitting material layer and the second electrode, wherein the first emitting material layer comprises a first compound, a second compound and a third compound, and the second emitting material layer comprises a fourth compound and a fifth compound, wherein the first compound comprises an organic compound having the structure of Chemical Formula 1, the fourth compound comprises an organic compound having the structure of Chemical Formula 9, and wherein an energy level bandgap ($\Delta E_{ST}^{TD}$) between an excited singlet energy level ($S_1^{TD}$) and an excited triplet energy level ($T_1^{TD}$) of the second compound is about 0.3 eV or less.

In still another aspect, an organic light emitting device comprises a substrate and the OLEDs disposed over the substrate, as described above.

It is to be understood that both the foregoing general description and the following detailed description are exemplary and explanatory and are intended to provide further explanation of the inventive concepts as claimed.

BRIEF DESCRIPTION OF THE DRAWING

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION OF THE EMBODIMENTS

Reference and discussions will now be made below in detail to aspects, embodiments and examples of the disclosure, some examples of which are illustrated in the accompanying drawings.

[Organic Light Emitting Device and OLED]

Figure 1:
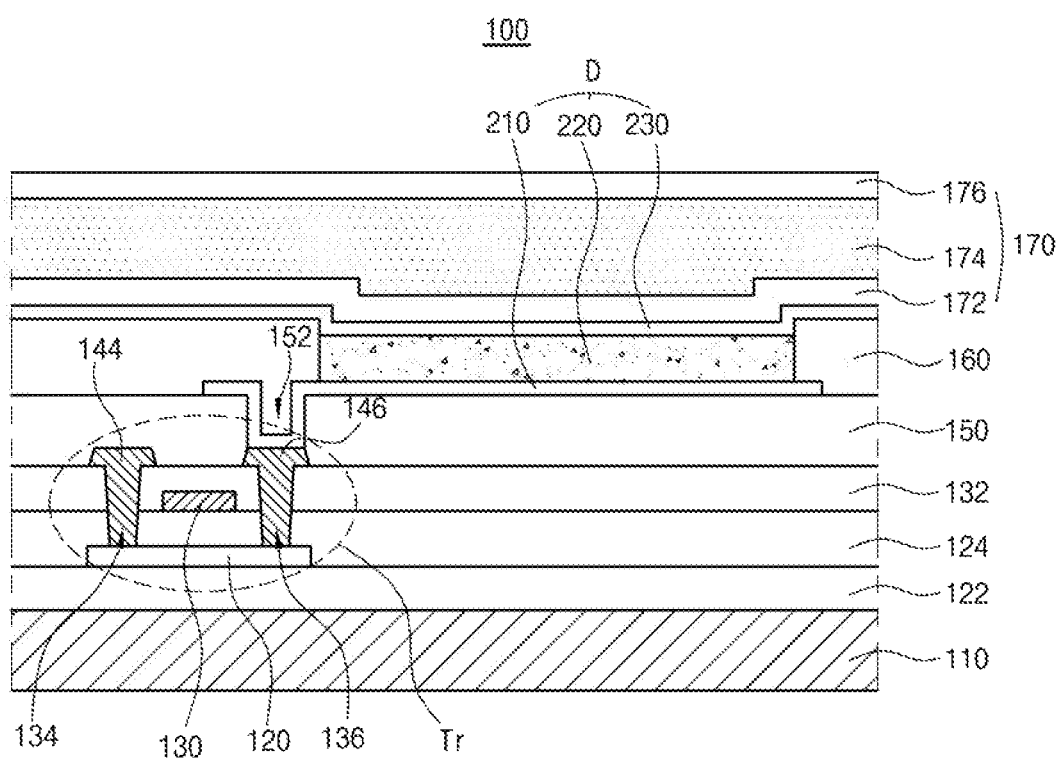
FIG. 1 is a schematic cross-sectional view illustrating an organic light emitting display device in accordance with an exemplary aspect of the present disclosure.

The present disclosure relates to an organic light emitting diode (OLED) that includes plural emitting material layers each of which applies different types delayed fluorescence and includes luminous material having adjusted energy levels. The OLED can be applied into an organic light emitting device such as an organic light emitting display device and an organic light emitting lighting device. As an example, a display device applying the OLED will be described. FIG. 1 is a schematic cross-sectional view of an organic light emitting display device 100 in accordance with an aspect of the present disclosure. All components of the organic light emitting device in accordance with all aspects of the present disclosure are operatively coupled and configured.

As illustrated in FIG. 1, the organic light emitting display device 100 includes a substrate 110, a thin-film transistor Tr on the substrate 110, and an organic light emitting diode (OLED) D connected to the thin film transistor Tr.

The substrate 110 can include, but is not limited to, glass, thin flexible material and/or polymer plastics. For example, the flexible material can be selected from the group, but is not limited to, polyimide (PI), polyethersulfone (PES), polyethylenenaphthalate (PEN), polyethylene terephthalate (PET), polycarbonate (PC) and combinations thereof. The substrate 110, over which the thin film transistor Tr and the OLED D are arranged, form an array substrate.

A buffer layer 122 can be disposed over the substrate 110, and the thin film transistor Tr is disposed over the buffer layer 122. The buffer layer 122 can be omitted.

A semiconductor layer 120 is disposed over the buffer layer 122. In one exemplary aspect, the semiconductor layer 120 can include, but is not limited to, oxide semiconductor materials. In this case, a light-shield pattern can be disposed under the semiconductor layer 120, and the light-shield pattern can prevent light from being incident toward the semiconductor layer 120, and thereby, preventing the semiconductor layer 120 from being deteriorated by the light. Alternatively, the semiconductor layer 120 can include, but is not limited to, polycrystalline silicon. In this case, opposite edges of the semiconductor layer 120 can be doped with impurities.

A gate insulating layer 124 formed of an insulating material is disposed on the semiconductor layer 120. The gate insulating layer 124 can include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 can be patterned identically as the gate electrode 130.

An interlayer insulating layer 132 formed of an insulating material is disposed on the gate electrode 130 with covering over an entire surface of the substrate 110. The interlayer insulating layer 132 can include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over opposite sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, which are formed of conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr can have an inverted staggered structure in which a gate electrode is disposed under a semiconductor layer and a source and drain electrodes are disposed over the semiconductor layer. In this case, the semiconductor layer can comprise amorphous silicon.

A gate line and a data line, which cross each other to define a pixel region, and a switching element, which is connected to the gate line and the data line is, can be further formed in the pixel region of FIG. 1. The switching element is connected to the thin film transistor Tr, which is a driving element. Besides, a power line is spaced apart in parallel from the gate line or the data line, and the thin film transistor Tr can further include a storage capacitor configured to constantly keep a voltage of the gate electrode for one frame.

In addition, the organic light emitting display device 100 can include a color filter that comprises dyes or pigments for transmitting specific wavelength light of light emitted from the OLED D. For example, the color filter can transmit light of specific wavelength such as red (R), green (G), blue (B) and/or white (W). Each of red, green, and blue color filter can be formed separately in each pixel region. In this case, the organic light emitting display device 100 can implement full-color through the color filter.

For example, when the organic light emitting display device 100 is a bottom-emission type, the color filter can be disposed on the interlayer insulating layer 132 with corresponding to the OLED D. Alternatively, when the organic light emitting display device 100 is a top-emission type, the color filter can be disposed over the OLED D, that is, a second electrode 230.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it can be spaced apart from the second semiconductor layer contact hole 136.

The OLED D includes a first electrode 210 that is disposed on the passivation layer 150 and connected to the drain electrode 146 of the thin film transistor Tr. The OLED D further includes an emissive layer 220 and a second electrode 230 each of which is disposed sequentially on the first electrode 210.

The first electrode 210 is disposed in each pixel region. The first electrode 210 can be an anode and include a conductive material having a relatively high work function value. For example, the first electrode 210 can include, but is not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the like.

In one exemplary aspect, when the organic light emitting display device 100 is a bottom-emission type, the first electrode 210 can have a single-layered structure of transparent conductive oxide. Alternatively, when the organic light emitting display device 100 is a top-emission type, a reflective electrode or a reflective layer can be disposed under the first electrode 210. For example, the reflective electrode or the reflective layer can include, but are not limited to, aluminum-palladium-copper (APC) alloy. In the OLED D of a top-emission type, the first electrode 210 can have a triple-layered structure of ITO/Ag/ITO or ITO/APC/ITO. In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 can have a single-layered structure of an emitting material layer (EML). Alternatively, the emissive layer 220 can have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see FIGS. 2 and 8). In one aspect, the emissive layer 220 can have one emitting part. Alternatively, the emissive layer 220 can have multiple emitting parts to form a tandem structure.

The second electrode 230 is disposed over the substrate 110 above which the emissive layer 220 is disposed. The second electrode 230 can be disposed over a whole display area and can include a conductive material with a relatively low work function value compared to the first electrode 210. The second electrode 230 can be a cathode. For example, the second electrode 230 can include, but is not limited to, aluminum (Al), magnesium (Mg), calcium (Ca), silver (Ag), alloy thereof or combination thereof such as aluminum-magnesium alloy (Al—Mg). When the organic light emitting display device 100 is a top-emission type, the second electrode 230 is thin so as to have light-transmissive (semi-transmissive) property.

In addition, an encapsulation film 170 can be disposed over the second electrode 230 in order to prevent outer moisture from penetrating into the OLED D. The encapsulation film 170 can have, but is not limited to, a laminated structure of a first inorganic insulating film 172, an organic insulating film 174 and a second inorganic insulating film 176.

Moreover, the organic light emitting display device 100 can have a polarizer in order to decrease external light reflection. For example, the polarizer can be a circular polarizer. When the organic light emitting display device 100 is a bottom-emission type, the polarizer can be disposed under the substrate 100. Alternatively, when the organic light emitting display device 100 is a top-emission type, the polarizer can be disposed over the encapsulation film 170. In addition, a cover window can be attached to the encapsulation film 170 or the polarizer. In this case, the substrate 110 and the cover window can have a flexible property, thus the organic light emitting display device 100 can be a flexible display device.

Figure 2:
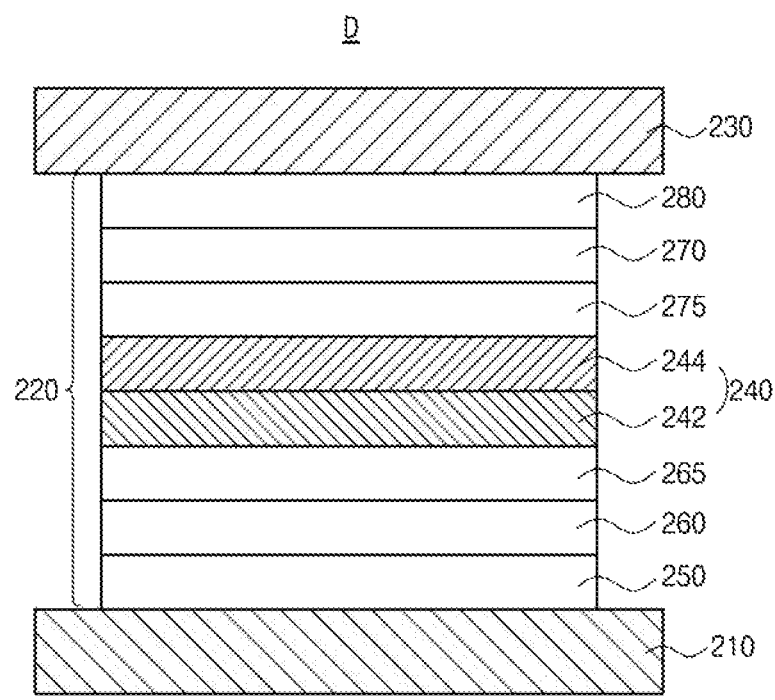
FIG. 2 is a schematic cross-sectional view illustrating an OLED in accordance with an exemplary aspect of the present disclosure.

Now, we will describe the OLED in more detail. FIG. 2 is a schematic cross-sectional view illustrating an OLED in accordance with an aspect of the present disclosure. As illustrated in FIG. 2, the OLED D1 comprises first and second electrodes 210 and 230 facing each other, an emissive layer 220 having single emitting part disposed between the first and second electrodes 210 and 230. The organic light emitting display device 100 (FIG. 1) can comprise a red pixel region, a green pixel region and a blue pixel region, and the OLED D1 can be disposed in the blue pixel region. The emissive layer 220 comprises an EML 240 disposed between the first and second electrodes 210 and 230. Also, the emissive layer 220 can comprise at least one of a HTL 260 disposed between the first electrode 210 and the EML 240 and an ETL 270 disposed between the second electrode 230 and the EML 240. Also, the emissive layer 220 can further comprise at least one of a HIL 250 disposed between the first electrode 210 and the HTL 260 and an EIL 280 disposed between the second electrode 230 and the ETL 270. Alternatively, the emissive layer 220 can further comprise a first exciton blocking layer, i.e. an EBL 265 disposed between the HTL 260 and the EML 240 and/or a second exciton blocking layer, i.e. a HBL 275 disposed between the EML 240 and the ETL 270.

The first electrode 210 can be an anode that provides a hole into the EML 240. The first electrode 210 can include, but is not limited to, a conductive material having a relatively high work function value, for example, a transparent conductive oxide (TCO). In an exemplary aspect, the first electrode 210 can include, but is not limited to, ITO, IZO, ITZO, SnO, ZnO, ICO, AZO, and the like.

The second electrode 230 can be a cathode that provides an electron into the EML 240. The second electrode 230 can include, but is not limited to, a conductive material having a relatively low work function values, i.e., a highly reflective material such as Al, Mg, Ca, Ag, alloy thereof, combination thereof, and the like.

The EML 240 comprises a first EML (EML1, lower EML, first layer) 242 disposed between the EBL 265 and the HBL 275 and a second EML (EML2, upper EML, second layer) 244 disposed between the EML1 242 and the HBL 275. Each of the EML1 242 and the EML2 244 can implement delayed fluorescence. The EML1 242 implements thermally activated delayed fluorescence and the EML2 244 implements triplet-triplet annihilation.

When holes and electrons meet to form excitons, singlet exciton with a paired spin state and triplet exciton with an unpaired spin state is generated in a ratio of 1:3 in theory. Since conventional fluorescent materials can utilize only the singlet exciton, their luminous efficiency is low. While phosphorescent materials can utilize triplet excitons as well as the singlet excitons, their luminous lifetime is too short to be applicable in the commercial devices.

Delayed fluorescence for solving the disadvantages of the conventional fluorescent or phosphorescent materials has been developed. Currently develop delayed fluorescence can be divided into thermally activated delayed fluorescence (TADF) and triplet-triplet-annihilation (TTA).

As an example, the EML1 242 includes a first compound (Compound 1, Host 1) H1, a second compound (Compound 2) TD and a third compound (Compound 3) FD1. The first compound H1 can be a first host, the second compound TD can be thermally activated delayed fluorescent material, and the third compound FD1 can be a (first) fluorescent material. The first compound can be a h-type (p-type) host having relatively high hole binding or hole injection property, i.e. hole affinity, in the EML1 242 implementing TADF. As an example, the first compound H1 comprise an organic compound having the following structure of Chemical Formula 1:

Chemical Formula 1

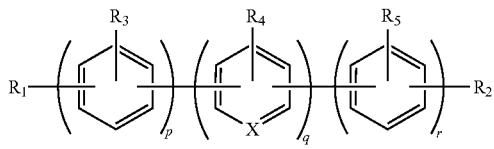

In Chemical Formula 1, $R_1$ is an unsubstituted or substituted fused hetero aromatic group selected from the group consisting of a carbazolyl group, an acridinyl group, a dihydro acridinyl group, a phenazinyl group, a phenoxazinyl group and a benzo-benzo-imidazo-imidazole group; $R_2$ is selected from the group consisting of an unsubstituted or substituted phenyl group, an unsubstituted or substituted naphthyl group, an unsubstituted or substituted anthracenyl group, an unsubstituted or substituted carbazolyl group, an unsubstituted or substituted carbonyl group, an unsubstituted or substituted $C_6$-$C_{20}$ aryl amino group and an unsubstituted or substituted $C_4$-$C_{20}$ hetero aryl amino group; each of $R_3$ to $R_5$ is independently protium, deuterium, tritium, an unsubstituted or substituted $C_1$-$C_{10}$ alkyl group or a cyano group; and each of p, q and r is zero or 1.

As used herein, the term "unsubstituted" means that hydrogen is linked, and in this case, hydrogen comprises protium, deuterium and tritium.

As used herein, the substituent in the term "substituted" comprises, but is not limited to, unsubstituted or halogen-substituted $C_1$-$C_{20}$ alkyl, unsubstituted or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term "hetero" in such as "a hetero aromatic ring", "a hetero cycloalkylene group", "a hetero arylene group", "a hetero aryl alkylene group", "a hetero aryloxylene group", "a hetero cycloalkyl group", "a hetero aryl group", "a hetero aryl alkyl group", "a hetero aryloxyl group", "a hetero aryl amino group" means that at least one carbon atom, for example 1-5 carbons atoms, constituting an aromatic ring or an alicyclic ring is substituted with at least one hetero atom selected from the group consisting of N, O, S, P and combination thereof.

For example, the fused hetero aromatic group constituting $R_1$ can be unsubstituted or substituted with at least one group selected from a $C_1$-$C_{10}$ alkyl group and a carbazolyl group, and the aromatic or hetero aromatic ring constituting $R_2$ can be unsubstituted or substituted with at least one group selected from a $C_1$-$C_{10}$ alkyl group, a $C_6$-$C_{20}$ aryl group and a $C_3$-$C_{20}$ hetero aryl group.

As an example, $R_1$ in Chemical Formula 1 can be a carbazolyl group substituted with at least one other carbazolyl group or a benzo-benzo-imida-imidazole group, and $R_2$ in Chemical Formula 1 can be an unsubstituted or other-carbazolyl substituted carbazolyl group, an unsubstituted or pyridyl- or carbazolyl-substituted carbonyl group, a phenyl-substituted acridinyl group, an alkyl-substituted phenyl group or an diphenyl amino group where each phenyl is substituted with a carbazolyl group.

In one exemplary embodiment, the first compound H1 in the EML1 242 can comprise, but is not limited to, any organic compound having the following structure of Chemical Formula 2:

Chemical Formula 2

1-1

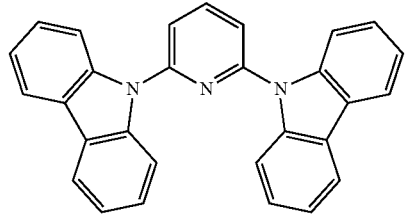

1-2

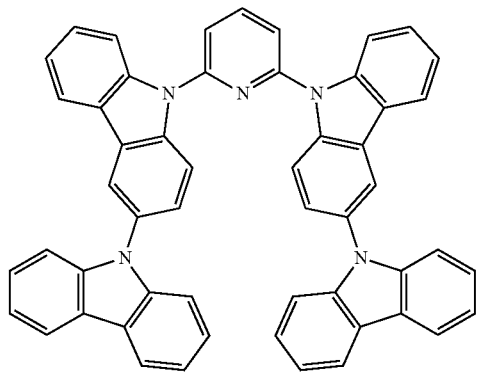

1-3

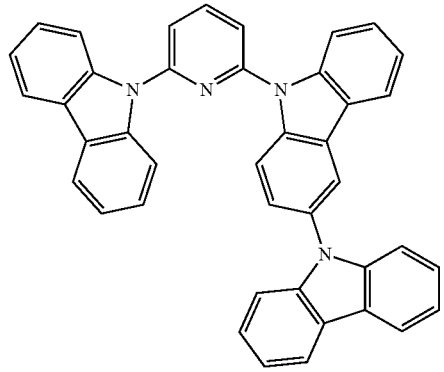

1-4

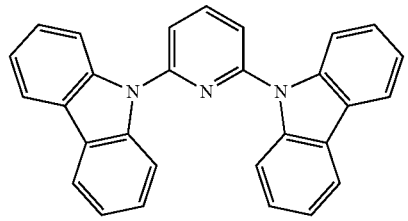

1-5

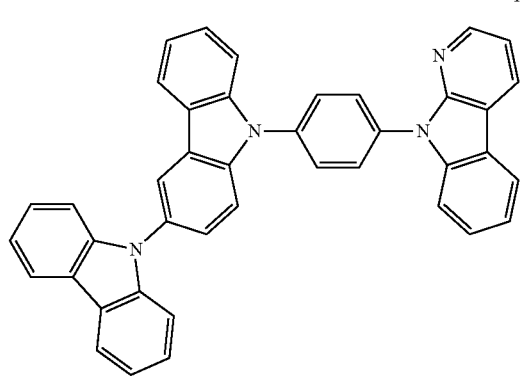

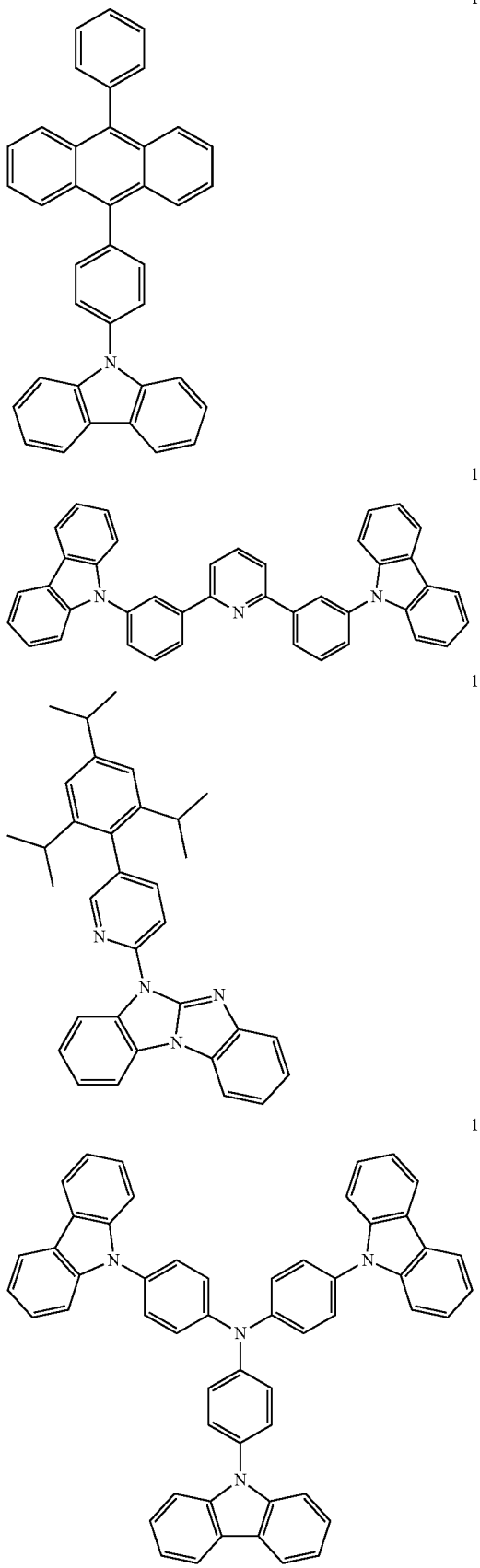
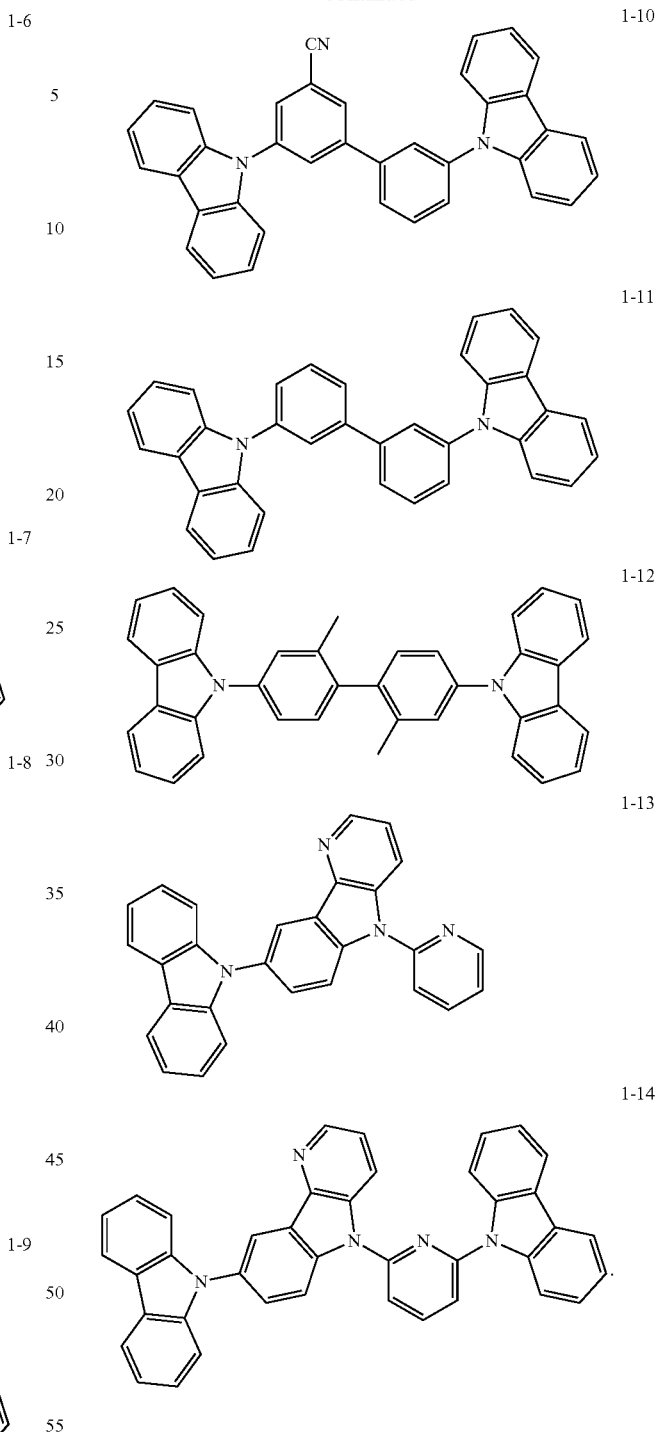

In Chemical Formula 2, each of the Compounds 1-1 to 1-14 is 2,6-di(9H-carbazol-9-yl)pyridine(2,6-CzPy), 2,6-di(9H-3,9'-bicarbazol-9-yl)pyridine, 9-(6-(9H-carbazol-9-yl)pyridin-2-yl)-9H-3,9'-bicarbazole, 1,3-Bis(carbazol-9-yl)benzene (mCP), 9-(4-(9H-pyrido[2,3-b]indol-9-yl)phenyl)-9H-3,9'-bicarbazole (pBCb2Cz), 9-(4-(10-phenylanthracene-9-yl)phenyl)-9H-carbazole (PhPC), 2,6-bis[3-(9H-Carbazol-9-yl)phenyl]pyridine (26DCzppy), 5-(5-(2,4,6-triiso-propylphenyl)pyridin-2-yl)-5H-benzo[d]benzo[4,5]imidazo[1,2-a]imidazole (PPBI), tris(4-carbazoyl-9-yl-phenyl)amine (TCTA), 3',5-di(9H-carbazol-9-yl)-[1,1'-biphenyl]-3-carbonitrile (mCBP-CN), 3,3'-bis(N- carbazolyl)-1,1'-biphenyl(mCBP), 4,4'-Bis(9-carbazolyl)-2,2'-dimethylbiphenyl(CDBP), 8-(9H-carbazol-9-yl)-5-(pyridin-2-yl)-5H-pyrido[3,2-b]indole (CzCbPy), 5-(6-(9H-carbazol-9-yl)pyridin-2-yl)-8-(9H-carbazol-9-yl)-5H-pyrido[3,2-b]indole (2CzCbPy), respectively.

The second compound TD in the EML1 242 is thermally activated delayed fluorescent material. The thermally activated delayed fluorescent material has very narrow energy bandgap ($\Delta E_{ST}^{TD}$) between an excited singlet energy level ($S_1^{TD}$) and an excited triplet energy level ($T_1^{TD}$) (see FIG. 7). Accordingly, both the excitons of singlet energy level $S_1^{TD}$ as well as the excitons of triplet energy level $T_1^{TD}$ in the thermally activated delayed fluorescent material can be transferred to an intermediate energy level state, i.e. ICT state ($S_1^{TD} \rightarrow ICT \leftarrow T_1^{TD}$), and then the intermediate stated excitons can be shifted to the ground state ($S_0^{TD}$).

The thermally activated delayed fluorescent material has little interactions between a HOMO (highest occupied molecular orbital) state and a LUMO (lowest unoccupied molecular orbital) state so that both the triplet state and the singlet state can be converted to the ICT state. The thermally activated delayed fluorescent material must has an energy level bandgap $\Delta E_{ST}^{TD}$ equal to or less than about 0.3 eV, for example, from about 0.05 to about 0.3 eV, between the excited singlet energy level $S_1^{TD}$ and the excited triplet energy level $T_1^{TD}$ so that exciton energy in both the excited singlet energy level $S_1^{TD}$ and the excited triplet energy level $T_1^{TD}$ can be transferred to the ICT state. The material having little energy level bandgap between the singlet energy level $S_1^{TD}$ and the triplet energy level $T_1^{TD}$ can exhibit common fluorescence which the excitons of singlet energy level $S_1^{TD}$ can be directly shifted to the ground state $S_1^{TD}$, as well as delayed fluorescence with Reverser Inter System Crossing (RISC) in which the excitons of triplet energy level $T_1^{TD}$ can be transferred upwardly to the excitons of singlet energy level $S_1^{TD}$, and then the exciton of singlet energy level $S_1^{TD}$ transferred from the triplet energy level $T_1^{TD}$ can be shifted to the ground state $S_0^{TD}$.

In other words, both 25% singlet excitons and 75% triplet excitons are converted to ICT state by heat, and then the converted excitons drops to the ground state $S_0$ with luminescence in the thermally activated delayed fluorescent materials. Since the thermally activated delayed fluorescent material have 100% internal quantum efficiency in theory so that it can implement luminous efficiency as the conventional phosphorescent materials. As an example, the second compound TD of the thermally activated delayed fluorescent material can comprise, but is not limited to, a boron-based organic compound having the following structure of Chemical Formula 3:

Chemical Formula 3

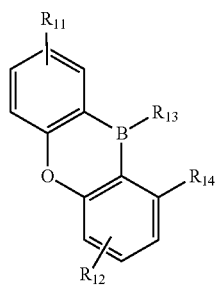

In Chemical Formula 3, each of $R_{11}$ and $R_{12}$ is independently protium, deuterium, tritium, an unsubstituted or substituted $C_1$-$C_{10}$ alkyl group or an unsubstituted or substituted fused hetero aromatic group selected from the group consisting of a carbazole moiety, an acridinyl moiety, a dihydro acridinyl moiety, a phenazinyl moiety and a phenoxazinyl moiety, wherein the fused hetero aromatic group can form a spiro structure, and at least one of $R_{11}$ and $R_{12}$ is the fused hetero aromatic group; and each of $R_{13}$ and $R_{14}$ is independently an unsubstituted or substituted $C_6$-$C_{20}$ aryl group or an unsubstituted or substituted $C_3$-$C_{30}$ hetero aryl group, wherein each of $R_{13}$ and $R_{14}$ is independently link directly or via a $C_6$-$C_{ao}$ arylene ring to boron atom or to the benzene ring, or $R_{13}$ and $R_{14}$ form a fused hetero aromatic ring containing at least one oxygen atom;

As an example, the fused hetero aromatic group constituting $R_{11}$ and/or $R_{12}$ in Chemical Formula 3 can be unsubstituted or substituted with a group selected from a $C_1$-$C_{10}$ alkyl group, a $C_6$-$C_{20}$ aryl group, a $C_3$-$C_{20}$ hetero aryl group and combination thereof, or can form a spiro structure. Also, the $C_6$-$C_{ao}$ aryl group or the $C_3$-$C_{ao}$ hetero aryl group constituting $R_{13}$ or $R_{14}$ in Chemical Formula 3 can be unsubstituted or substituted with a group selected from a $C_1$-$C_{10}$ alkyl group, a $C_6$-$C_{20}$ aryl group, a $C_3$-$C_{20}$ hetero aryl group and combination thereof. In addition, the fused hetero aromatic ring formed by $R_{13}$ and $R_{14}$ can be unsubstituted or substituted with at least one group selected from a $C_1$-$C_{10}$ alkyl group, a $C_6$-$C_{20}$ aryl group and a $C_3$-$C_{20}$ hetero aryl group.

For example, the carbazolyl moiety, the acridinyl moiety, the dihydro acridinyl moiety, the phenazinyl moiety and the phenoxazinyl moiety constituting $R_{11}$ and/or $R_{12}$ can comprise a fused hetero aromatic group such as a carbazolyl group, an acridinyl group, a dihydro acridinyl group, a phenazinyl group and a phenoxazinyl group, and any group where an aromatic ring and/or a hetero aromatic ring such as a benzene ring, a naphthalene ring, an indene ring, a pyridine ring, an indole ring, a furan ring, a benzo-furan ring, a dibenzo-furan ring, a thiophene ring, a benzo-thiophene ring and/or a dibenzo-thiophene ring is fused to the fused hetero aromatic group or other fused aromatic ring such as xanthene or fluorene is linked to the fused hetero aromatic group to form a spiro structure.

As an example, $R_{11}$ in Chemical Formula 3 can be, but is not limited to, protium, deuterium, tritium or a $C_1$-$C_{10}$ alkyl group, and $R_{12}$ in Chemical Formula 3 can be, but is not limited to, a carbazolyl group, a di-indolo-carbazolyl group, an indeno-carbazolyl group, an acridinyl group, a dihydro acridinyl group, a phenazinyl group and a phenoxazinyl group each of which is independently unsubstituted or substituted with a $C_1$-$C_{10}$ alkyl group and/or a phenyl group or is linked to xanthene or fluorene to form a spiro structure. $R_{13}$ in Chemical Formula 3 can be selected from, but is not limited to, the group consisting of a phenyl group, a carbazolyl group, an acridinyl group or a dihydro acridinyl group each of which is independently unsubstituted or substituted with one to four $C_1$-$C_{10}$ alkyl groups and is linked directly or via an arylene ring such as a phenylene ring to the boron atom. Alternatively, the fused hetero aromatic ring formed by $R_{13}$ and $R_{14}$ can be, but is not limited to, an unsubstituted or $C_1$-$C_{10}$ alkyl substituted oxa-boranaphtho ring. As an example, the second compound can comprise any organic compound having the following structure of Chemical Formula 4:

Chemical Formula 4
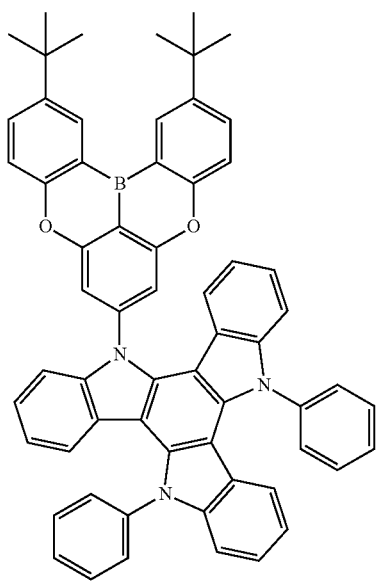
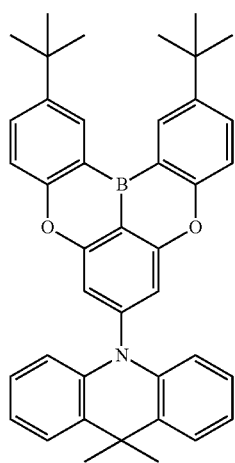
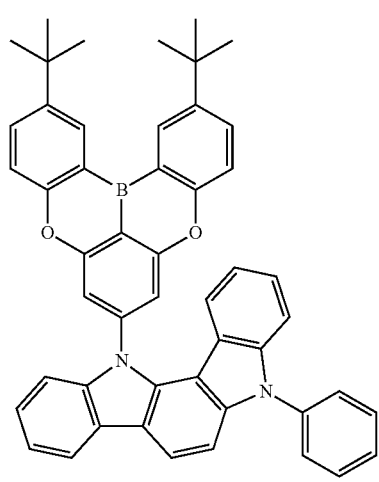
2-1
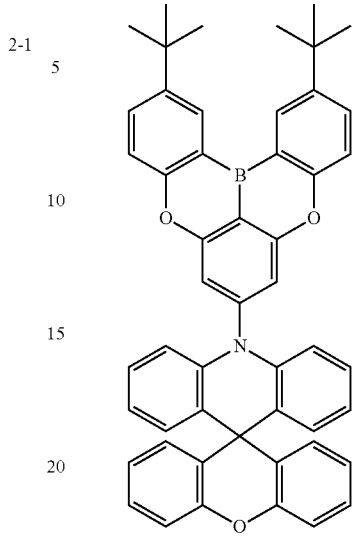
2-2
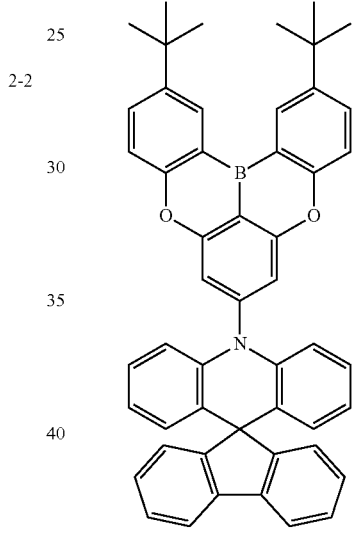
2-3
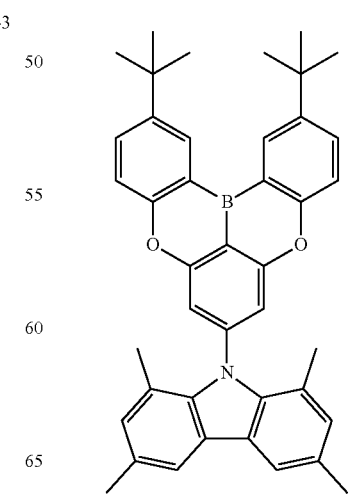
2-4
2-5
2-6

2-7
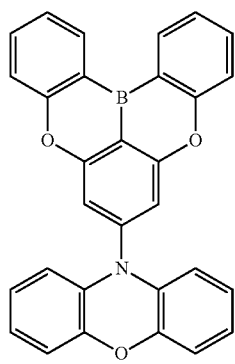
2-8
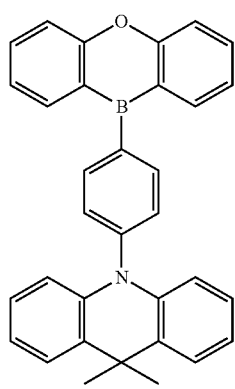
2-9
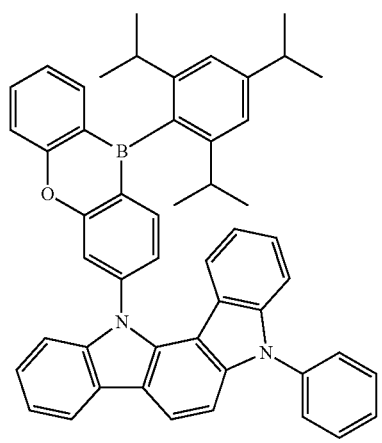
2-10
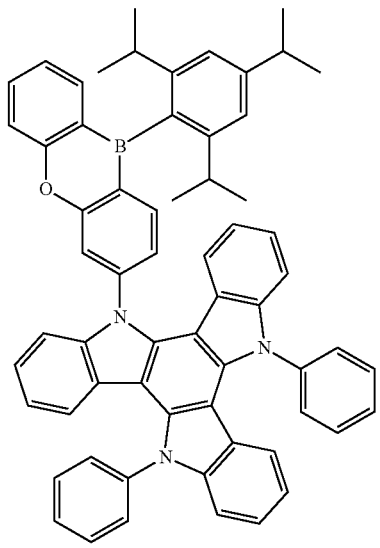
2-11
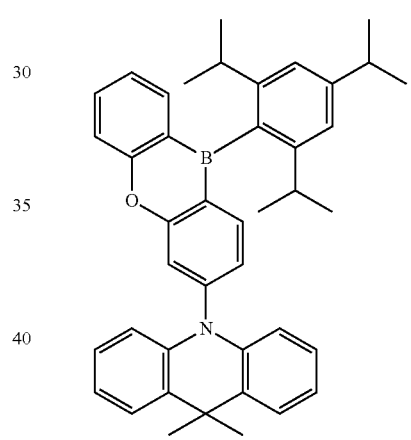
2-12
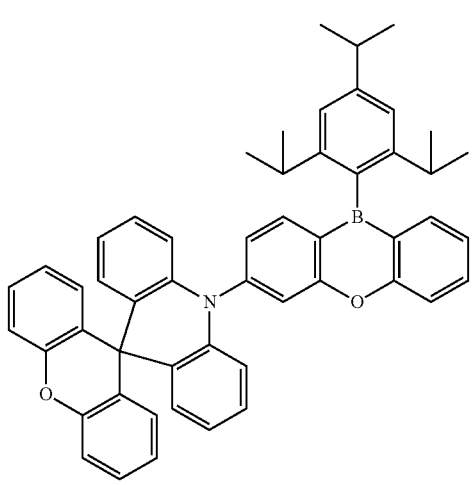

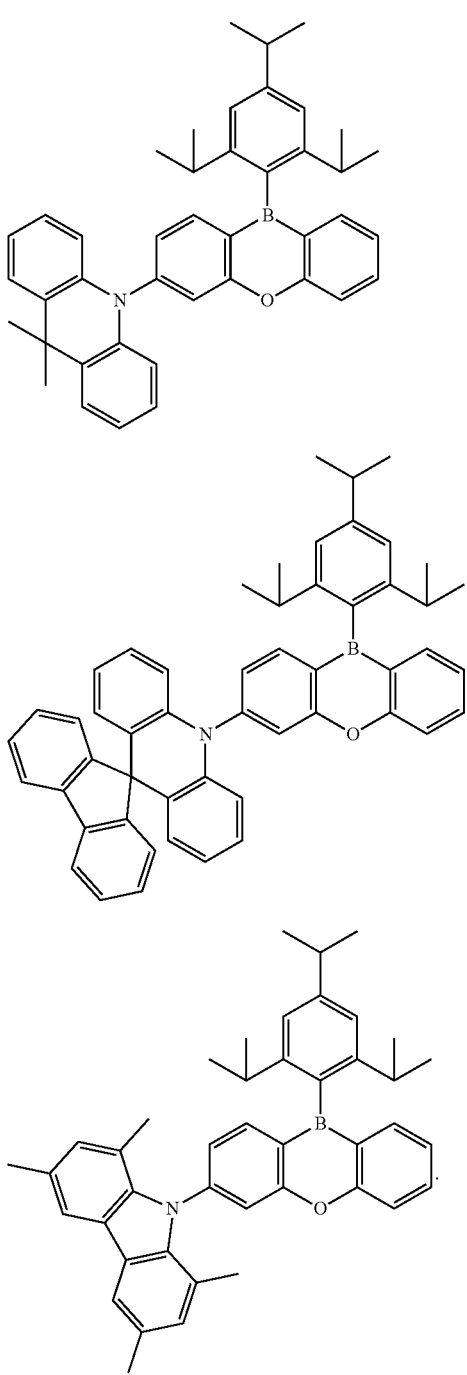

2-13

2-14

2-15

In Chemical Formula 4, each of the Compound 2-1 and the Compound 2-2 is 5-(2,12-di-tert-butyl-5,9-dioxa-13b-boranaphtho[3,2,1-de]anthracen-7-yl)-10,15-diphenyl-10,15-dihydro-5H-diindolo[3,2-a:3',2'-c]carbazole (TDBA-DI) and 10-(2,12-di-tert-butyl-5,9-dioxa-13b-boranaphtho[3,2,1-de]anthracen-7-yl)-9,9-dimethyl-9,10-dihydroacridine (TDBA-Ac), respectively.

Since the second compound TD of thermally activated delayed fluorescent material has very narrow energy level bandgap $\Delta_{ST}^{TD}$ between the excited singlet energy level $S_1^{TD}$ and the excited triplet energy level $T_1^{TD}$ and the triplet exciton energy of the second compound TD is converted upwardly its singlet exciton, the second compound TD has excellent luminous efficiency. However, the second compound TD having the structure of Chemical Formula 3 or 4 utilizes the triplet excitons in emitting light, which causes addition charge transfer transition (CT transition). Owing to the luminous property caused by CT luminous mechanism, the second compound having the structure of Chemical Formula 3 or 4 shows an emission spectrum having very broad FWHM (full-width at half maximum) in the course of luminescence, which results in poor color purity.

The EML1 242 further includes the third compound FD1 of florescent material in order to solve the disadvantages caused by the thermally activated delayed fluorescent material and to implement hyper-fluorescence.

As described above, the second compound TD of thermally activated delayed fluorescent material can utilize both the singlet exciton energy and the triplet exciton energy. Accordingly, when the EML1 242 comprises the third compound FD1 of fluorescent material that has a proper energy level compared to an energy level of the second compound TD of thermally activated delayed fluorescent material, the third compound FD1 of fluorescent material can absorb exciton energy release from the second compound TD, and the exciton energy absorbed by the third compound FD1 generate 100% singlet exciton with maximizing its luminous efficiency.

The excited singlet exciton energy of the second compound TD, which includes the single exciton energy converted from the excited triplet exciton energy of the second compound TD of thermally activated delayed fluorescent material in the EML 242, is transferred to the third compound FD1 of fluorescent material in the same EML by Forster resonance energy transfer (FRET) mechanism, and final light emission is occurred in the third compound FD1 in the EML1 242. As an example, material whose absorption wavelength is largely overlapped with photoluminescence wavelength of the second compound TD can be used as the third compound FD1. Since the ultimately laminating third compound FD1 emits light with transitions from the excited state to the ground state, not by CT luminous mechanism, its FWHM is narrow so that it can improve color purity of the emitted light.

As an example, the third compound FD1 of fluorescent material in the EML1 242 comprises a boron-based organic compound having the following structure of Chemical Formula 5 and/or a pyrene-based organic compound having the following structure of Chemical Formula 7:

Chemical Formula 5

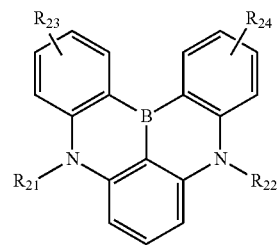

In Chemical Formula 5, each of $R_{21}$ to $R_{24}$ is independently protium, deuterium, tritium, an unsubstituted or substituted $C_6$-$C_{20}$ aryl group, an unsubstituted or substituted $C_3$-$C_{20}$ hetero aryl group, an unsubstituted or substituted $C_6$-$C_{20}$ aryl amino group or an unsubstituted or substituted $C_3$-$C_{20}$ hetero aryl amino group;

Chemical Formula 7

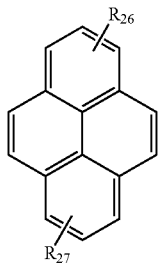

In Chemical Formula 7, each of $R_{26}$ and $R_{27}$ is independently an unsubstituted or substituted $C_6$-$C_{20}$ aryl amino group or an unsubstituted or substituted $C_3$-$C_{20}$ hetero aryl amino group.

As an example, an aromatic ring and/or a hetero aromatic ring constituting the aryl group, the hetero aryl group, aryl amino group and the hetero aryl amino group constituting $R_{21}$ to $R_{24}$ in Chemical Formula 5 can be independently unsubstituted or substituted with a $C_1$-$C_{10}$ alkyl group, a $C_6$-$C_{20}$ aryl group, a $C_3$-$C_{20}$ hetero aryl group and combination thereof. For example, each of $R_{21}$ and $R_{22}$ in Chemical Formula 5 can be, but is not limited to, an aryl group such as phenyl, biphenyl and/or naphthyl, $R_{23}$ in Chemical Formula 5 can be, but is not limited to, protium, deuterium or tritium, and $R_{24}$ in Chemical Formula 5 can be, but is not limited to, selected from the group consisting of a biphenyl amino group and a carbazoyl group each of which is unsubstituted or substituted with at least one $C_1$-$C_{10}$ alkyl group. In one exemplary embodiment, the boron-based organic compound having the structure of Chemical Formula 5 can comprise any organic compound having the following structure of Chemical Formula 6:

Chemcial Formula 6

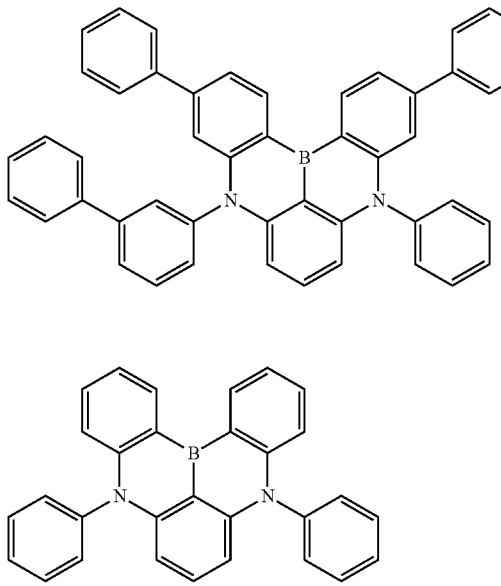

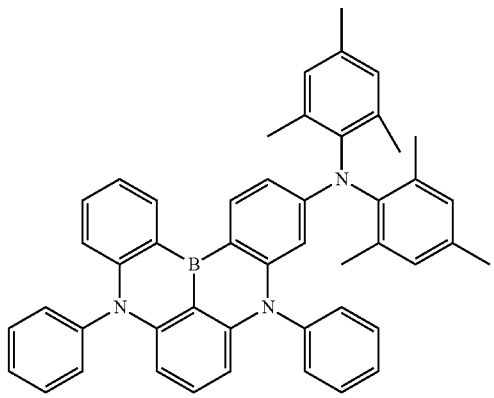

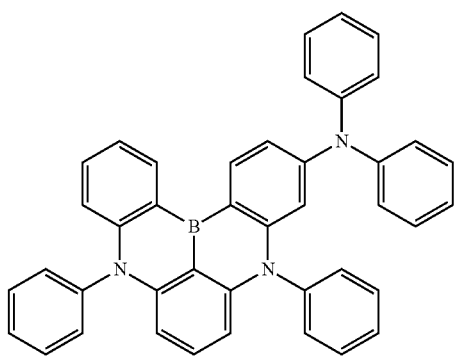

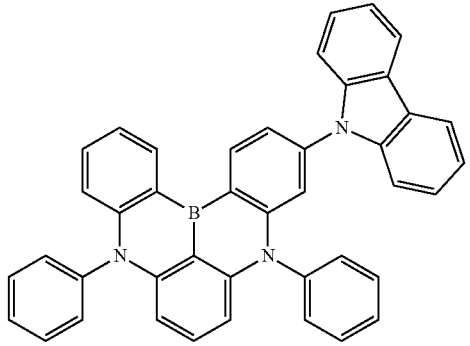

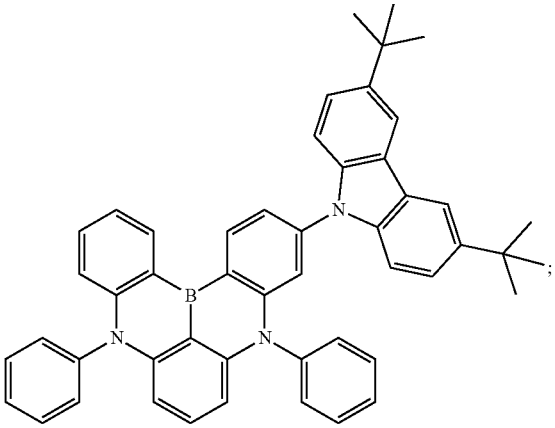

In Chemical Formula 6, each of the Compound 3-1 and the Compound 3-2 is 9-[1,1'-biphenyl]-3-yl-N,N, 5,11-tetraphenyl-5,9-dihydro-5,9-diaza-13b-boranaphtho[3,2,1-de]

anthracene-3-amine (DABNA-2) and 5,9-diphenyl-5H,9H-[1,4]benzazaborino[2,3,4-kl]phenazaborie (DABNA-1), respectively.

Alternatively, an aryl amino group and the hetero aryl amino group constituting $R_{26}$ and/or $R_{27}$ in Chemical Formula 7 can be independently unsubstituted or substituted with a cyano group, a $C_1$-$C_{10}$ alkyl group, a $C_6$-Cao aryl group, a $C_3$-Cao hetero aryl group and combination thereof. In one exemplary embodiment, the pyrene-based organic compound having the structure of Chemical Formula 7 can comprise any organic compound having the following structure of Chemical Formula 8:

Chemical Formula 8

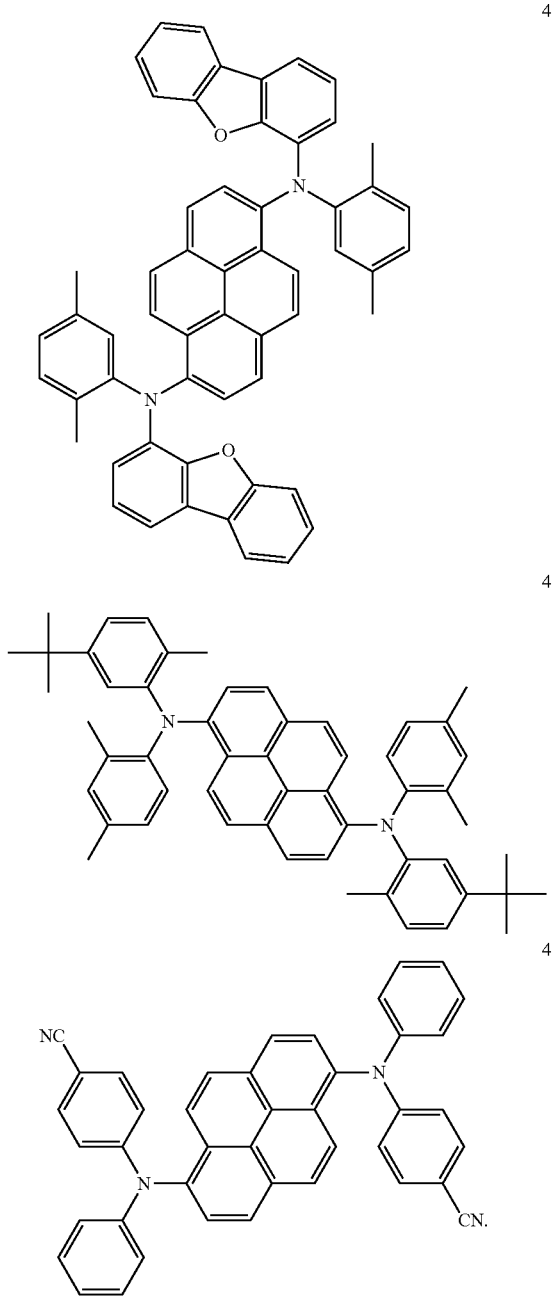

Since the second compound TD of thermally activated delayed fluorescent material can utilize both the singlet and triplet exciton energies, the OLED D1 can improve its luminous efficiency. When the second compound TD of thermally activated delayed fluorescent material and the third compound FD1 of fluorescent material are present in a single-layered EML, the thermally activated delayed fluorescent material should implement 100% internal quantum efficiency via RISC.

However, the rate of transferring exciton energy from the second compound TD of thermally activated delayed fluorescent material to the third compound DH1 of fluorescent material is faster than the rate of converting exciton energy from the triplet state to the single state in the second compound TD via RISC. Particularly, the triplet exciton energy of the second compound TD of thermally activated delayed fluorescent material is transferred to the third compound DH1 of fluorescent material prior to converting the excited triplet exciton energy to the singlet exciton at the second compound TD by RISC in ranges of high current densities. Since the triplet exciton energy of the fluorescent material is quenched as a non-radiative recombination, only the singlet exciton of the second compound TD of thermally activated delayed fluorescent material is transferred to singlet state of the third compound FD1 of fluorescent material, and therefore, its luminous efficiency can be decreased.

In order to solve the disadvantage of thermally activated delayed fluorescence (TADF) where the luminous efficiency rapidly decreases at a high current density, the EML 240 includes the EML2 244 that implements TTA adjacently to the EML1 242. In TTA, a singlet state is formed by the interaction or collisions among moleculares excited to a triplet state, which occurs when the density triplet excitons is high.

In the OLED using fluorescent material, 15% of the 75% triplet exciton are regenerated as a singlet intermediate when the triplet exciton is additional utilized, and thus when 25% of the initially generated singlet exciton is included, total 40% singlet excitons can be formed. Therefore, TTA mechanism allows the OLED to realize an external quantum efficiency of 8-12% depending on the out-coupling efficiency. In particular, in a molecule where the sum of two triplet exciton energies satisfies a condition greater than the singlet exciton energy ($2T_1 > S_1$), two triplet excitons can be collided each other to generate one single exciton statistically. Therefore, since the 37.5% of triplet exciton, which is half of the initially generated triplet excitons, can be regenerated into singlet excitons by upconversion, it is possible to generate up to 62.5% singlet excitons, and to achieve external quantum efficiency up to 12.5%-18.8%.

In the TTA process, since two triplet excitons collided to regenerated at most one singlet exciton, its luminous efficiency is not improved as the thermally activated delayed fluorescence (TADF). However, when the TTA process is applied in the OLED, there is an advantage that a constant luminous efficiency can be realized regardless of the current density.

In one exemplary embodiment, the EML2 244 includes the fourth compound H2 of the second host and the fifth compound FD2 of fluorescent material. As an example, the fourth compound H2 functions as an electron acceptor having a molecular structure that can implement TTA, and the fifth compound FD2 functions as a photon sensitizer.

In the EML2 244, the fourth compound H2 can be an e⁻ type (n-type) compound having relatively excellent electron bonding and injection property (electron affinity). For example, the fourth compound H2 comprises an anthracene-based organic compound having the following structure of Chemical Formula 9:

Chemical Formula 9

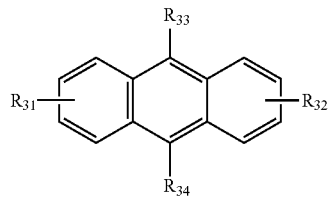

In Chemical Formula 9, each of $R_{31}$ and $R_{32}$ is independently an unsubstituted or substituted $C_6$-$C_{20}$ aryl group or an unsubstituted or substituted C3-C20 hetero aryl group; and each of $R_{33}$ and $R_{34}$ is independently protium, deuterium, tritium or an unsubstituted or substituted $C_1$-$C_{10}$ alkyl group.

As an example, the aryl group and/or the hetero aryl group constituting $R_{31}$ and/or $R_{32}$ in Chemical Formula 9 can be independently unsubstituted or substituted with a group selected from a $C_6$-$C_{20}$ aryl group, a $C_3$-$C_{20}$ hetero aryl group and combination thereof. Since the anthracene-based organic compound having the structure of Chemical Formula 9 has excellent luminous efficiency, stable electrochemical property and proper excited triplet energy level, it is proper for blue emission. As an example, the fourth compound H2 of the second host implementing TTA property can comprise any organic compound having the following structure of Chemical Formula 10:

Chemical Formula 10

5-1

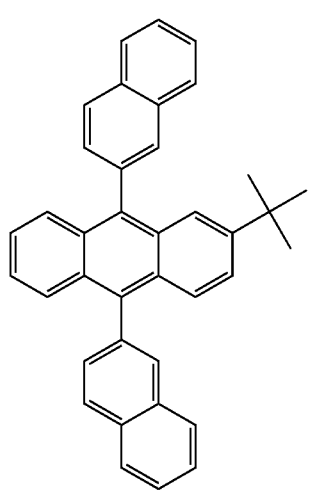

5-2

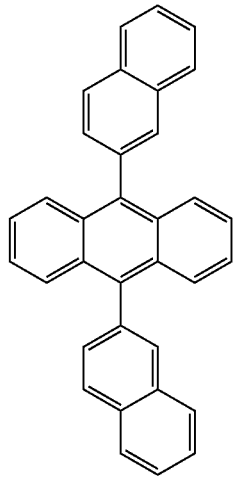

5-3

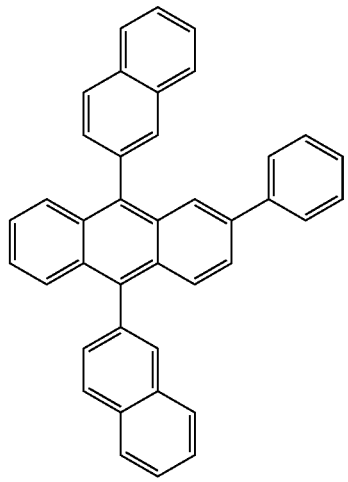

5-4

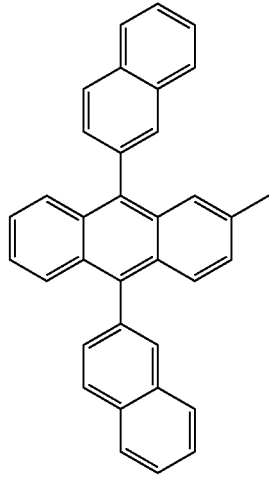

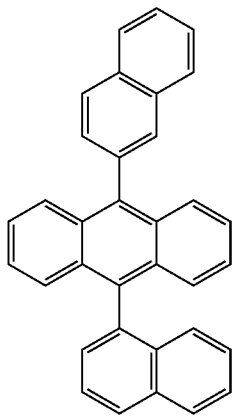

5-5

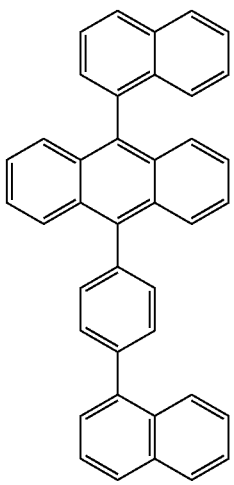

5-8

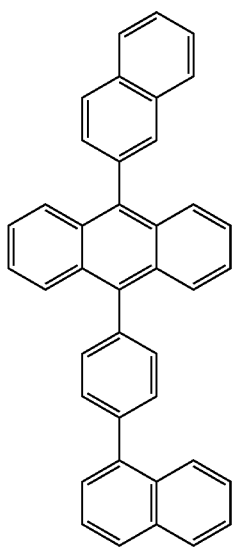

5-6

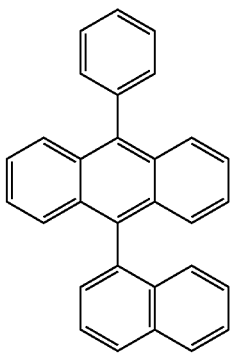

5-9

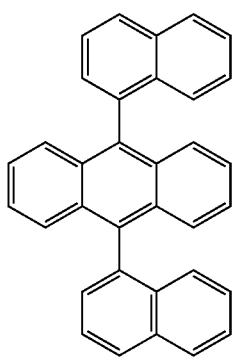

5-7

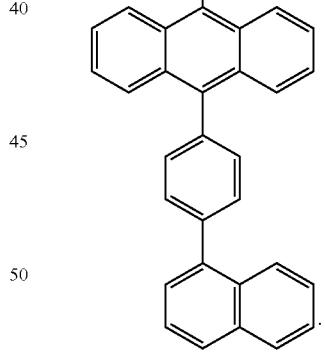

5-10

In Chemical Formula 10, each of the Compounds 5-1 to 5-4 is 2-tert-Butyl-9,10-di(naphth-2-yl)anthracene (TBADN), 9,10-di(naphthalen-2-yl)anthracene (ADN), 9,10-di(naphthalen-2-yl)-2-phenylanthracene (PADN) and 2-methyl-9,10-bis(naphthalen-2-yl)anthracene (MADN), respectively.

In one exemplary embodiment, the fifth compound FD2 as the second fluorescent material can be the same as the third compound FD1 as the first fluorescent material. Alternatively, the fifth compound FD2 can be other organic compound different from the third compound FD1. In this case, the fifth compound FD2 can have luminous wavelength, excited singlet and triplet energy levels and HOMO and LUMO energy levels each of which is similar to those of the third compound FD1, respectively.

The HIL 250 is disposed between the first electrode 210 and the HTL 260 and improves an interface property between the inorganic first electrode 210 and the organic HTL 260. In one exemplary aspect, the HIL 250 can include, but is not limited to, 4,4'4"-Tris(3-methylphenylamino)triphenylamine (MTDATA), 4,4',4"-Tris(N,N-diphenylamino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris (4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiophene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 250 can be omitted in compliance with a structure of the OLED D1.

The HTL 260 is disposed adjacently to the HIL 250 between the first electrode 210 and the EML 240. In one exemplary aspect, the HTL 260 can include, but is not limited to, N,N'-Diphenyl-N,N'-bis(3-methylphenyl)-1,1'-biphenyl-4,4'-diamine (TPD), NPB(NPD), 4,4'-bis(N-carbazolyl)-1,1'-biphenyl (CBP), Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), Di-[4-(N,N-di-p-tolyl-amino)-phenyl] cyclohexane (TAPC), 3,5-Di(9H-carbazol-9-yl)-N,N'-diphenylaniline (DCDPA), N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The ETL 270 and the EIL 280 can be disposed sequentially between the EML 240 and the second electrode 230. The ETL 270 includes a material having high electron mobility so as to provide electrons stably with the EML 240 by fast electron transportation. In one exemplary aspect, the ETL 270 can comprise, but is not limited to, any one of oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 270 can comprise, but is not limited to, tris-(8-hydroxyquinoline aluminum) ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ) and/or diphenyl-4-triphenysilyl-phenylphosphine oxide (TSPO1).

The EIL 280 is disposed between the second electrode 230 and the ETL 270, and can improve physical properties of the second electrode 230 and therefore, can enhance the lifetime of the OLED D1. In one exemplary aspect, the EIL 280 can comprise, but is not limited to, an alkali metal halide and/or an alkaline earth metal halide such as LiF, CsF, NaF, $BaF_2$ and the like, and/or an organic metal compound such as lithium quinolate, lithium benzoate, sodium stearate, and the like. For example, each of the ETL 270 and the EIL 280 can have a thickness of, but is not limited to, about 10 nm to about 200 nm, preferably about 10 nm to about 100 nm.

In addition, when holes are transferred to the second electrode 230 via the EML 240 and/or electrons are transferred to the first electrode 210 via the EML 240, the OLED D1 can have short lifetime and reduced luminous efficiency. In order to prevent these phenomena, the OLED D1 in accordance with this aspect of the present disclosure can have at least one exciton blocking layer adjacent to the EML 240.

For example, the OLED D1 of the exemplary aspect includes the EBL 265 between the HTL 260 and the EML 240 so as to control and prevent electron transfers. In one exemplary aspect, the EBL 265 can comprise, but is not limited to, 9,10-dihydro-9,9-dimethyl-10-(9-phenyl-9H-carbazol-3-yl)-acridine (PCzAc), 9-phenyl-3,9-bicarbazole (CCP), mCP, mCBP, 9-(4-tert-butylphenyl)-3,6-bis(triphenylsilyl)-9H-carbazole (CzSi), TCTA, DCDPA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, N,N'-bis[4-(bis(3-methylphenyl)amino)phenyl]-N,N'-diphenyl-[1,1'-biphenyl]-4,4'-diamine (DNTPD), TDAPB and/or 3,6-bis(N-carbazolyl)-N-phenyl-carbazole.

In addition, the OLED D1 can further include the HBL 275 as a second exciton blocking layer between the EML 240 and the ETL 270 so that holes cannot be transferred from the EML 240 to the ETL 270. In one exemplary aspect, the HBL 275 can comprise, but is not limited to, any one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 270.

For example, the HBL 275 can comprise a compound having a relatively low HOMO energy level compared to the luminescent materials in EML 240. The HBL 275 can comprise, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole, TSPO1 and combination thereof.

Figure 3:
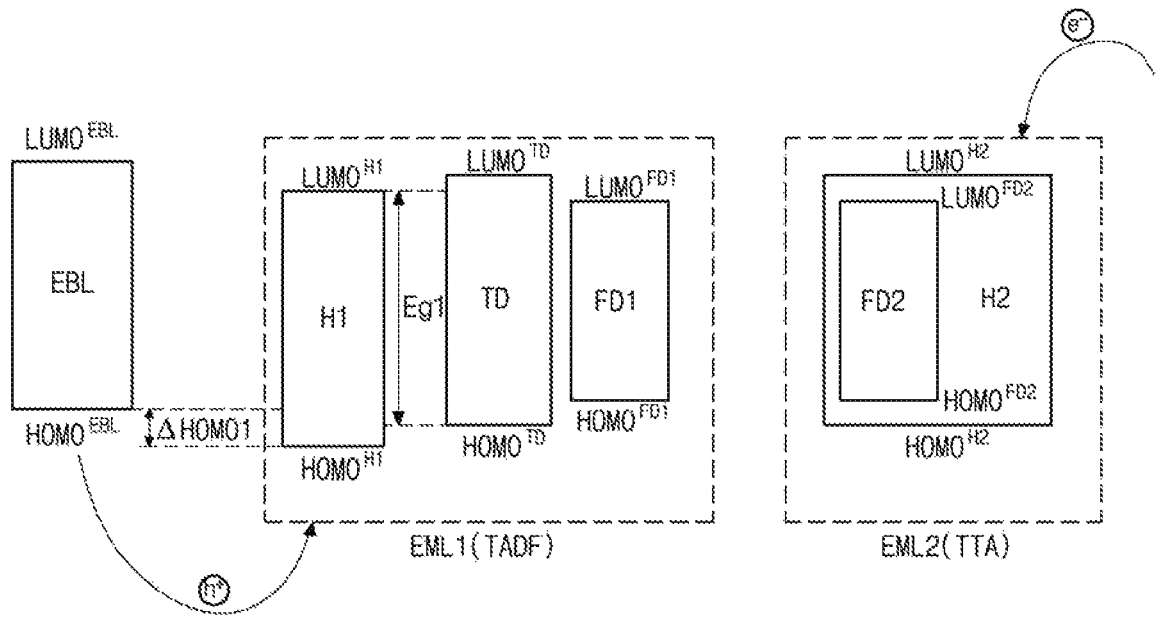
FIG. 3 is a schematic diagram illustrating emitting material layers and an electron blocking layer each of which is designed to have proper energy level and is positioned in a proper order so that charges are efficiently injected and transferred to the emitting material layers in accordance with an aspect of the present disclosure.

The EML1 242 implementing TADF property and the EML2 244 implementing TTA property includes luminous materials whose energy levels are property adjusted so the OLED D1 can improve its luminous efficiency and luminous lifetime. FIG. 3 is a schematic diagram illustrating emitting material layers and an electron blocking layer each of which is designed to have proper energy level and is positioned in a proper order so that charges are efficiently injected and transferred to the emitting material layers in accordance with an aspect of the present disclosure.

As illustrated in FIG. 3, a LUMO energy level ($LUMO^{EBL}$) of the material in the EBL 265 is shallower than a LUMO energy level ($LUMO^{H1}$) of the first compound H1 of the first host, a LUMO energy level ($LUMO^{TD}$) of the second compound TD of the thermally activated florescent material and a LUMO energy level ($LUMO^{FD1}$) of the third compound of the first fluorescent material in the EML1 242 as well as a LUMO energy level ($LUMO^{H2}$) of the fourth compound H2 of the second host and a LUMO energy level ($LUMO^{FD2}$) of the fifth compound FD2 of the second fluorescent material. Accordingly, electrons can be efficiently blocked in the EBL 265.

Also, HOMO energy levels and LUMO energy levels among the first compound H1 of the first host, the second compound TD of the thermally activated delayed fluorescent material and the third compound FD1 of the first fluorescent material in the EML1 242 should be properly adjusted.

As an example, it is preferable that an energy level bandgap ($|HOMO^{H1}-HOMO^{TD}|$) between the HOMO energy level ($HOMO^{H1}$) of the first compound H1 of the first host and the HOMO energy level ($HOMO^{TD}$) of the second compound TD of the thermally activated fluorescent material, or an energy level bandgap ($|LUMO^{H}-LUMO^{TD}|$) between the LUMO energy level ($LUMO^{H1}$) of the first compound H1 and the LUMO energy level ($LUMO^{TD}$) of the second compound TD can be equal to or less than about 0.5 eV, for example, from about 0.1 eV to about 0.5 eV. In this case, the charges can be transported efficiently from the first compound H1 as the first host to the second compound TD as the thermally activated delayed fluorescent material and thereby enhancing the ultimate luminous efficiency in the EML1 242.

In one exemplary embodiment, the LUMO energy level ($LUMO^{TD}$) of the second compound TD can be shallower than the LUMO energy level ($LUMO^{FD1}$) of the third compound FD1, and the HOMO energy level ($HOMO^{TD}$) of the second compound TD can be deeper than the HOMO energy level ($HOMO^{FD1}$) of the third compound FD1 in the EML1 242. Also, the LUMO energy level ($LUMO^{H2}$) of the fourth compound H2 as the second host can be shallower than the LUMO energy level ($LUMO^{FD2}$) of the fifth compound FD2 as the second fluorescent material, and the HOMO energy level ($HOMO^{H2}$) of the fourth compound H2 can be deeper than the HOMO energy level ($HOMO^{FD2}$) of the fifth compound FD2 in the EML2 244. In this case, holes and electrons injected into the EML1 242 and the EML2 244 can be rapidly transferred from the hosts H1 and H2 to the ultimately emitting fluorescent materials FD1 and FD2 to form excitons.

In addition, the LUMO energy level ($LUMO^{H1}$) of the first compound H1 of the first host and the HOMO energy level ($HOMO^{TD}$) of the second compound TD of the thermally activated delayed fluorescent compound in the EML1 242 satisfy the relationship defined in the following Equation (1). In this case, no exciplex is formed between the first compound H1 and the second compound TD so that the EML 240 can improve its luminous efficiency and color purity.

$$|LUMO^{H1}-HOMO^{TD}|>2.4 \text{ eV} \qquad (1).$$

In one exemplary embodiment, the first compound H1 can be designed to have its LUMO energy level ($LUMO^{H1}$) shallower than the HOMO energy level ($HOMO^{TD}$) of the second compound TD by at least about 2.8 eV.

Alternatively, the HOMO energy level ($HOMO^{H1}$) of the first compound H1 in the EML1 242 and the HOMO energy level ($HOMO^{EBL}$) of the material in the EBL 265 satisfy the relationship defined in the following Equation (2) so that holes can be efficiently transferred from the EBL 265 to the EML1 242:

$$0 \text{ eV} \leq |HOMO^{H1}-HOMO^{EBL}|<0.8 \text{ eV} \qquad (2).$$

In one exemplary embodiment, an energy level bandgap ($\Delta HOMO1$) between the HOMO energy level ($HOMO^{H1}$) of the first compound H1 in the EML1 242 and the HOMO energy level of the material in the EBL ($HOMO^{EBL}$) is 0 (identical) or at most about 0.5 eV, for example, about 0.3 eV.

As described above, the EML1 242 includes the first compound H1 of the p-type host, which is any organic compound having the structure of Chemical Formula 1 or 2 and the second compound TD of the thermally activated delayed fluorescent material, and the EML2 244 includes the fourth compound H2 of the n-type host, which is any organic compound having the structure of Chemical Formula 9 or 10. The EML1 242 and the EML2 244 are designed to be disposed in proper order, and the energy levels among the luminous materials in the EML1 242 and the EML2 244 and the materials of the adjacently disposed EBL 265 are properly adjusted, so holes and electrons can be injected in balance into the EML1 242 and the EML2 244, and therefore, the OLED D1 can improve its luminous efficiency and luminous lifetime.

Figure 4:
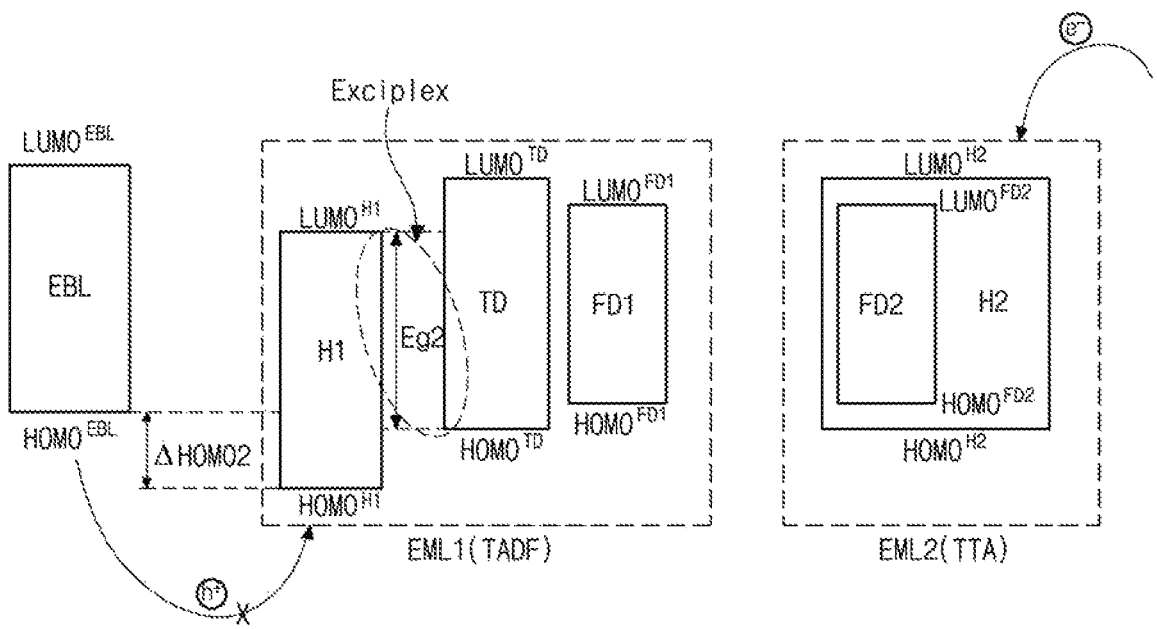
FIG. 4 is a schematic diagram illustrating emitting material layers and an electron blocking layer whose energy levels are not adjusted, and therefore, exciplex is formed in an EML1 implementing thermally activated delayed fluorescence.

FIG. 4 is a schematic diagram illustrating emitting material layers and an electron blocking layer whose energy levels are not adjusted, and therefore, exciplex is formed in an EML1 implementing thermally activated delayed fluorescence. In FIG. 4, the first compound H1 of the first host in the EML1 242 where TADF is implemented is an e⁻ type (n-type) host. As an example, the first host of the e'' type can be the following triazine-based host.

[Triazine-based e⁻ type host]

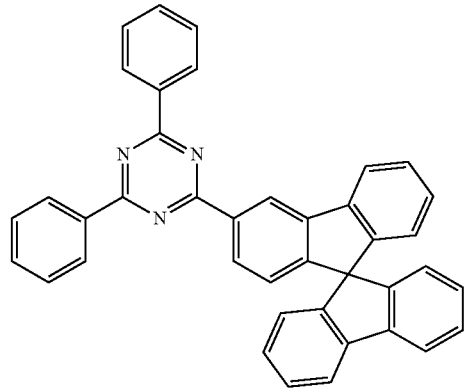

Ref. Host 1

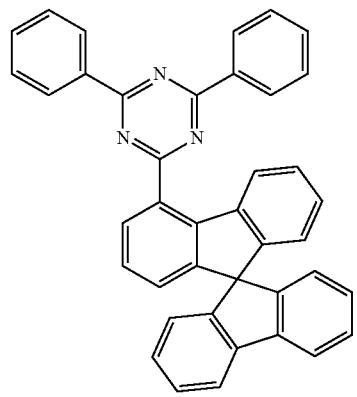

Ref. Host 2

-continued

Ref. Host 3

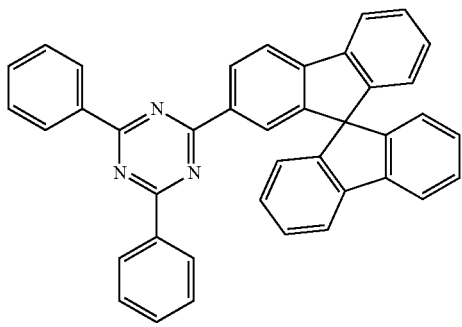

Each of the Ref. Host 1 to 3 is 2-(9,9'-spirobi[fluoren]-3-yl)-4,6-diphenyl-1,3,5-triazine (SF3-TRZ), 2-(9,9'-spirobi[fluoren]-4-yl)-4,6-diphenyl-1,3,5-triazine, 2-(9,9'-spirobi[fluoren]-2-yl)-4,6-diphenyl-1,3,5-triazine, respectively.

As illustrated in FIG. 4, when the e" type host as the first compound H1 is applied in the EML1 242 implementing TADF, the LUMO energy level (LUMO$^{H1}$) of the first compound H1 and the HOMO energy level (HOMO$^{TD}$) of the second compound TD of the thermally activated delayed fluorescent compound do not satisfy the relationship in Equation (1), so exciplex is formed between the first compound H1 and the second compound TD. In addition, as an energy level bandgap (ΔHOMO2) between the HOMO energy level (HOMO$^{H1}$) of the first compound H1 of the first host in the EML1 242 and the HOMO energy level (HOMO$^{EBL}$) of the material in the EBL 265 becomes larger and does not satisfy the relationship in Equation (2). In this case, holes and electrons cannot be injected into in balance into the EML1 242 and the EML2 244. Accordingly, the OLED shows deteriorated color purity and decreased luminous efficiency and luminous lifetime.

Figure 5:
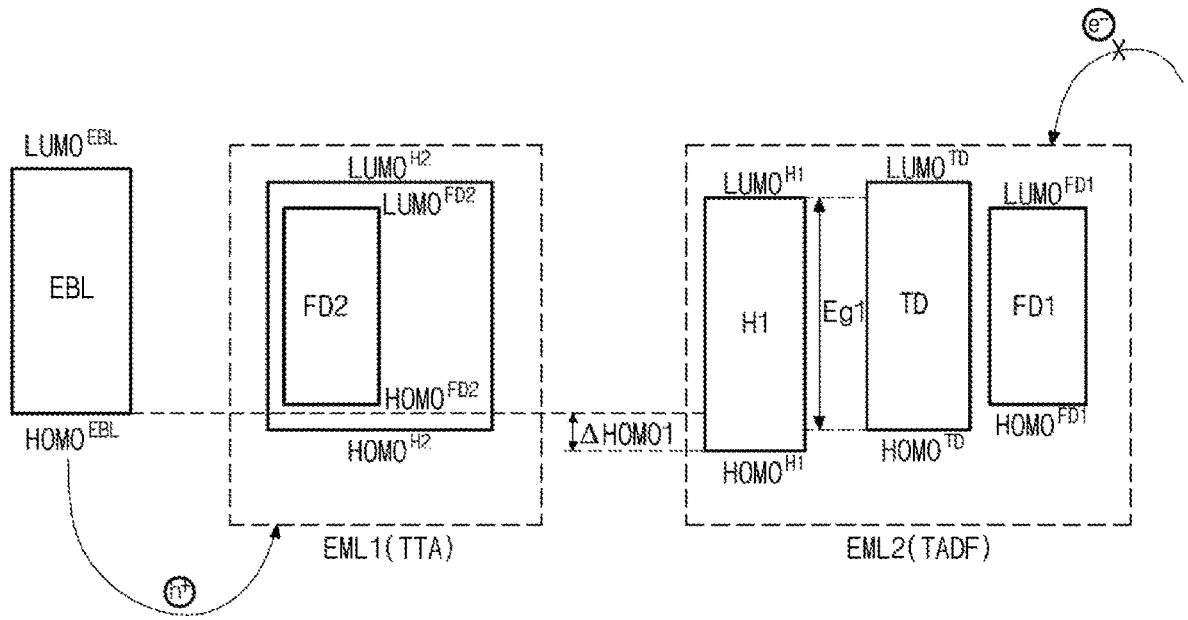
FIG. 5 is a schematic diagram illustrating emitting material layers and an electron blocking layer where the emitting material layers are wrongly designed, and therefore, electrons are not injected and transferred to the emitting material layers.

FIG. 5 is a schematic diagram illustrating emitting material layers and an electron blocking layer where the emitting material layers are wrongly designed, and therefore, electrons are not injected and transferred to the emitting material layers.

In FIG. 5, the EML1 242 including the e" type host, which implements TTA, is disposed adjacently to the EBL 265 and the EML2 244 including the h$^+$ type host and implementing TADF is disposed spaced apart from the EBL 265. In this case, electrons cannot be efficiently injected into the EML2 244. Accordingly, holes and electrons cannot be injected in balance into the EML1 242 and the EML2 244 so that excitons are not efficiently formed, and therefore, the luminous efficiency and the luminous lifetime of the OLED are decreased.

Figure 6:
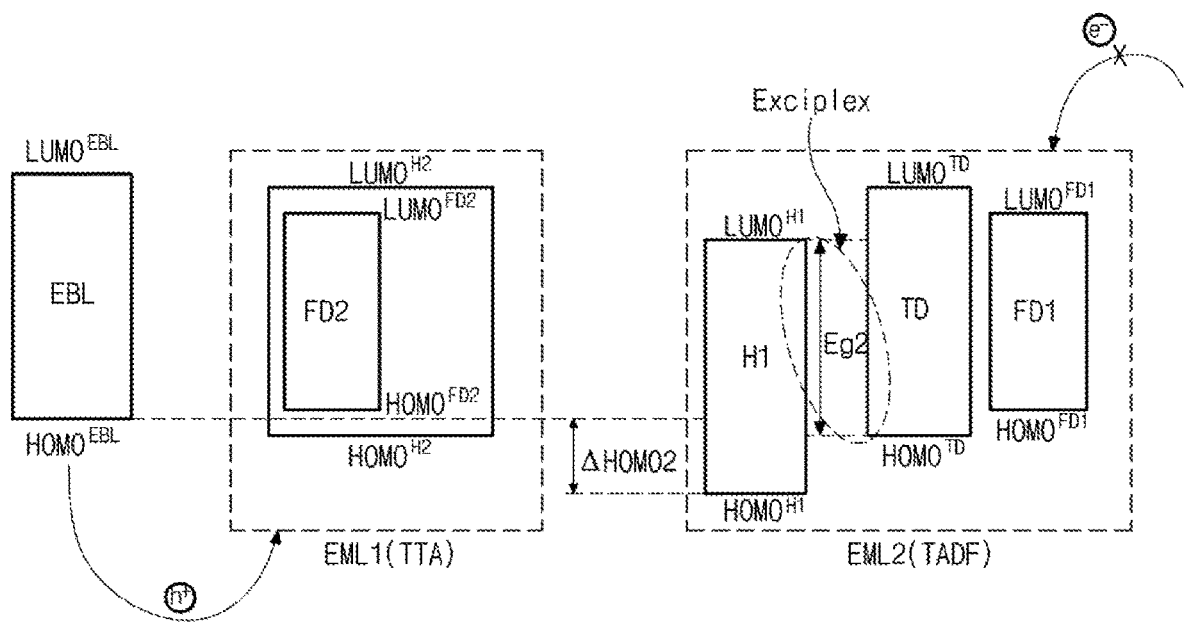
FIG. 6 is a schematic diagram illustrating emitting material layers and an electron blocking layer whose energy levels are not adjusted and where the emitting material layers are wrongly designed, and therefore, exciplex is formed in an EML2 implementing thermally activated delayed fluorescence and electrons are not injected and transferred to the emitting material layers.

FIG. 6 is a schematic diagram illustrating emitting material layers and an electron blocking layer whose energy levels are not adjusted and where the emitting material layers are wrongly designed, and therefore, exciplex is formed in an EML2 244 implementing thermally activated delayed fluorescence and electrons are not injected and transferred to the emitting material layers.

Compared to FIG. 5, the EML2 244 implementing TADF includes the e" type host such as the triazine-based host in FIG. 6. Similar to the case in FIG. 4, the LUMO energy level (LUMO$^{H1}$) of the first compound H1 as the e$^-$ type host and the HOMO energy level (HOMO$^{TD}$) of the second compound TD of the thermally activated delayed fluorescent compound in the EML2 244 do not satisfy the relationship in Equation (1), so exciplex is formed between the first compound H1 and the second compound TD. Also, as an energy level bandgap (ΔHOMO2) between the HOMO energy level (HOMO$^{H1}$) of the first compound H1 of the first host in the EML1 242 and the HOMO energy level (HOMO$^{EBL}$) of the material in the EBL 265 becomes larger and does not satisfy the relationship in Equation (2). Accordingly, the OLED shows deteriorated color purity and decreased luminous efficiency and luminous lifetime.

Figure 7:
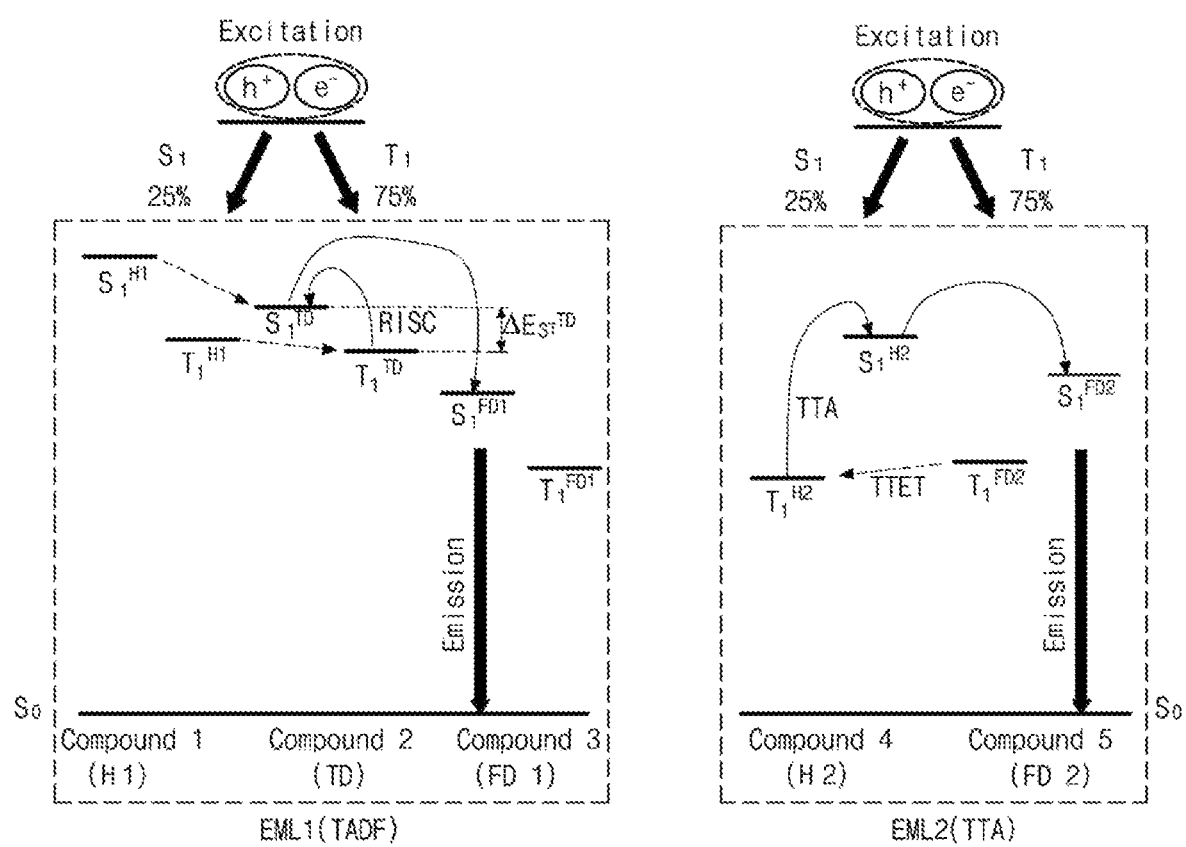
FIG. 7 is a schematic diagram illustrating luminous mechanism by singlet and triplet energy levels among luminous materials in two EMLs in accordance with an aspect of the present disclosure.

Now, we will describe energy transfers among luminous materials in two EMLs in accordance with an aspect of the present disclosure. FIG. 7 is a schematic diagram illustrating luminous mechanism by singlet and triplet energy levels among luminous materials in two EMLs in accordance with an aspect of the present disclosure. The first compound H1 as the first host should induce the triplet state exciton in the second compound TD of the thermally activated delayed fluorescent material to be involved in the light emission process without quenching as a non-radiative recombination so as to implement hyper-fluorescence in the EML1 242 that implements TADF. To this end, the energy levels among the first compound H1 of the first host, the second compound TD of the thermally activated delayed fluorescent material and the third compound FD1 of the first fluorescent material should be adjusted.

As illustrated schematically in FIG. 7, an excited singlet energy level $S_1^{H1}$ and an excited triplet energy level $T_1^{TD}$ of the first compound H1 as the first host are higher than an excited singlet energy level $S_1^{TD}$ and an excited triplet energy level $T_1^{TD}$ of the second compound TD of the thermally activated delayed fluorescent material, respectively. As an example, the excited triplet energy level $T_1^{H1}$ of the first compound H1 can be higher than the excited triplet energy level $T_1^{TD}$ of the second compound TD by at least about 0.2 eV, preferably about 0.3 eV, and more preferably about 0.5 eV.

When each of the excited triplet energy level $T_1^{TD}$ and the excited singlet energy level $S_1^{TD}$ of the first compound H1 is not high enough than each of the excited triplet energy level $T_1^{TD}$ and the excited singlet energy level $S_1^{TD}$ of the second compound TD, the triplet state exciton energy of the second compound TD can be reversely transferred to the excited triplet energy level $T_1^{H1}$ of the first compound H1. In this case, the triplet exciton reversely transferred to the first compound H1 where the triplet exciton cannot be emitted is quenched as non-emission so that the triplet exciton energy of the second compound TD having the thermally activated delayed fluorescent property cannot contribute to luminescence. The second compound TD having the thermally activated delayed fluorescent property can have an energy level bandgap $\Delta E_{ST}^{TD}$ between the excited singlet energy level $S_1^{TD}$ and the excited triplet energy level $T_1^{TD}$ equal to or less than about 0.3 eV, for example from about 0.05 eV to about 0.3 eV.

Moreover, exciton energy should be efficiently transferred from the second compound TD of the thermally activated delayed fluorescent material, which is transformed to ICT complex state by RISC, to the third compound FD1 of the first fluorescent material in the EML1 242 that implements TADF so that the OLED D1 can realize high luminous efficiency and color purity. To implement such OLED, the excited singlet energy level $S_1^{TD}$ of the second compound TD of the thermally activated delayed fluorescent material is higher than an excited singlet energy level S of the third compound FD1 of the first fluorescent material. In one exemplary aspect, the excited triplet energy level $T_1^{TD}$ of the second compound TD can be higher than an excited triplet energy level $T_1^{TD}$ of the third compound FD1.

In one exemplary aspect, the contents of the first compound H1 can be larger than the contents of the second compound TD and the contents of the second compound TD can be larger than the contents of the third compound FD1 in the EML1 242. In this case, exciton energy can be transferred efficiently from the second compound TD to the third compound FD1 via FRET mechanism. As an example, each of the contents of the first compound H1, the second compound TD, and the third compound FD1 in the EML1 242 can be, but is not limited to, about 60 wt % to about 75 wt %, about 20 wt % to about 40 wt %, and about 0.1 wt % to about 5 wt %, respectively.

In one exemplary embodiment, an excited singlet energy level $S_1^{H2}$ of the fourth compound H2 which functions as an electron acceptor is higher than an excited singlet energy level $S_1^{FD2}$ of the fifth compound FD2 which functions as a photon acceptor while an excited triplet energy level $T_1^{HD}$ of the fourth compound H2 can be lower than an excited triplet energy level $T_1^{FD2}$ of the fifth compound FD2.

The fifth compound FD2 is excited to have the excited singlet energy level $S_1^{FD2}$ by exciton recombination, and then the excited singlet exciton energy of the fifth compound FD2 allows excited triplet energy level $T_1^{FD2}$ to be generated by Intersystem Crossing (ISC). The fourth compound H2 receives the exciton energy in the excited state triplet energy level $T_1^{FD2}$ of the fifth compound TD2 through triplet-triplet energy transfer (TTET) to be excited to the triplet energy level $T_1^{H2}$. The excited triplet exciton of the fourth compound H2 recombines with other excitons at the excited triplet energy level $T_1^{H2}$ to generate exciton of the excited singlet energy level $S_1^{H2}$ by TTA mechanism. Finally, the exciton energy in the excited single energy level $S_1^{H2}$ of the fourth compound H2 is transferred to the excited singlet energy level $S_1^{FD2}$ of the fifth compound FD2 via FRET mechanism. The fifth compound FD2 emits light by utilizing the triplet exciton energy partially converted in the fourth compound H2 as well as the initially generated singlet exciton energy.

In one exemplary embodiment, the contents of the fourth compound H2 can be larger than the contents of the fifth compound FD2 in the EML2 244. For example, each of the contents of the fourth compound H2 and the fifth compound FD2 can be, but is not limited to, about 70 wt % to about 99 wt %, preferably about 90 wt % to about 99 wt %, and about 1 wt % to about 30 wt %, preferably about 1 wt % to about 10 wt %, respectively.

In accordance with the present disclosure, the EML 240 includes the EML1 242 that implements TADF having excellent luminous efficiency at low current density, and the EML2 244 that implements TTA capable of maintaining good luminous efficiency even at high current density. Each of the luminous materials in the EML1 242 and the EML2 244 are designed to have proper luminous energy level so that the OLED D1 can lower its driving voltage and enhance its luminous efficiency, luminous lifetime and color purity.

Figure 8:
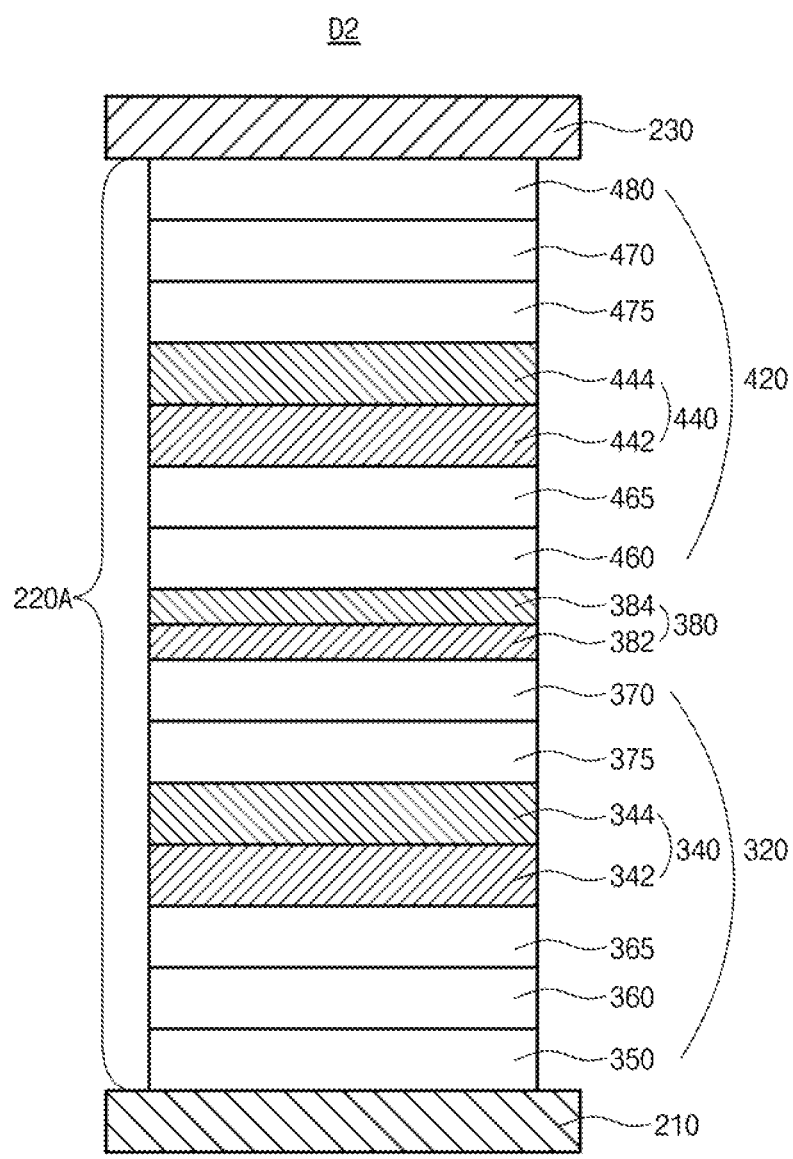
FIG. 8 is a schematic cross-sectional view illustrating an OLED in accordance with another exemplary aspect of the present disclosure.

In an alternative aspect, an OLED can include multiple emitting parts. FIG. 8 is a schematic cross-sectional view illustrating an OLED in accordance with still another exemplary aspect of the present disclosure.

As illustrated in FIG. 8, the OLED D2 comprises first and second electrodes 210 and 230 facing each other and an emissive layer 220A with two emitting parts disposed between the first and second electrodes 210 and 230. The organic light emitting display device 100 (FIG. 1) includes a red pixel region, a green pixel region and a blue pixel region, and the OLED D2 can be disposed in the blue pixel region. The first electrode 210 can be an anode and the second electrode 230 can be a cathode.

The emissive layer 220A includes a first emitting part 320 that includes a first EML (EML1) 340, and a second emitting part 420 that includes a second EML (EML2) 440. Also, the emissive layer 220A can further comprise a charge generation layer (CGL) 380 disposed between the first emitting part 320 and the second emitting part 420.

The CGL 380 is disposed between the first and second emitting parts 320 and 420 so that the first emitting part 320, the CGL 380 and the second emitting part 420 are sequentially disposed on the first electrode 210. In other words, the first emitting part 320 is disposed between the first electrode 210 and the CGL 380 and the second emitting part 420 is disposed between the second electrode 230 and the CGL 380.

The first emitting part 320 comprises the EML1 340. The first emitting part 320 can further comprise at least one of a first HTL (HTL1) 360 disposed between the first electrode 210 and the EML1 340, a HIL 350 disposed between the first electrode 210 and the HTL1 360 and a first ETL (ETL1) 370 disposed between the EML1 340 and the CGL 380. Alternatively, the first emitting part 320 can further comprise a first EBL (EBL1) 365 disposed between the HTL1 360 and the EML1 340 and/or a first HBL (HBL1) 375 disposed between the EML1 340 and the ETL1 370.

The second emitting part 420 comprises the EML2 440. The second emitting part 420 can further comprise at least one of a second HTL (HTL2) 460 disposed between the CGL 380 and the EML2 440, a second ETL (ETL2) 470 disposed between the EML2 440 and the second electrode 230 and an EIL 480 disposed between the ETL2 470 and the second electrode 230. Alternatively, the second emitting part 420 can further comprise a second EBL (EBL2) 465 disposed between the HTL2 460 and the EML2 440 and/or a second HBL (HBL2) 475 disposed between the EML2 440 and the ETL2 470.

The CGL 380 is disposed between the first emitting part 320 and the second emitting part 420. The first emitting part 320 and the second emitting part 420 are connected via the CGL 380. The CGL 380 can be a PN-junction CGL that junctions an N-type CGL (N-CGL) 382 with a P-type CGL (P-CGL) 384.

The N-CGL 382 is disposed between the ETL1 370 and the HTL2 360 and the P-CGL 384 is disposed between the N-CGL 382 and the HTL2 360. The N-CGL 382 transports electrons to the EML1 340 of the first emitting part 320 and the P-CGL 384 transport holes to the EML2 440 of the second emitting part 420.

In this aspect, each of the EML1 340 and the EML2 440 can be a blue emitting material layer. For example, the EML1 340 includes a first lower EML (first layer) 342 disposed between the EBL1 365 and the HBL1 375 and a first upper EML (second layer) 344 disposed between the first lower EML 342 and the HBL1 375. The EML2 440 includes a second lower EML (first layer) 442 disposed between the EBL2 465 and the HBL2 475 and a second upper EML (second layer) 444 disposed between the second lower EML 442 and the HBL2 475. Each of the first lower EML 342 and the second lower EML 442 includes the first compound H1, the second compound TD and the third compound FD1 to implement TADF, and each of the first upper EML 342 and the second upper EML 444 includes the fourth compound H2 and the fifth compound FD2 to implement TTA.

In each of the first lower EML 342 and the second lower EML 442 implementing TADF, the contents the first compound H1 can be larger than the contents of the second compound TD and the contents of the second compound TD can be larger than the contents of the third compound FD1. In this case, exciton energy can be transferred efficiently from the second compound TD to the third compound FD1 via FRET mechanism. As an example, each of the contents of the first compound H1, the second compound TD, and the third compound FD1 in each of the first lower EML1 342 and the second lower EML 442 can be, but is not limited to, about 60 wt % to about 75 wt %, about 20 wt % to about 40 wt %, and about 0.1 wt % to about 5 wt %, respectively.

In addition, in each of the first upper EML 344 and the second upper EML 444 implementing TTA, the contents of the fourth compound H2 can be larger than the contents of the fifth compound FD2. For example, each of the contents of the fourth compound H2 and the fifth compound FD2 in each of the first upper EML 344 and the second upper EML 444 can be, but is not limited to, about 70 wt % to about 99 wt %, preferably about 90 wt % to about 99 wt %, and about 1 wt % to about 30 wt %, preferably about 1 wt % to about 10 wt %, respectively.

Alternatively, any one of the first EML1 340 and the second EML2 440 can comprise a host and other blue dopant. The host can include the first compound H1 and/or the fourth compound H2, and other blue dopant can comprise at least one of blue phosphorescent material, blue fluorescent material and blue delayed fluorescent material so that one of the first EML1 340 and the second EML2 440 can emit blue light with different wavelength and/or different luminous efficiency from the other of the first EML 340 and the second EML 440. Any one emitting material layer of the first EML1 340 and the EML2 440, which includes the different blue dopant, can have a single-layered structure.

In the OLED D2 of this aspect, at least one of the EML1 340 and the EML2 440 includes a lower EML implementing TADF and an upper EML implementing TTA. Accordingly, the OLED D2 can improve its color purity and luminous efficiency. In addition, the OLED D2 has a double-stacked structure of blue EML so that the OLED D2 can enhance its color sense and optimize its luminous efficiency.

Figure 9:
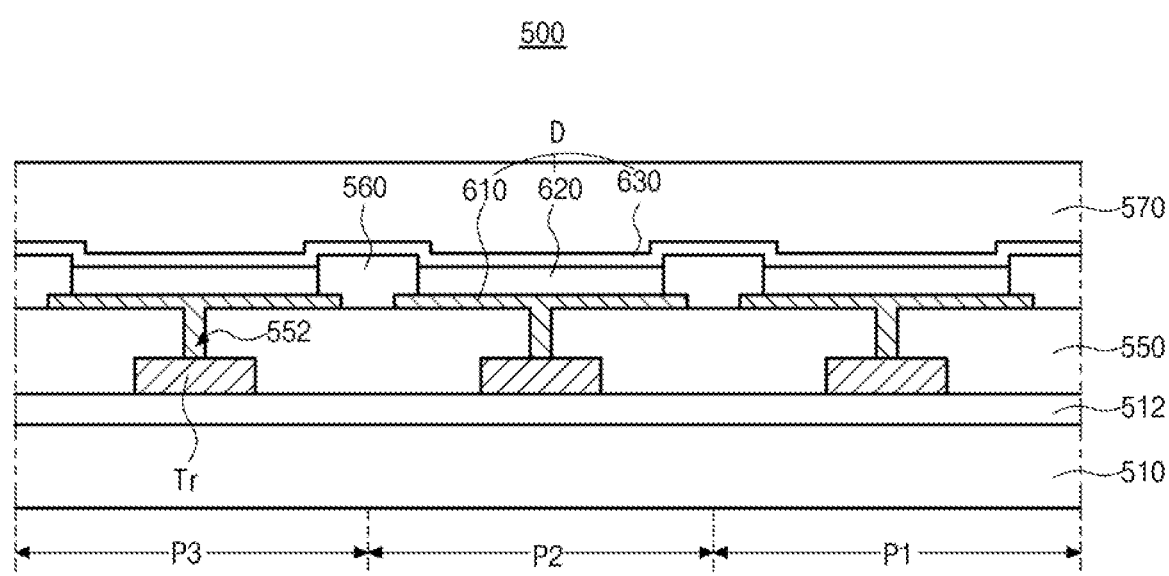
FIG. 9 is a schematic cross-sectional view illustrating an organic light emitting display device in accordance with another exemplary aspect of the present disclosure.

FIG. 9 is a schematic cross-sectional view illustrating an organic light emitting display device in accordance with another exemplary aspect of the present disclosure. As illustrated in FIG. 9, an organic light emitting display device 500 includes a substrate 510 that defines first to third pixel regions P1, P2 and P3, a thin film transistor Tr disposed over the substrate 510 and an OLED D disposed over the thin film transistor Tr and connected to the thin film transistor Tr. As an example, the first pixel region P1 can be a blue pixel region, the second pixel region P2 can be a green pixel region and the third pixel region P3 can be a red pixel region.

The substrate 510 can be a glass substrate or a flexible substrate. For example, the flexible substrate can be any one of a PI substrate, a PES substrate, a PEN substrate, a PET substrate and a PC substrate.

A buffer layer 512 is disposed over the substrate 510 and the thin film transistor Tr is disposed over the buffer layer 512. The buffer layer 512 can be omitted. As illustrated in FIG. 1, the thin film transistor Tr includes a semiconductor layer, a gate electrode, a source electrode and a drain electrode and acts as a driving element.

A passivation layer 550 is disposed over the thin film transistor Tr. The passivation layer 550 has a flat top surface and a drain contact hole 552 that exposes a drain electrode of the thin film transistor Tr.

The OLED D is disposed over the passivation layer 550, and includes a first electrode 610 that is connected to the drain electrode of the thin film transistor Tr, and an emissive layer 620 and a second electrode 630 each of which is disposed sequentially on the first electrode 610. The OLED D is disposed in each of the first to third pixel regions P1, P2 and P3 and emits different light in each pixel region. For example, the OLED D in the first pixel region P1 can emit blue light, the OLED D in the second pixel region P2 can emit greenlight and the OLED D in the third pixel region P3 can emit red light.

The first electrode 610 is separately formed for each of the first to third pixel regions P1, P2 and P3, and the second electrode 630 corresponds to the first to third pixel regions P1, P2 and P3 and is formed integrally.

The first electrode 610 can be one of an anode and a cathode, and the second electrode 630 can be the other of the anode and the cathode. In addition, one of the first electrode 610 and the second electrode 630 is a transmissive (or semi-transmissive) electrode and the other of the first electrode 610 and the second electrode 630 is a reflective electrode.

For example, the first electrode 610 can be an anode and can include conductive material having a relatively high work function value, i.e., a transparent conductive oxide layer of transparent conductive oxide (TCO). The second electrode 630 can be a cathode and can include conductive material having relatively low work function value, i.e., a metal material layer of low-resistant metal. For example, the first electrode 610 can include any one of ITO, IZO, ITZO, SnO, ZnO, ICO and AZO, and the second electrode 630 can include Al, Mg, Ca, Ag, alloy thereof or combination thereof.

When the organic light emitting display device 500 is a bottom-emission type, the first electrode 610 can have a single-layered structure of a transparent conductive oxide layer.

Alternatively, when the organic light emitting display device 600 is a top-emission type, a reflective electrode or a reflective layer can be disposed under the first electrode 610. For example, the reflective electrode or the reflective layer can include, but is not limited to, Ag or APC alloy. In the OLED D of the top-emission type, the first electrode 610 can have a triple-layered structure of ITO/Ag/ITO or ITO/APC/ITO. Also, the second electrode 630 is thin so as to have light-transmissive (or semi-transmissive) property.

A bank layer 560 is disposed on the passivation layer 650 in order to cover edges of the first electrode 610. The bank layer 560 corresponds to each of the first to third pixel regions P1, P2 and P3 and exposes a center of the first electrode 610.

An emissive layer 620 is disposed on the first electrode 610. In one exemplary aspect, the emissive layer 620 can have a single-layered structure of an EML. Alternatively, the emissive layer 620 can include at least one of a HIL, a HTL, and an EBL disposed sequentially between the first electrode 610 and the EML and/or a HBL, an ETL and an EIL disposed sequentially between the EML and the second electrode 630.

In one exemplary aspect, the EML of the emissive layer 630 in the first pixel region P1 of a blue pixel region can comprise a first EML (EML1, lower EML, first layer) including the first compound H1, the second compound TD and the third compound FD1 for implementing TADF and a second EML (EML2, upper EML, second layer) including the fourth compound H2 and the fifth compound FD2 for implementing TTA.

An encapsulation film 570 is disposed over the second electrode 630 in order to prevent outer moisture from penetrating into the OLED D. The encapsulation film 570 can have, but is not limited to, a triple-layered structure of a first inorganic insulating film, an organic insulating film and a second inorganic insulating film.

The organic light emitting display device 500 can have a polarizer in order to decrease external light reflection. For example, the polarizer can be a circular polarizer. When the organic light emitting display device 500 is a bottom-emission type, the polarizer can be disposed under the substrate 810. Alternatively, when the organic light emitting display device 500 is a top emission type, the polarizer can be disposed over the encapsulation film 870.

Figure 10:
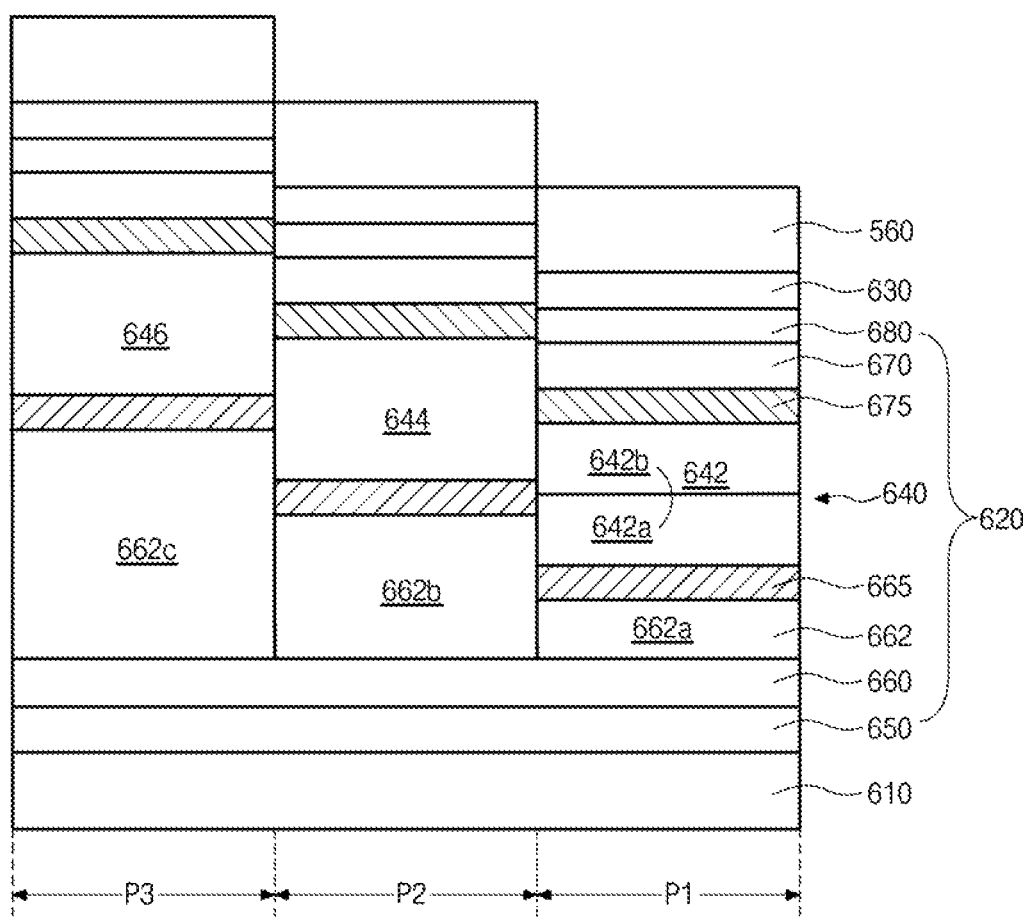
FIG. 10 is a schematic cross-sectional view illustrating an OLED in accordance with still another exemplary aspect of the present disclosure.

FIG. 10 is a schematic cross-sectional view illustrating an OLED in accordance with still another exemplary aspect of the present disclosure. As illustrated in FIG. 10, the OLED D3 comprises a first electrode 610, a second electrode 630 facing the first electrode 610 and an emissive layer 620 disposed between the first and second electrodes 610 and 630.

The first electrode 610 can be an anode and the second electrode 630 can be a cathode. As an example, the first electrode 610 can be a reflective electrode and the second electrode 630 can be a transmissive (or semi-transmissive) electrode.

The emissive layer 620 comprises an EML 640. The emissive layer 630 can comprise at least one of a HTL 660 disposed between the first electrode 610 and the EML 640 and an ETL 670 disposed between the second electrode 630 and the EML 640. Also, the emissive layer 620 can further comprise at least one of a HIL 650 disposed between the first electrode 610 and the HTL 660 and an EIL 680 disposed between the second electrode 630 and the ETL 670. Alternatively, the emissive layer 620 can further comprise an EBL 665 disposed between the HTL 660 and the EML 640 and/or a HBL 675 disposed between the EML 640 and the ETL 670.

In addition, the emissive layer 620 can further comprise an auxiliary hole transport layer (auxiliary HTL) 662 disposed between the HTL 660 and the EBL 665. The auxiliary HTL 662 can comprise a first auxiliary HTL 662a located in the first pixel region P1, a second auxiliary HTL 662b located in the second pixel region P2 and a third auxiliary HTL 662c located in the third pixel region P3.

The first auxiliary HTL 662a has a first thickness, the second auxiliary HTL 662b has a second thickness and the third auxiliary HTL 662c has a third thickness. The first thickness is less than the second thickness and the second thickness is less than the third thickness. Accordingly, the OLED D3 has a micro-cavity structure.

Owing to the first to third auxiliary HTLs 662a, 662b and 662c having different thickness to each other, the distance between the first electrode 610 and the second electrode 630 in the first pixel region P1 emitting light in the first wavelength range (blue light) is smaller than the distance between the first electrode 610 and the second electrode 630 in the second pixel region P2 emitting light in the second wavelength (green light), which is longer than the first wavelength range. In addition, the distance between the first electrode 610 and the second electrode 630 in the second pixel region P2 is larger than the distance between the first electrode 910 and the second electrode 930 in the third pixel region P3 emitting light in the third wavelength range (red light), which is longer than the second wavelength range. Accordingly, the OLED D3 has improved luminous efficiency.

In FIG. 10, the third auxiliary HTL 662c is located in the first pixel region P1. Alternatively, the OLED D3 can implement the micro-cavity structure without the first auxiliary HTL 662c. In addition, a capping layer can be disposed over the second electrode in order to improve outcoupling of the light emitted from the OLED D3.

The EML 640 comprises a first EML (EML1) 642 located in the first pixel region P1, a second EML (EML2) 644 located in the second pixel region P2 and a third EML (EML3) 646 located in the third pixel region P3. Each of the EML1 642, the EML2 644 and the EML3 646 can be a blue EML, a green EML and a red EML, respectively.

In one exemplary aspect, the EML1 642 located in the first pixel region P1 can comprise a lower EML (first layer) 642a including the first compound H1, the second compound TD and the third compound FD for implementing TADF and an upper EML (second layer) 642b including the fourth compound H2 and the fifth compound FD2 for implementing TTA.

In one exemplary aspect, the contents of the first compound H1 can be larger than the contents of the second compound TD and the contents of the second compound TD can be larger than the contents of the third compound FD1 in the lower EML 642a. In this case, exciton energy can be transferred efficiently from the second compound TD to the third compound FD1 via FRET mechanism. As an example, each of the contents of the first compound H1, the second compound TD, and the third compound FD1 in the EML1 242 can be, but is not limited to, about 60 wt % to about 75 wt %, about 20 wt % to about 40 wt %, and about 0.1 wt % to about 5 wt %, respectively. In addition, the contents of the fourth compound H2 can be larger than the contents of the fifth compound FD2 in the upper EML2 642b. For example, each of the contents of the fourth compound H2 and the fifth compound FD2 can be, but is not limited to, about 70 wt % to about 99 wt %, preferably about 90 wt % to about 99 wt %, and about 1 wt % to about 30 wt %, preferably about 1 wt % to about 10 wt %, respectively.

The EML2 644 located in the second pixel region P2 can include a host and green dopant and the EML3 646 located in the third pixel region P3 can include a host and red dopant. The host in each of the EML2 644 and the EMl3 646 can include the first compound H1 and/or the fourth compound H2, and the green and the red dopant can include at least one of green or red phosphorescent material, green or red fluorescent material and green or red delayed fluorescent material.

The OLED D3 in FIG. 10 emits blue light, green light and red light in each of the first to third pixel regions P1, P2 and P3 so that the organic light emitting display device 500 (FIG. 9) can implement a full-color image.

The organic light emitting display device 500 can further comprise a color filter layer corresponding to the first to third pixel regions P1, P2 and P3 for improving color purity of the light emitted from the OLED D. As an example, the color filter layer can comprise a first color filter layer (blue color filter layer) corresponding to the first pixel region P1, the second color filter layer (green color filter layer) corresponding to the second pixel region P2 and the third color filter layer (red color filter layer) corresponding to the third pixel region P3.

When the organic light emitting display device 500 is a bottom-emission type, the color filter layer can be disposed between the OLED D and the substrate 510. Alternatively, when the organic light emitting display device 500 is a top-emission type, the color filter layer can be disposed over the OLED D.

Figure 11:
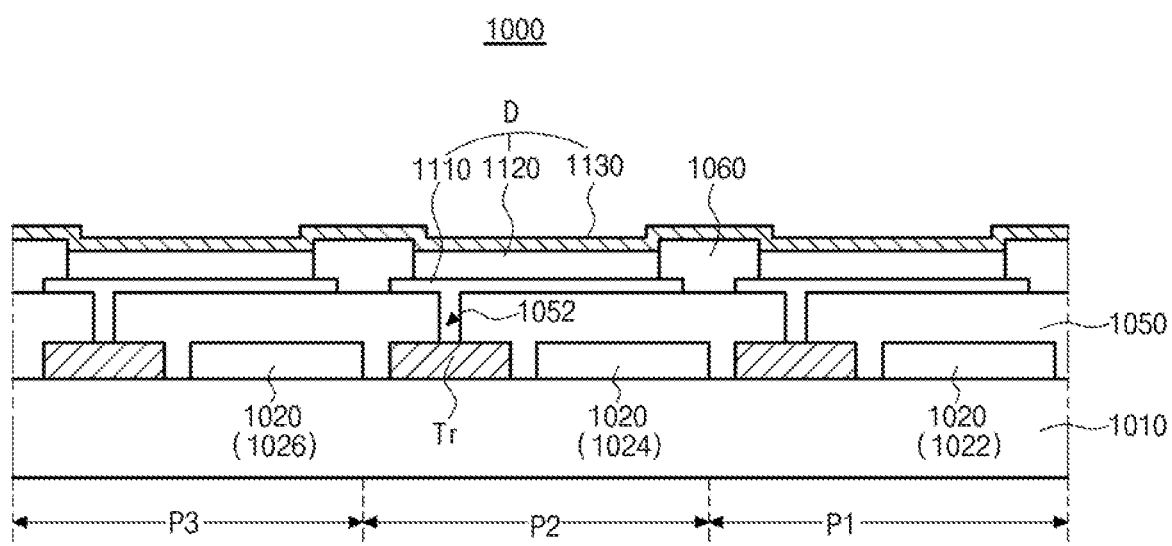
FIG. 11 is a schematic cross-sectional view illustrating an organic light emitting display device in accordance with still another exemplary aspect of the present disclosure.

FIG. 11 is a schematic cross-sectional view illustrating an organic light emitting display device in accordance with still another exemplary aspect of the present disclosure. As illustrated in FIG. 11, the organic light emitting display device 1000 comprise a substrate 1010 defining a first pixel region P1, a second pixel region P2 and a third pixel region P3, a thin film transistor Tr disposed over the substrate 1010, an OLED D disposed over the thin film transistor Tr and connected to the thin film transistor Tr and a color filter layer 1020 corresponding to the first to third pixel regions P1, P2 and P3. As an example, the first pixel region P1 can be a blue pixel region, the second pixel region P2 can be a green pixel region and the third pixel region P3 can be a red pixel region.

The substrate 1010 can be a glass substrate or a flexible substrate. For example, the flexible substrate can be any one of a PI substrate, a PES substrate, a PEN substrate, a PET substrate and a PC substrate. The thin film transistor Tr is located over the substrate 1010. Alternatively, a buffer layer can be disposed over the substrate 1010 and the thin film transistor Tr can be disposed over the buffer layer. As illustrated in FIG. 1, the thin film transistor Tr includes a semiconductor layer, a gate electrode, a source electrode and a drain electrode and acts as a driving element.

The color filter layer 1020 is located over the substrate 1010. As an example, the color filter layer 1020 can comprise a first color filter layer 1022 corresponding to the first pixel region P1, a second color filter layer 1024 corresponding to the second pixel region P2 and a third color filter layer 1026 corresponding to the third pixel region P3. The first color filter layer 1022 can be a blue color filter layer, the second color filter layer 1024 can be a green color filter layer and the third color filter layer 1026 can be a red color filter layer. For example, the first color filter layer 1022 can comprise at least one of blue dye or blue pigment, the second color filter layer 1024 can comprise at least one of green dye or green pigment and the third color filter layer 1026 can comprise at least one of red dye or red pigment.

A passivation layer 1050 is disposed over the thin film transistor Tr and the color filter layer 1020. The passivation layer 1050 has a flat top surface and a drain contact hole 1052 that exposes a drain electrode of the thin film transistor Tr.

The OLED D is disposed over the passivation layer 1050 and corresponds to the color filter layer 1020. The OLED D includes a first electrode 1110 that is connected to the drain electrode of the thin film transistor Tr, and an emissive layer 1120 and a second electrode 1130 each of which is disposed sequentially on the first electrode 1110. The OLED D emits white light in the first to third pixel regions P1, P2 and P3.

The first electrode 1110 is separately formed for each of the first to third pixel regions P1, P2 and P3, and the second electrode 1130 corresponds to the first to third pixel regions P1, P2 and P3 and is formed integrally.

The first electrode 1110 can be one of an anode and a cathode, and the second electrode 1130 can be the other of the anode and the cathode. In addition, the first electrode 1110 can be a transmissive (or semi-transmissive) electrode and the second electrode 1130 can be a reflective electrode.

For example, the first electrode 1110 can be an anode and can include conductive material having a relatively high work function value, i.e., a transparent conductive oxide layer of transparent conductive oxide (TCO). The second electrode 1130 can be a cathode and can include conductive material having relatively low work function value, i.e., a metal material layer of low-resistant metal. For example, the transparent conductive oxide layer of the first electrode 1110 can include any one of ITO, IZO, ITZO, SnO, ZnO, ICO and AZO, and the second electrode 1130 can include Al, Mg, Ca, Ag, alloy thereof (ex., Mg—Ag) or combination thereof.

The emissive layer 1120 is disposed on the first electrode 1110. The emissive layer 1120 includes at least two emitting parts emitting different colors. Each of the emitting part can have a single-layered structure of an EML. Alternatively, each of the emitting parts can include at least one of a HIL, a HTL, and an EBL, a HBL, an ETL and an EIL. In addition, the emissive layer can further comprise a CGL disposed between the emitting parts.

At least one of the at least two emitting parts can comprise a first EML (lower EML) including the first compound H1, the second compound TD and the third compound FD1 for implementing TADF and a second EML (upper EML) including the fourth compound H2 and the fifth compound FD2 for implementing TTA.

A bank layer 1060 is disposed on passivation layer 1050 in order to cover edges of the first electrode 1110. The bank layer 1060 corresponds to each of the first to third pixel regions P1, P2 and P3 and exposes a center of the first electrode 1110. As described above, since the OLED D emits white light in the first to third pixel regions P1, P2 and P3, the emissive layer 1120 can be formed as a common layer without being separated in the first to third pixel regions P1, P2 and P3. The bank layer 1060 is formed to prevent current leakage from the edges of the first electrode 1110, and the bank layer 1060 can be omitted.

Moreover, the organic light emitting display device 1000 can further comprise an encapsulation film disposed on the second electrode 1130 in order to prevent outer moisture from penetrating into the OLED D. In addition, the organic light emitting display device 1000 can further comprise a polarizer disposed under the substrate 1010 in order to decrease external light reflection.

In the organic light emitting display device 1000 in FIG. 11, the first electrode 1110 is a transmissive electrode, the second electrode 1130 is a reflective electrode, and the color filter layer 1020 is disposed between the substrate 1010 and the OLED D. That is, the organic light emitting display device 1000 is a bottom-emission type. Alternatively, the first electrode 1110 can be a reflective electrode, the second electrode 1120 can be a transmissive electrode (or semi-transmissive electrode) and the color filter layer 1020 can be disposed over the OLED D in the organic light emitting display device 1000.

In the organic light emitting display device 1000, the OLED D located in the first to third pixel regions P1, P2 and P3 emits white light, and the white light passes through each of the first to third pixel regions P1, P2 and P3 so that each of a blue color, a green color and a red color is displayed in the first to third pixel regions P1, P2 and P3, respectively.

A color conversion film can be disposed between the OLED D and the color filter layer 1020. The color conversion film corresponds to the first to third pixel regions P1, P2 and P3, and comprises a blue color conversion film, a green color conversion film and a red color conversion film each of which can convert the white light emitted from the OLED D into blue light, green light and red light, respectively. For example, the color conversion film can comprise quantum dots. Accordingly, the organic light emitting display device 1000 can further enhance its color purity. Alternatively, the color conversion film can displace the color filter layer 1020.

Figure 12:
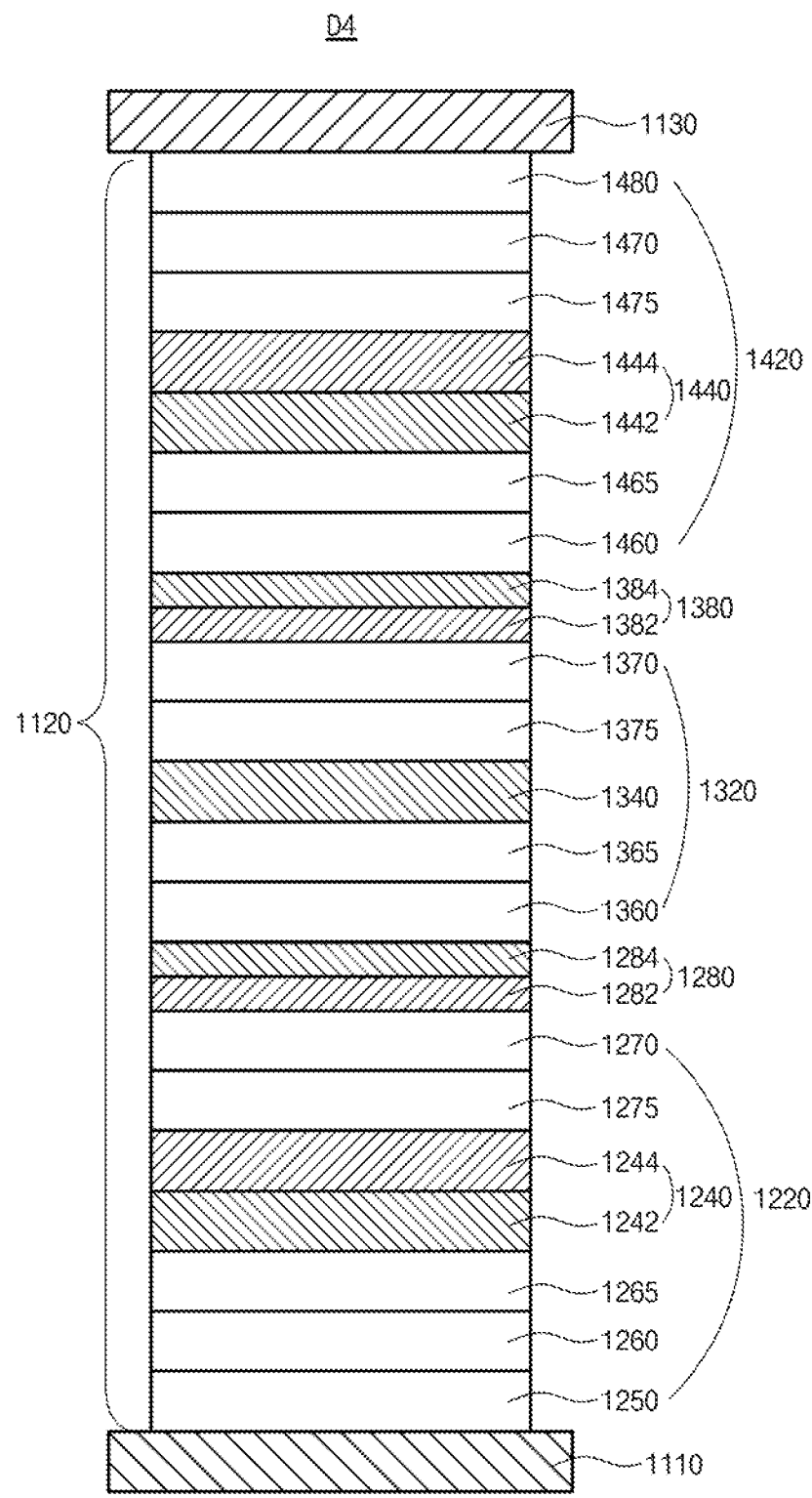
FIG. 12 is a schematic cross-sectional view illustrating an OLED in accordance with still another exemplary aspect of the present disclosure.

FIG. 12 is a schematic cross-sectional view illustrating an OLED in accordance with still another exemplary aspect of the present disclosure. As illustrated in FIG. 12, the OLED D4 comprises first and second electrodes 1110 and 1120 facing each other and an emissive layer 1120 disposed between the first and second electrodes 1110 and 1120. The first electrode 1110 can be an anode and the second electrode 1120 can be a cathode. For example, the first electrode 1100 can be a transmissive electrode and the second electrode 1120 can be a reflective electrode.

The emissive layer 1120 includes a first emitting part 1220 comprising a first EML (EML1) 1240, a second emitting part 1320 comprising a second EML (EML2) 1340 and a third emitting part 1420 comprising a third EML (EML3) 1440. In addition, the emissive layer 1120 can further comprise a first charge generation layer (CGL1) 1280 disposed between the first emitting part 1220 and the second emitting part 1320 and a second charge generation layer (CGL2) 1380 disposed between the second emitting part 1320 and the third emitting part 1420.

Accordingly, the first emitting part 1220, the CGL1 1280, the second emitting part 1320, the CGL2 1380 and the third emitting part 1420 are disposed sequentially on the first electrode 1110.

The first emitting part 1220 can further comprise at least one of a first HTL (HTL1) 1260 disposed between the first electrode 1110 and the EML1 1240, a HIL 1250 disposed between the first electrode 1110 and the HTL1 1260 and a first ETL (ETL1) 1270 disposed between the EML1 1240 and the CGL1 1280. Alternatively, the first emitting part 1220 can further comprise a first EBL (EBL1) 1265 disposed between the HTL1 1260 and the EML1 1240 and/or a first HBL (HBL1) 1275 disposed between the EML1 1240 and the ETL1 1270.

The second emitting part 1320 can further comprise at least one of a second HTL (HTL2) 1360 disposed between the CGL1 1280 and the EML2 1340, a second ETL (ETL2) 1370 disposed between the EML2 1340 and the CGL2 1380. Alternatively, the second emitting part 1320 can further comprise a second EBL (EBL2) 1365 disposed between the HTL2 1360 and the EML2 1340 and/or a second HBL (HBL2) 1375 disposed between the EML2 1340 and the ETL2 1370.

The third emitting part 1420 can further comprise at least one of a third HTL (HTL3) 1460 disposed between the CGL2 1380 and the EML3 1440, a third ETL (ETL3) 1470 disposed between the EML3 1440 and the second electrode 1130 and an EIL 1480 disposed between the ETL3 1470 and the second electrode 1130. Alternatively, the third emitting part 1420 can further comprise a third EBL (EBL3) 1465 disposed between the HTL3 1460 and the EML3 1440 and/or a third HBL (HBL3) 1475 disposed between the EML3 1440 and the ETL3 1470.

The CGL1 1280 is disposed between the first emitting part 1220 and the second emitting part 1320. That is, the first emitting part 1220 and the second emitting part 1320 are connected via the CGL1 1280. The CGL1 1280 can be a PN-junction CGL that junctions a first N-type CGL (N-CGL1) 1282 with a first P-type CGL (P-CGL1) 1284.

The N-CGL1 1282 is disposed between the ETL1 1270 and the HTL2 1360 and the P-CGL1 1284 is disposed between the N-CGL1 1282 and the HTL2 1360. The N-CGL1 1282 transports electrons to the EML1 1240 of the first emitting part 1220 and the P-CGL1 1284 transport holes to the EML2 1340 of the second emitting part 1320.

The CGL2 1380 is disposed between the second emitting part 1320 and the third emitting part 1420. That is, the second emitting part 1320 and the third emitting part 1420 are connected via the CGL2 1380. The CGL2 1380 can be a PN-junction CGL that junctions a second N-type CGL (N-CGL2) 1382 with a second P-type CGL (P-CGL2) 1384.

The N-CGL2 1382 is disposed between the ETL2 1370 and the HTL3 1460 and the P-CGL2 1384 is disposed between the N-CGL2 1382 and the HTL3 1460. The N-CGL2 1382 transports electrons to the EML2 1340 of the second emitting part 1320 and the P-CGL2 1384 transport holes to the EML3 1440 of the third emitting part 1420.

In this aspect, one of the first to third EMLs 1240, 1340 and 1440 can be a blue EML, another of the first to third EMLs 1240, 1340 and 1440 can be a green EML and the third of the first to third EMLs 1240, 1340 and 1440 can be a red EML.

As an example, the EML1 1240 can be a blue EML, the EML2 1340 can be a green EML and the EML3 1440 can be a red EML. Alternatively, the EML1 1240 can be a red EML, the EML2 1340 can be a green EML and the EML3 1440 can be a blue EML1.

When the EML1 1240 is the blue EML, the EML1 1240 can comprise a first lower EML (first layer) 1242 disposed between the EBL1 1265 and the HBL1 1275 and a first upper EML (second layer) 1244 disposed between the first lower EML 1242 and the HBL1 1275. The first lower EML 1242 includes the first compound H1, the second compound TD and the third compound FD1 for implementing TADF and the first upper EML 1244 includes the fourth compound H2 and the fifth compound FD2 for implementing TTA.

Alternatively, when the EML1 1240 is the red EML, the EML1 1240 can have a mono-layered structure. The EML1 1240 as the red EML can include a host and red dopant. The host can comprise the first compound H1 and/or the fourth compound H2 and the red dopant can comprise at least one of red phosphorescent material, red fluorescent material and red delayed fluorescent material.

The EML2 1340 can comprise a host and green dopant. The host can comprise the first compound H1 and/or the fourth compound H2 and the green dopant can comprise at least one of green phosphorescent material, green fluorescent material and green delayed fluorescent material.

When the EML3 1440 is the blue EML, the EML1 1440 can comprise a second lower EML (first layer) 1442 disposed between the EBL2 1465 and the HBL1 1475 and a second upper EML (second layer) 1444 disposed between the second lower EML 1442 and the HBL2 1475. The second lower EML 1442 includes the first compound H1, the second compound TD and the third compound FD1 for implementing TADF and the second upper EML 1444 includes the fourth compound H2 and the fifth compound FD2 for implementing TTA.

Alternatively, when the EML3 1440 is the red EML, the EML3 1440 can have a mono-layered structure. The EML3 1440 as the red EML can include a host and red dopant. The host can comprise the first compound H1 and/or the fourth compound H2 and the red dopant can comprise at least one of red phosphorescent material, red fluorescent material and red delayed fluorescent material.

In each of the first lower EML 1242 and the second lower EML 1442 implementing TADF, the contents the first compound H1 can be larger than the contents of the second compound TD and the contents of the second compound TD can be larger than the contents of the third compound FD1. In this case, exciton energy can be transferred efficiently from the second compound TD to the third compound FD1 via FRET mechanism. As an example, each of the contents of the first compound H1, the second compound TD, and the third compound FD1 in each of the first lower EML 1242 and the second lower EML 1342 can be, but is not limited to, about 60 wt % to about 75 wt %, about 20 wt % to about 40 wt %, and about 0.1 wt % to about 5 wt %, respectively.

In addition, in each of the first upper EML 1244 and the second upper EML 1444 implementing TTA, the contents of the fourth compound H2 can be larger than the contents of the fifth compound FD2. For example, each of the contents of the fourth compound H2 and the fifth compound FD2 in each of the first upper EML 1244 and the second upper EML 1444 can be, but is not limited to, about 70 wt % to about 99 wt %, preferably about 90 wt % to about 99 wt %, and about 1 wt % to about 30 wt %, preferably about 1 wt % to about 10 wt %, respectively.

The OLED D4 emits white light in each of the first to third pixel regions P1, P2 and P3 and the white light passes though the color filter layer 1020 (FIG. 11) correspondingly disposed in the first to third pixel regions P1, P2 and P3. Accordingly, the OLED D4 can implement a full-color image.

Figure 13:
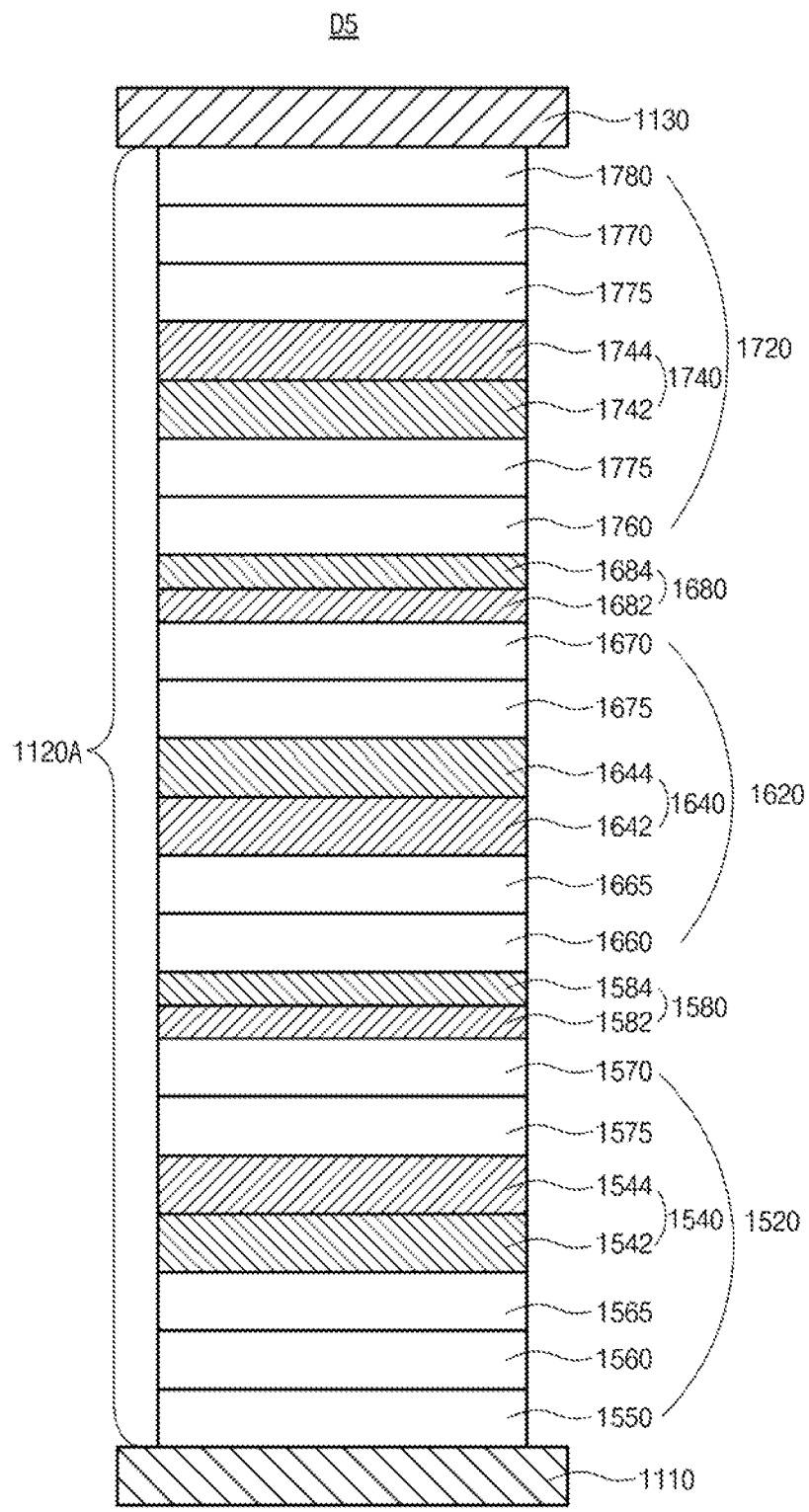
FIG. 13 is a cross-sectional view illustrating an OLED in accordance with still another exemplary aspect of the present disclosure.
Figure 14:
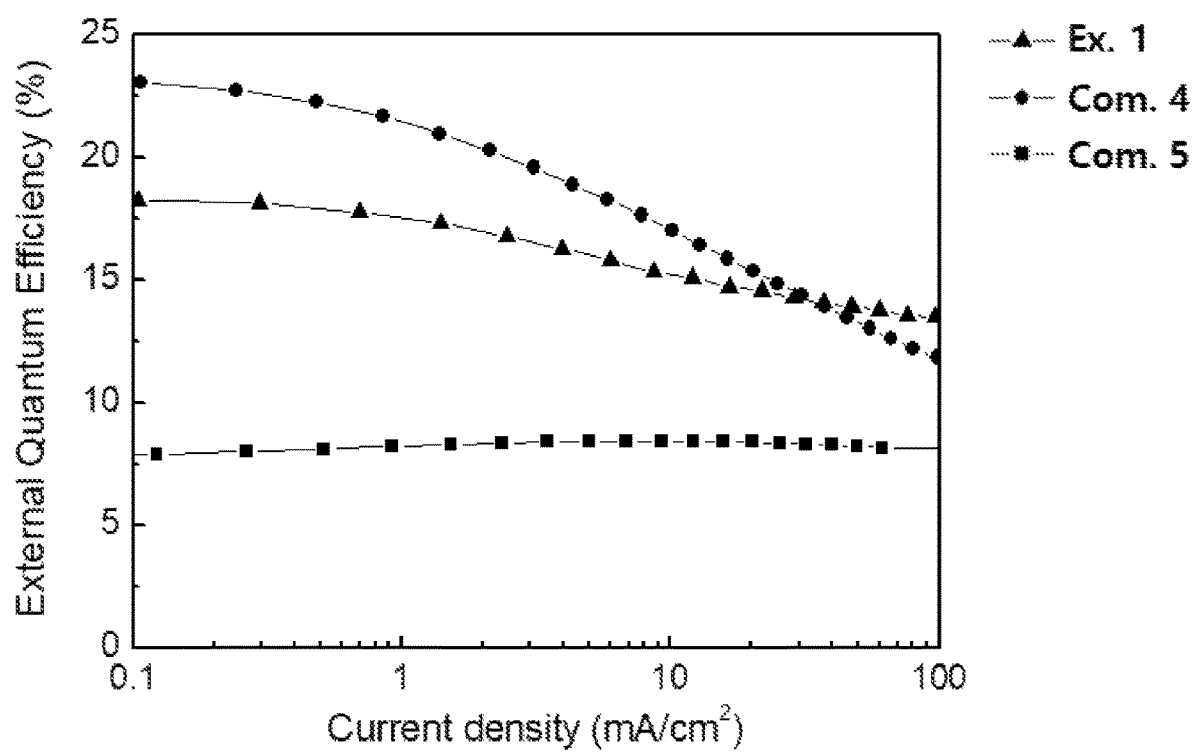
FIG. 14 is a graph illustrating measurement results of current density-EQE in OLEDs fabricated in Example and Comparative Examples.

FIG. 13 is a schematic cross-sectional view illustrating an OLED in accordance with still another exemplary aspect of the present disclosure. As illustrated in FIG. 13, the OLED D5 comprises first and second electrodes 1110 and 1120 facing each other and an emissive layer 1120A disposed between the first and second electrodes 1110 and 1120. The first electrode 1110 can be an anode and the second electrode 1120 can be a cathode. For example, the first electrode 1100 can be a transmissive electrode and the second electrode 1120 can be a reflective electrode.

The emissive layer 1120A includes a first emitting part 1520 comprising an EML1 1540, a second emitting part 1620 comprising an EML2 1640 and a third emitting part 1720 comprising a EML3 1740. In addition, the emissive layer 1120A can further comprise a CGL1 1580 disposed between the first emitting part 1520 and the second emitting part 1620 and a CGL2 1680 disposed between the second emitting part 1620 and the third emitting part 1720. Accordingly, the first emitting part 1520, the CGL1 1580, the second emitting part 1620, the CGL2 1680 and the third emitting part 1720 are disposed sequentially on the first electrode 1110.

The EML1 1540 in the first emitting part 1520 includes a first lower EML (first layer) 1542 and a first upper EML (second layer) 1544. The first lower EML 1542 is located adjacently to the first electrode 1110 and the first upper EML 1544 is located adjacently to the second electrode 1130. The first emitting part 1520 can further comprise at least one of a HTL1 1560 disposed between the first electrode 1110 and the EML1 1540, a HIL 1550 disposed between the first electrode 1110 and the HTL1 1560 and an ETL1 1570 disposed between the EML1 1540 and the CGL1 1580. Alternatively, the first emitting part 1520 can further comprise an EBL1 1565 disposed between the HTL1 1560 and the EML1 1540 and/or a HBL1 1575 disposed between the EML1 1540 and the ETL1 1570.

The EML2 1640 in the second emitting part 1620 comprises a second lower EML 1642 and a second upper EML 1644. The second lower EML 1642 is located adjacently to the first electrode 1110 and the second upper EML 1644 is located adjacently to the second electrode 1130. In addition, the second emitting part 1620 can further comprise at least one of a HTL2 1660 disposed between the CGL1 1580 and the EML2 1640, an ETL2 1670 disposed between the EML2 1640 and the CGL2 1680. Alternatively, the second emitting part 1620 can further comprise an EBL2 1665 disposed between the HTL2 1660 and the EML2 1640 and/or a HBL2 1675 disposed between the EML2 1640 and the ETL2 1670.

The EML3 1740 in the third emitting part 1720 includes a third lower EML (first layer) 1742 and a third upper EML (second layer) 1744. The first lower EML 1742 is located adjacently to the first electrode 1110 and the third upper EML 1744 is located adjacently to the second electrode 1130. The third emitting part 1720 can further comprise at least one of a HTL3 1760 disposed between the CGL2 1680 and the EML3 1740, an ETL3 1770 disposed between the EML3 1740 and the second electrode 1130 and an EIL 1780 disposed between the ETL3 1770 and the second electrode 1130. Alternatively, the third emitting part 1720 can further comprise an EBL3 1765 disposed between the HTL3 1760 and the EML3 1740 and/or a HBL3 1775 disposed between the EML3 1740 and the ETL3 1770.

The CGL1 1380 is disposed between the first emitting part 1520 and the second emitting part 1620. That is, the first emitting part 1520 and the second emitting part 1620 are connected via the CGL1 1580. The CGL1 1580 can be a PN-junction CGL that junctions an N-CGL1 1582 with a P-CGL1 1584. The N-CGL1 1582 is disposed between the ETL1 1570 and the HTL2 1660 and the P-CGL1 1584 is disposed between the N-CGL1 1582 and the HTL2 1560.

The CGL2 1680 is disposed between the second emitting part 1620 and the third emitting part 1720. That is, the second emitting part 1620 and the third emitting part 1720 are connected via the CGL2 1680. The CGL2 1680 can be a PN-junction CGL that junctions an N-CGL2 1682 with a P-CGL2 1684. The N-CGL2 1682 is disposed between the ETL2 1570 and the HTL3 1760 and the P-CGL2 1684 is disposed between the N-CGL2 1682 and the HTL3 1760. In one exemplary aspect, at least one of the N-CGL1 1582 and the N-CGL2 1682 can include any organic compound having the structure of Chemical Formulae 1 to 3.

In this aspect, each of the EML1 1540 and the EML3 1740 can be a blue EML. In one exemplary aspect, each of the EML1 1540 and the EML3 1740 includes the lower EML 1542 or 1742 including the first compound H1, the second compound TD and the third compound FD1 for implementing TADF and the upper EML 1544 or 1744 including the fourth compound H2 and the fifth compound FD2 for implementing TTA.

In each of the first lower EML 1542 and the third lower EML 1742 implementing TADF, the contents the first compound H1 can be larger than the contents of the second compound TD and the contents of the second compound TD can be larger than the contents of the third compound FD1. In this case, exciton energy can be transferred efficiently from the second compound TD to the third compound FD1 via FRET mechanism. As an example, each of the contents of the first compound H1, the second compound TD, and the third compound FD1 in each of the first lower EML1 1542 and the third lower EML 1742 can be, but is not limited to, about 60 wt % to about 75 wt %, about 20 wt % to about 40 wt %, and about 0.1 wt % to about 5 wt %, respectively.

In addition, in each of the first upper EML 1544 and the third upper EML 1744 implementing TTA, the contents of the fourth compound H2 can be larger than the contents of the fifth compound FD2. For example, each of the contents of the fourth compound H2 and the fifth compound FD2 in each of the first upper EML 1544 and the third upper EML 1744 can be, but is not limited to, about 70 wt % to about 99 wt %, preferably about 90 wt % to about 99 wt %, and about 1 wt % to about 30 wt %, preferably about 1 wt % to about 10 wt %, respectively.

One of the second lower EML 1642 and the second upper EML 1644 in the EML2 1640 can be a green EML and the other of the second lower EML 1642 and the second upper EML 1644 in the EML2 1640 can be a red EML. That is, the green EML and the red EML are sequentially disposed to form the EML2 1640.

For example, the second lower EML 1642 as the green EML can comprise a host and green dopant. The host can comprise the first compound H1 and/or the fourth compound H2 and the green dopant can comprise at least one of green phosphorescent material, green fluorescent material and green delayed fluorescent material.

The second upper EML 1644 as the red EML can comprise a host and red dopant. The host can comprise the first compound H1 and/or the fourth compound H2 and the red dopant can comprise at least one of red phosphorescent material, red fluorescent material and red delayed fluorescent material.

The OLED D5 emits white light in each of the first to third pixel regions P1, P2 and P3 and the white light passes though the color filter layer 1020 (FIG. 11) correspondingly disposed in the first to third pixel regions P1, P2 and P3. Accordingly, the organic light emitting display device 1000 (FIG. 11) can implement a full-color image.

In FIG. 13, the OLED D5 has a three-stack structure including the first to three emitting parts 1520, 1620 and 1720 which includes the EML1 1540 and the EML3 1740 as a blue EML. Alternatively, the OLED D5 can have a two-stack structure where one of the first emitting part 1520 and the third emitting part 1720 each of which includes the EML1 1540 and the EML3 1740 as a blue EML is omitted.

Example 1 (Ex. 1): Fabrication of OLED

An OLED wherein a first EML (EML1) implements TADF and a second EML (EML2) implements a TTA was fabricated. The first EML includes Compound 1-1 in Chemical Formula 2 (2,6-di(9H-carbazol-9-yl)pyridine, 2,6-CzPy, LUMO: −2.6 eV; HOMO: −5.7 eV) as a first host (H1) and Compound 2-1 in Chemical Formula 4 (TDBA-DI, LUMO: −2.6 eV, HOMO: −5.5 eV) as the thermally activated delayed fluorescent material (TD). The second EML includes Compound 5-1 in Chemical Formula 10 (TBADN, LUMO: −2.6 eV, HOMO: −5.5 eV) as a second host (H2). Each of the first EML and the second EML includes Compound 3-1 in Chemical Formula 6 (DNBAN-2, LUMO: −2.8 eV, HOMO: −5.4 eV) as a fluorescent material, respectively. In addition, the EBL includes TAPC (LUMO: −2.0 eV, HOMO: −5.5 eV).

ITO substrate was washed by UV-Ozone treatment before using and loaded in an evaporation system. The ITO substrate was transferred to a vacuum chamber for depositing emissive layer. Subsequently, an anode, an emissive layer and a cathode were deposited by evaporation from a heating boat under $10^{-7}$ torr vacuum condition with setting deposition rate of 1 Å/s in the following order:

An anode; a HIL (HAT-CN, 7 nm); a HTL (NPB, 78 nm); an EBL (TAPC, 15 nm); an EML1 (2,6-CzPy:TDBAN-DI: DABNA-2=69:39:1 by weight ratio, 15 nm); an EML2 (TBADN:DABNA-2=97:3 by weight ratio, 15 nm); a HBL (B3PYMPM, 10 nm); an ETL (TPBi, 25 nm), an EIL (LiF); and a cathode (Al).

And then, capping layer (CPL) was deposited over the cathode and the device was encapsulated by glass. After deposition of emissive layer and the cathode, the OLED was transferred from the deposition chamber to a dry box for film formation, followed by encapsulation using UV-curable epoxy and moisture getter. The energy level relationships among the luminous materials in the EML and EBL are as follows: $LUMO^{H1}-HOMO^{TD}=2.9$ eV; $HOMO^{H1}-HOMO^{EBL}=-0.2$ eV.

Example 2 (Ex. 2): Fabrication of OLED

An OLED was fabricated using the same materials as Example 1, except that Compound 5-2 in Chemical Formula 10 (ADN, LUMO: −2.6 eV, HOMO: −5.8 eV) was used as the second host in the EML2 instead of TBADN.

Example 3 (Ex. 3): Fabrication of OLED

An OLED was fabricated using the same materials as Example 1, except that Compound 5-3 in Chemical Formula 10 (PADN) was used as the second host in the EML2 instead of TBADN.

Example 4 (Ex. 4): Fabrication of OLED

An OLED was fabricated using the same materials as Example 1, except that Compound 1-2 in Chemical Formula 2 (2,6-di(9H-3,9'-bicabazol-9-yl)pyridine, LUMO: −2.3 eV, HOMO: −5.5 eV) was used as the first host in the EML1 instead of 2,6-CzPy. $LUMO^{H1}-HOMO^{TD}=2.9$ eV; $HOMO^{H1}-HOMO^{EBL}=-0.2$ eV.

Example 5 (Ex. 5): Fabrication of OLED

An OLED was fabricated using the same materials as Example 4, except that Compound 5-2 in Chemical Formula 10 (ADN) was used as the second host in the EML2 instead of TBADN.

Example 6 (Ex. 6): Fabrication of OLED

An OLED was fabricated using the same materials as Example 4, except that Compound 5-3 in Chemical Formula 10 (PADN) was used as the second host in the EML2 instead of TBADN.

Example 7 (Ex. 7): Fabrication of OLED

An OLED was fabricated using the same materials as Example 1, except that Compound 1-3 in Chemical Formula 2 (9-(6-(9H-carbazol-9-yl)pyridine-2-yl)-9H-3,9'-bicarbazole, LUMO: −2.3 eV, HOMO: −5.4 eV) was used as the first host in the EML1 instead of 2,6-CzPy. $LUMO^{H1}-HOMO^{TD}=3.2$ eV; $HOMO^{H1}-HOMO^{EBL}=0.1$ eV.

Example 8 (Ex. 8): Fabrication of OLED

An OLED was fabricated using the same materials as Example 7, except that Compound 5-2 in Chemical Formula 10 (ADN) was used as the second host in the EML2 instead of TBADN.

Example 9 (Ex. 9): Fabrication of OLED

An OLED was fabricated using the same materials as Example 7, except that Compound 5-3 in Chemical Formula 10 (PADN) was used as the second host in the EML2 instead of TBADN.

Example 10 (Ex. 10): Fabrication of OLED

An OLED was fabricated using the same materials as Example 1, except that a thickness of the EML1 was modified to have 20 nm and a thickness of the EML2 was modified to have 10 nm.

Example 11 (Ex. 11): Fabrication of OLED

An OLED was fabricated using the same materials as Example 1, except that a thickness of the EML1 was modified to have 10 nm and a thickness of the EML2 was modified to have 20 nm.

Example 12 (Ex. 12): Fabrication of OLED

An OLED was fabricated using the same materials as Example 1, except that a thickness of the EML1 was modified to have 7.5 nm and a thickness of the EML2 was modified to have 22.5 nm.

Example 13 (Ex. 13): Fabrication of OLED

An OLED was fabricated using the same materials as Example 1, except that a thickness of the EML1 was modified to have 5 nm and a thickness of the EML2 was modified to have 25 nm.

Example 14 (Ex. 14): Fabrication of OLED

An OLED was fabricated using the same materials as Example 1, except that a thickness of the EML1 was modified to have 2.5 nm and a thickness of the EML2 was modified to have 27.5 nm.

Comparative Example 1 (Com. 1): Fabrication of OLED

An OLED was fabricated using the same materials as Example 1, except that triazine-based Ref. Host 1 (SF3-TRZ, LUMO: −3.1 eV, HOMO: −6.5 eV) was used as the first host in the EML1 instead of 2,6-CzPy. $LUMO^{H1}-HOMO^{TD}=2.4$ eV; $HOMO^{H1}-HOMO^{EBL}=-1.0$ eV.

Comparative Example 2 (Com. 2): Fabrication of OLED

An OLED where the EML1 implements TTA and EML2 implement TADF was fabricated. The OLED using the same materials as Example 1 was fabricated, except that the EML1 (TABDN:DNBNA-2=97:3 by weigh ratio, 15 nm) and the EML2 (2,6-CzPy:TDBA-DI:DABNA-2=69:30:1 by weight ratio, 15 nm) was modified.

Comparative Example 3 (Com. 3): Fabrication of OLED

An OLED where the EML1 implements TTA and EML2 implement TADF was fabricated. The OLED using the same materials as Com. 2 was fabricated, except that triazine-based SF3-TRZ was used as the second host in the EML2 instead of 2,6-CzPy.

Comparative Example 4 (Com. 4): Fabrication of OLED

An OLED having a single EML implementing TADF was fabricated. The OLED using the same material as Example 1 was fabricated, except the single EML (2,6-CzPy:TDBA-DI:DABNA-2=69:30:1 by weight ratio, 30 nm) was laminated instead of two EMLs.

Comparative Example 5 (Com. 5): Fabrication of OLED

An OLED having a single EML implementing TTA was fabricated. The OLED using the same material as Example 1 was fabricated, except the single EML (TBADN:DABNA-2=97:3 by weight ratio, 30 nm) was laminated instead of two EMLs.

Experimental Example 1: Measurement of Luminous Properties of OLED

Each of the OLED fabricated by Ex. 1-14 and Com. 1-5 was connected to an external power source and then luminous properties for all the diodes were evaluated using a constant current source (KEITHLEY) and a photometer PR650 at room temperature. In particular, driving voltage (V), current efficiency (cd/A), power efficiency (lm/W) and external quantum efficiency (EQE, %) at 8.6 mA/m² current density, and a time period ($T_{90}$) until the luminance decreased to 90% of the initial level at 300 nit were measured. The results thereof are shown in the following Table 1 and FIG. 8.

TABLE 1

Luminous Properties of OLED

| Sample | V | cd/A | lm/W | EQE (%) | $T_{90}$ (hours) |
|---|---|---|---|---|---|
| Com. 1 | 3.49 | 9.9 | 7.4 | 6.2 | ~120 |
| Com. 2 | 4.54 | 16.6 | 11.4 | 8.9 | ~600 |
| Com. 3 | 3.72 | 16.0 | 13.5 | 9.0 | ~100 |
| Com. 4 | 4.12 | 39.0 | 29.8 | 19.9 | ~300 |
| Com. 5 | 4.08 | 7.1 | 5.5 | 8.5 | ~2300 |
| Ex. 1 | 4.11 | 30.1 | 24.0 | 18.2 | ~600 |
| Ex. 2 | 4.02 | 18.7 | 14.6 | 14.3 | ~490 |
| Ex. 3 | 4.05 | 20.3 | 15.8 | 12.1 | ~530 |
| Ex. 4 | 4.30 | 31.6 | 23.1 | 14.8 | ~450 |
| Ex. 5 | 4.22 | 22.6 | 16.8 | 15.0 | ~440 |
| Ex. 6 | 4.20 | 25.7 | 19.2 | 16.0 | ~410 |
| Ex. 7 | 4.18 | 27.8 | 20.9 | 17.0 | ~400 |
| Ex. 8 | 4.14 | 28.5 | 21.7 | 17.4 | ~390 |
| Ex. 9 | 4.10 | 23.6 | 17.9 | 15.6 | ~440 |
| Ex. 10 | 4.12 | 34.6 | 26.2 | 19.0 | ~460 |
| Ex. 11 | 4.11 | 27.1 | 21.7 | 17.3 | ~820 |
| Ex. 12 | 4.11 | 23.4 | 16.7 | 15.8 | ~1200 |
| Ex. 13 | 4.10 | 16.8 | 14.5 | 15.1 | ~1500 |
| Ex. 14 | 4.09 | 9.3 | 9.2 | 12.6 | ~1800 |

As indicated in Table 1, compared to the OLED where the triazine-based host having relatively storing electron affinity were applied into the EML1 in Com. 1, the OLEDs fabricated in Ex. 1-14 improved their current efficiency, power efficiency, EQE and luminous lifetime up to 249.5%, 254.1%, 206.5% and 1400.0%, respectively. Compared to the OLED where the EML1 implements TTA and the EML2 implements TADF in Com. 2, the OLEDs fabricated in Ex. 1-14 lowered their driving voltages up to 11.5% and improved their current efficiency, power efficiency, EQE and luminous lifetime up to 108.4%, 129.8%, 113.5% and 757.1%, respectively. Compared to the OLED where the EML1 implements TTA and the EML2 implements TADF by introducing the triazine-based host SF3-TRZ in Com. 3, the OLEDs fabricated in Ex. 1-14 improved their current efficiency, power efficiency, EQE and luminous lifetime up to 116.3%, 94.1%, 111.1% and 1700.0%, respectively.

Also, compared to the OLED where the EML implements only TADF in Com. 4, the OLEDs fabricated in Ex. 1-14 improved their luminous lifetime up to six times. In addition, compared to the OLED where the EML implements only TTA in Com. 5, the OLEDs fabricated in Ex. 1-14 improved their current efficiency, power efficiency and EQE up to 387.3%, 376.4% and 123.5%, respectively.

Moreover, as illustrated in FIG. 8, the EQE of the OLED where the EML implements only TADF in Com. 4 was decreased rapidly as the current density increased. On the other hand, the EQE of the OLED in Ex. 1 was less changed as the current density increased, and its EQE was relatively high compared to the EQE in Com. 4 in ranges of high currents. The EQE of the OLED where the EML implements only TTA in Com. 5 was little changed as the current density increased.

While the present disclosure has been described with reference to exemplary aspects and examples, these aspects and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents.

What is claimed is:

1. An organic light emitting diode, comprising:
a first electrode;
a second electrode facing the first electrode; and
an emitting material layer disposed between the first and second electrodes,
wherein the emitting material layer comprises a first emitting material layer disposed between the first and second electrodes and a second emitting material layer disposed between the first emitting material layer and the second electrode,
wherein the first emitting material layer comprises a first compound, a second compound and a third compound, and the second emitting material layer comprises a fourth compound and a fifth compound, and
wherein the first compound comprises an organic compound selected from:

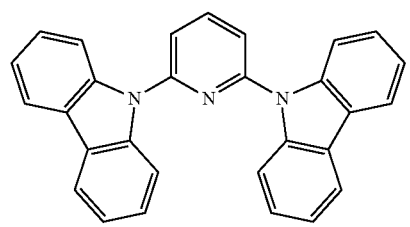

1-1

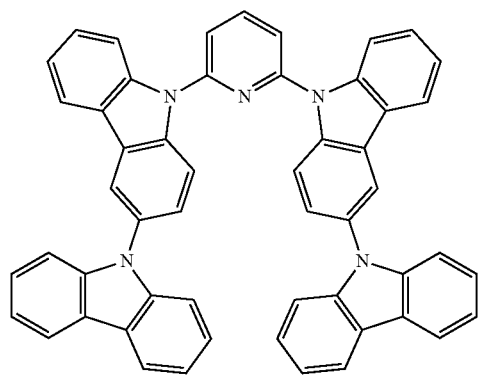

1-2

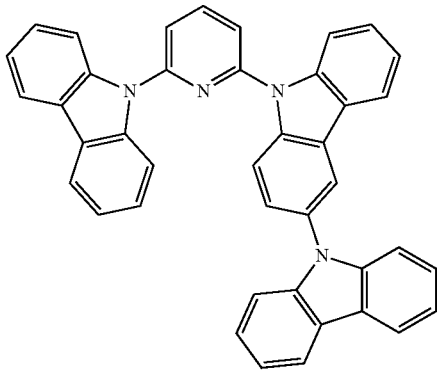

1-3

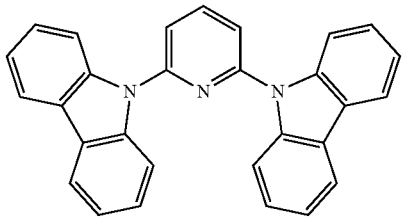

1-4

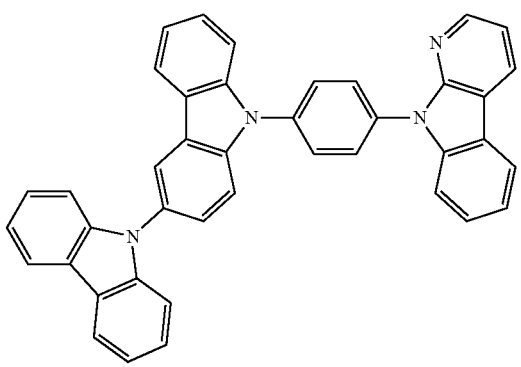

1-5

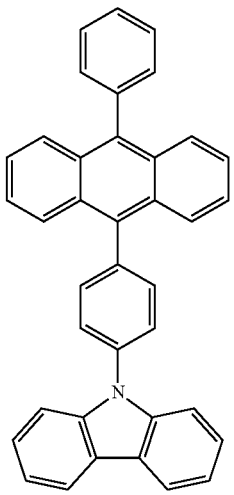

1-6

1-7
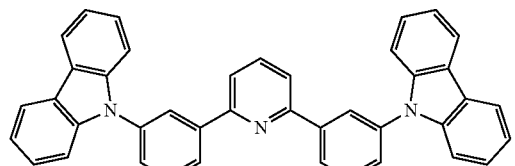
1-8
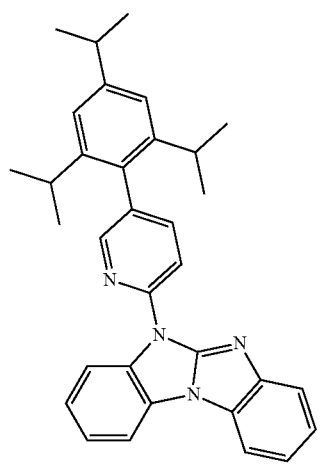
1-9
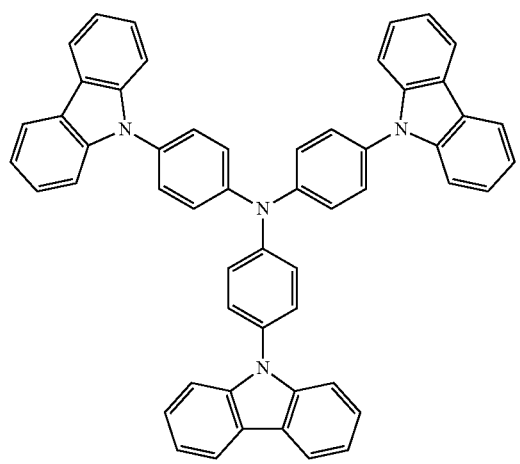
1-10
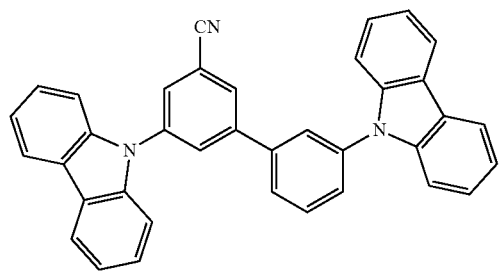
1-11
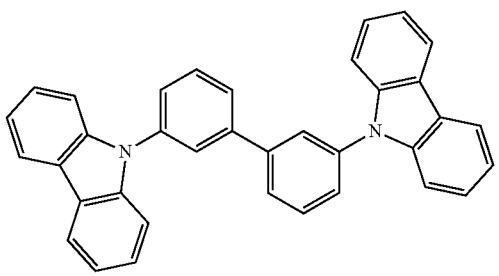
1-12
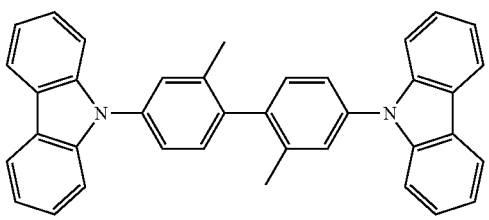
1-13
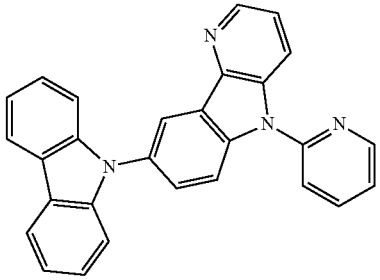
1-14
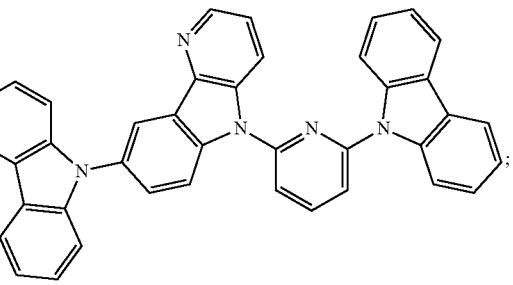
the second compound comprises an organic compound having the following structure of Chemical Formula 3:
Chemical Formula 3
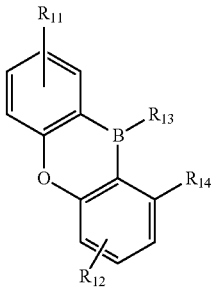

wherein each of $R_{11}$ and $R_{12}$ is independently protium, deuterium, tritium, an unsubstituted or substituted $C_1$-$C_{10}$ alkyl group or an unsubstituted or substituted fused hetero aromatic group selected from the group consisting of a carbazole moiety, an acridinyl moiety, a dihydro acridinyl moiety, a phenazinyl moiety and a phenoxazinyl moiety, wherein the fused hetero aromatic group can form a spiro structure, and at least one of $R_{11}$ and $R_{12}$ is the fused hetero aromatic group; and each of $R_{13}$ and $R_{14}$ is independently an unsubstituted or substituted $C_6$-$C_{20}$ aryl group or an unsubstituted or substituted $C_3$-$C_{30}$ hetero aryl group, wherein each of $R_{13}$ and $R_{14}$ is independently link directly or via a $C_6$-$C_{20}$ arylene ring to boron atom or to the benzene ring, or $R_{13}$ and $R_{14}$ form a fused hetero aromatic ring containing at least one oxygen atom;

or selected from:

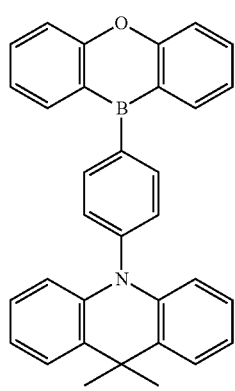

2-8

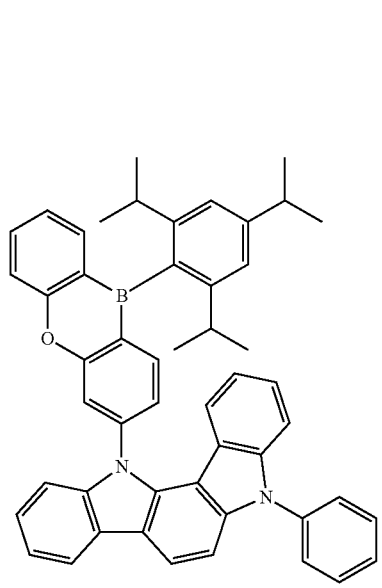

2-9

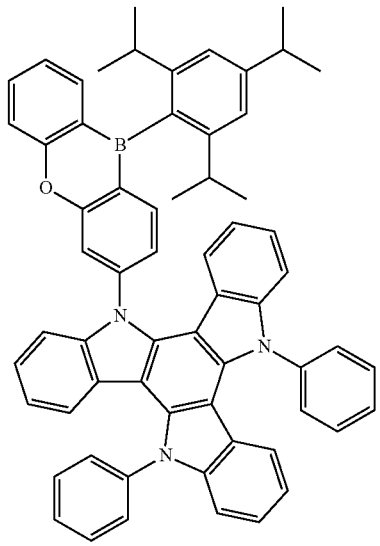

2-10

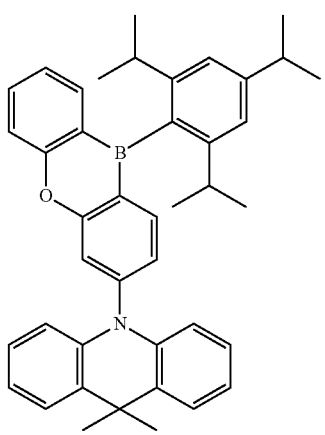

2-11

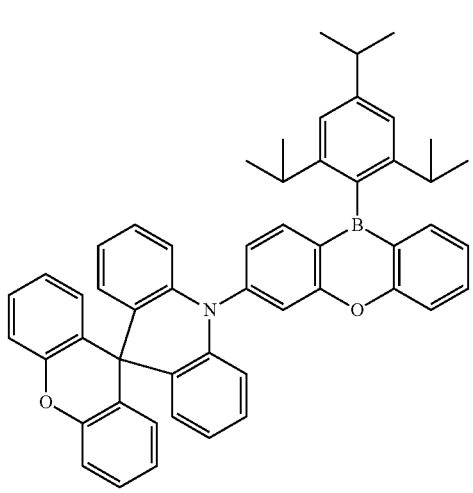

2-12

2-13
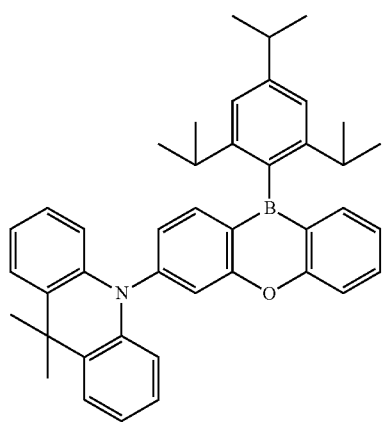
and the fourth compound comprises an organic compound selected from:
5-1
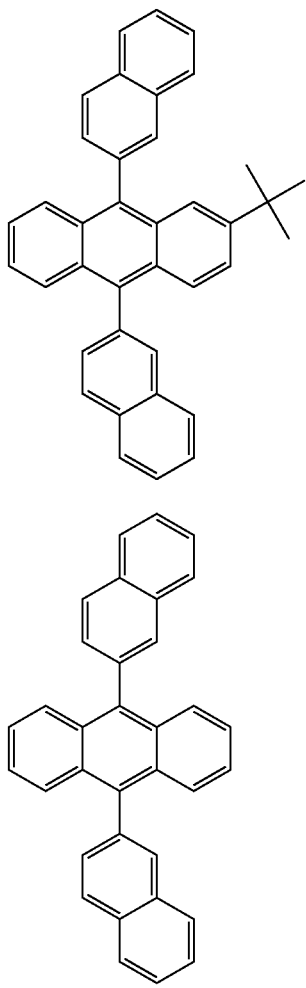
2-14
5-2
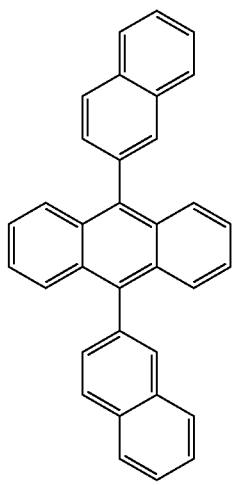
2-15
5-3
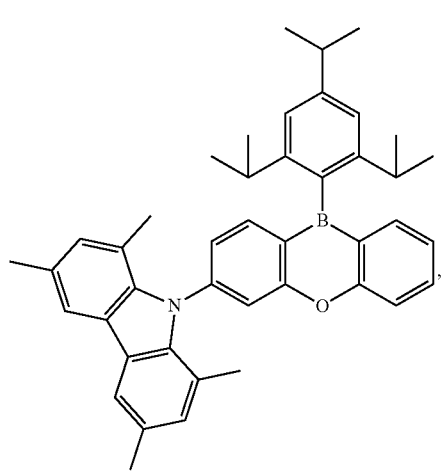
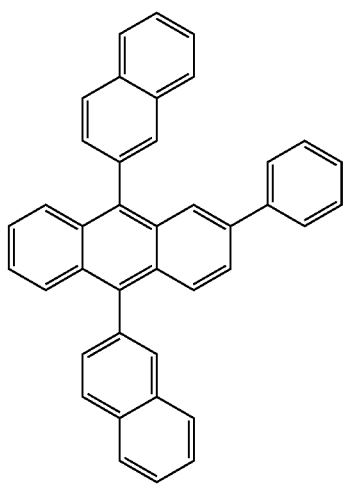

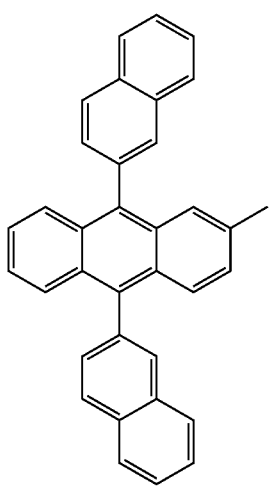
5-4
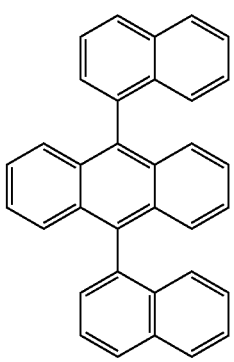
5-5
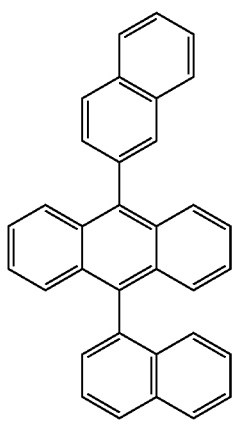
5-7
5-8
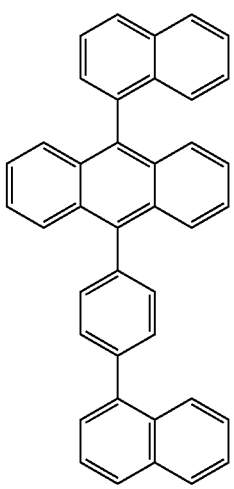
5-6
5-9
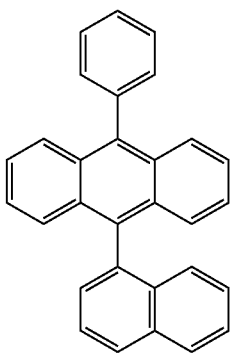

-continued 5-10

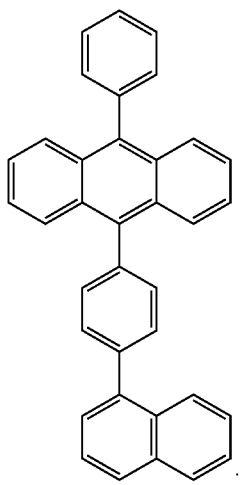

2. The organic light emitting diode of claim 1, wherein a LUMO (Lowest Unoccupied Molecular Orbital) energy level ($LUMO^{H1}$) of the first compound and a HOMO (Highest Occupied Molecular orbital) energy level ($HOMO^{TD}$) of the second compound satisfy the following relationship in Equation (1):

$$|LUMO^{H1}-HOMO^{TD}|>2.4 \text{ eV} \qquad (1).$$

3. The organic light emitting diode of claim 1, wherein the third compound comprises an organic compound having the following structure of Chemical Formula 5 and the fifth compound comprises an organic compound having the following structure of Chemical Formula 7:

Chemical Formula 5

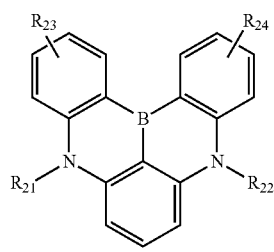

wherein each of $R_{21}$ to $R_{24}$ is independently protium, deuterium, tritium, an unsubstituted or substituted $C_6$-$C_{20}$ aryl group, an unsubstituted or substituted $C_3$-$C_{20}$ hetero aryl group, an unsubstituted or substituted $C_6$-$C_{20}$ aryl amino group or an unsubstituted or substituted $C_3$-$C_{20}$ hetero aryl amino group; and Chemical Formula 7

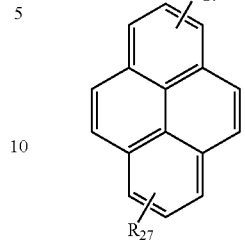

wherein each of $R_{26}$ and $R_{27}$ is independently an unsubstituted or substituted $C_6$-$C_{20}$ aryl amino group or an unsubstituted or substituted $C_3$-$C_{20}$ hetero aryl amino group.

4. The organic light emitting diode of claim 1, wherein the second compound comprises any organic compound selected from:

2-1

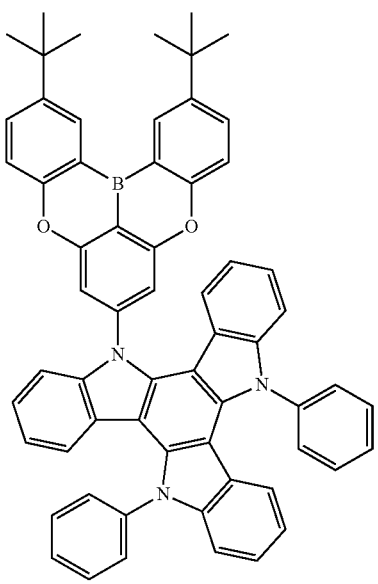

2-2

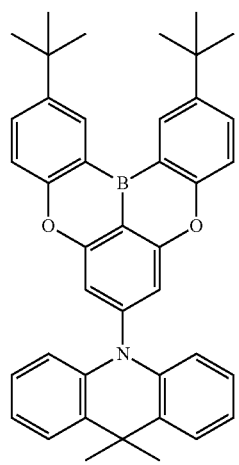

-continued
2-3
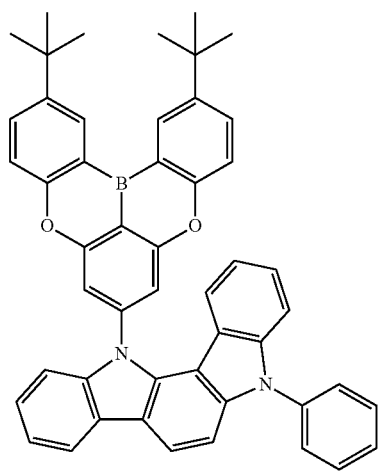
2-4
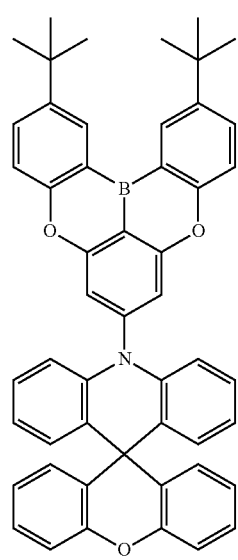
2-5
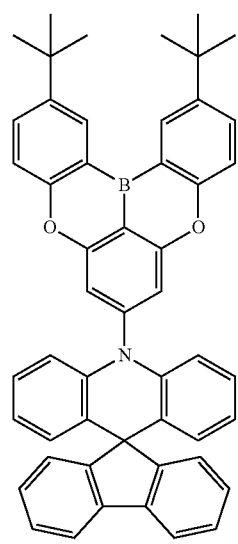
-continued
2-6
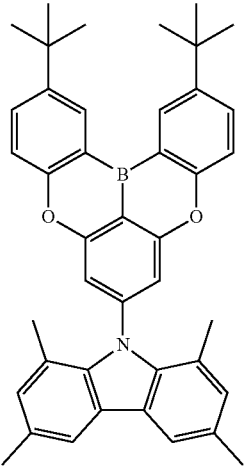
2-7
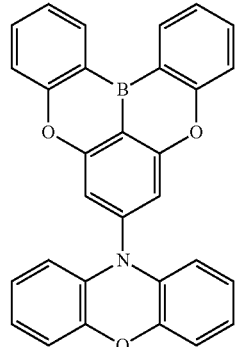
2-8
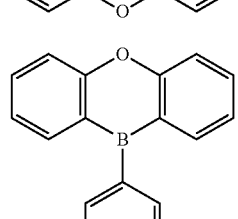
2-9
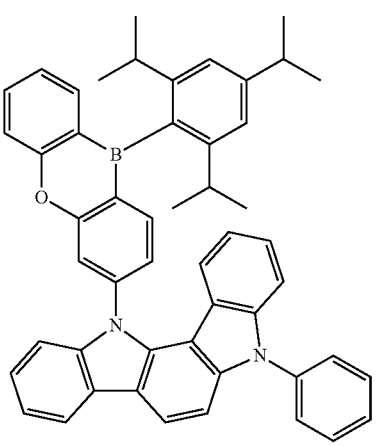

2-10
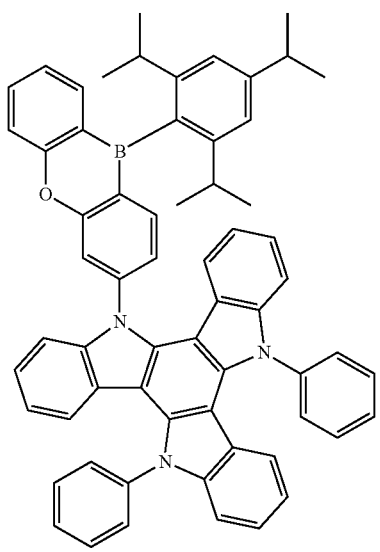
2-11
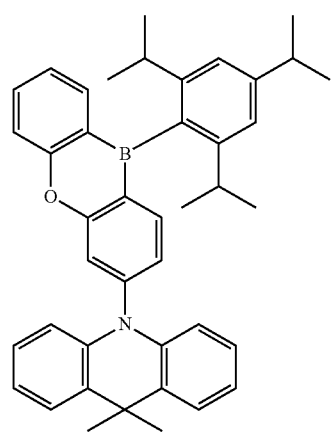
2-12
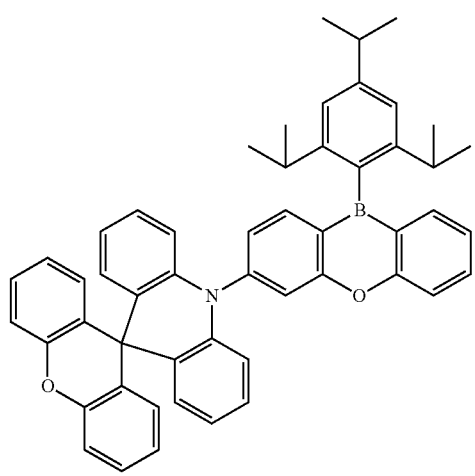
2-13
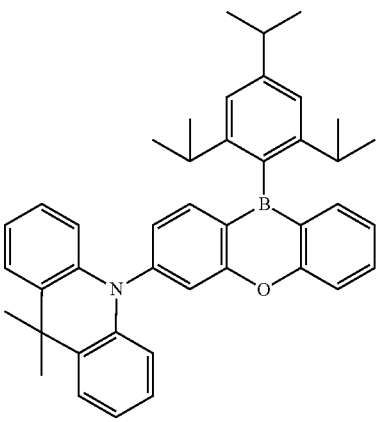
2-14
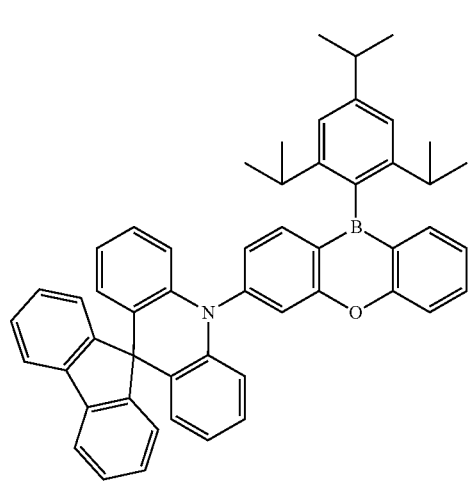
2-15
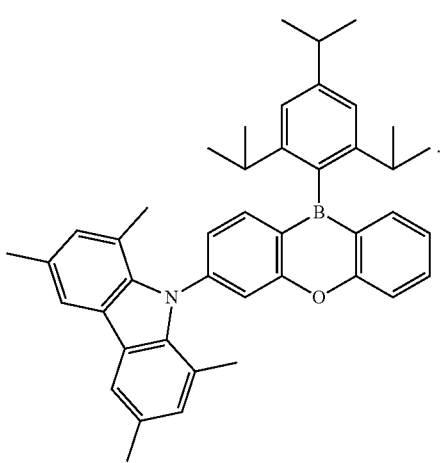

5. The organic light emitting diode of claim 1, wherein the third compound comprises any organic compound selected from:
3-1
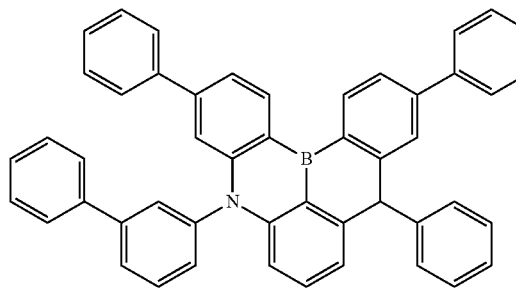
3-2
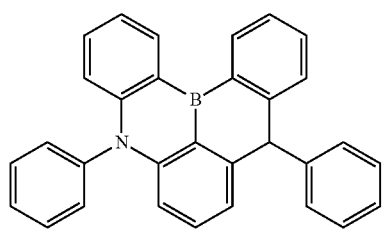
3-3
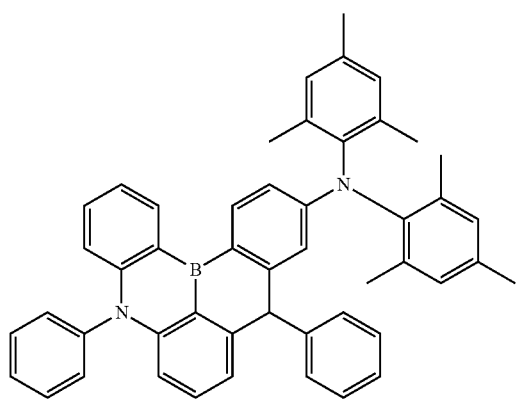
3-4
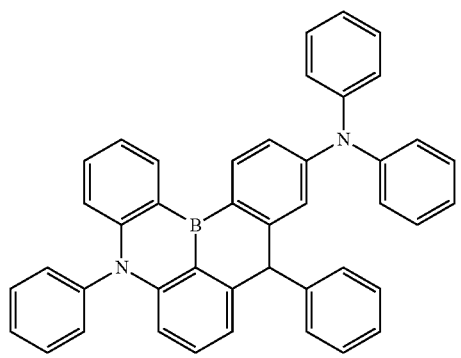
3-5
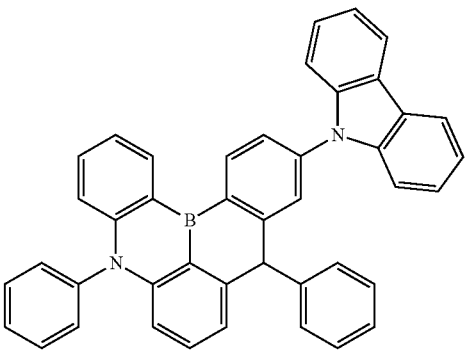
3-6
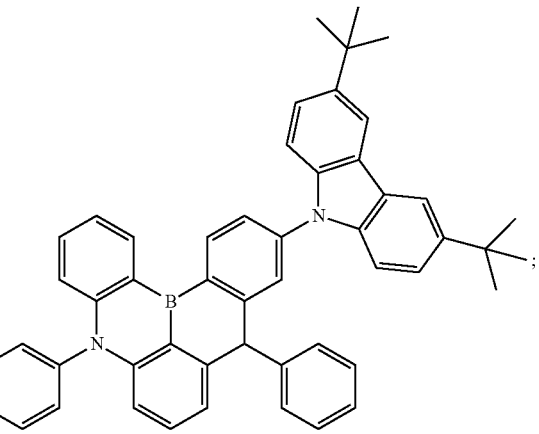
and wherein the fifth compound comprises any organic compound selected from:
4-1
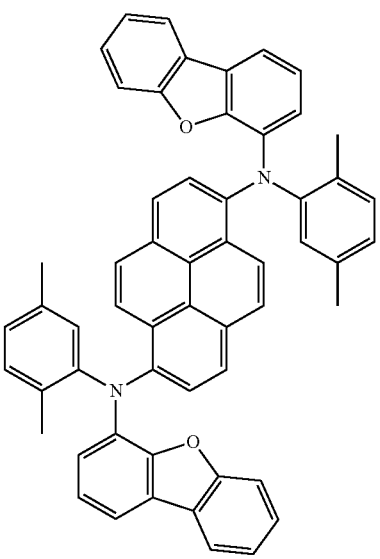

-continued

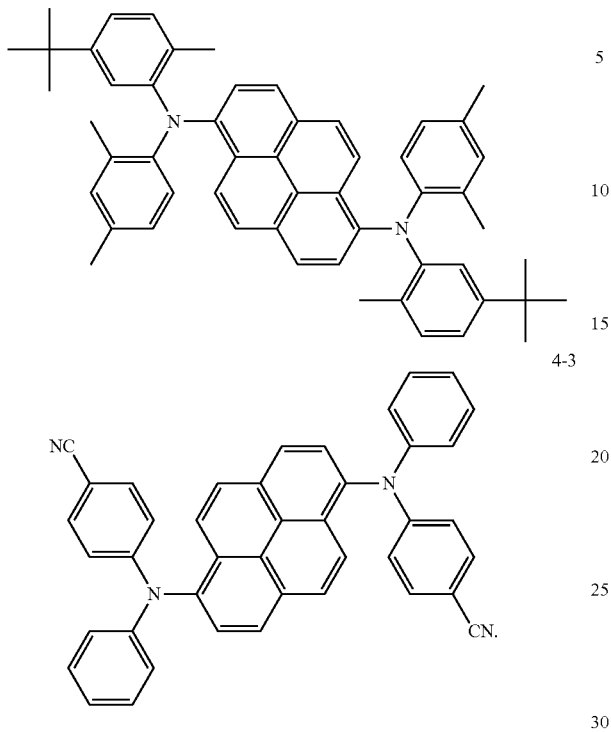

6. The organic light emitting diode of claim 1, further comprises an electron blocking layer disposed between the first electrode and the first emitting material layer, wherein a HOMO energy level ($HOMO^{H1}$) of the first compound and a HOMO energy level ($HOMO^{EBL}$) of a material of the electron blocking layer satisfy the following relationship in Equation (2):

$$0 \text{ eV} \leq |HOMO^{H1} - HOMO^{EBL}| < 0.8 \text{ eV} \quad (2).$$

7. The organic light emitting diode of claim 1, wherein an excited singlet energy level ($S_1^{TD}$) of the second compound is higher than an excited singlet energy level ($S_1^{FD1}$) of the third compound.

8. The organic light emitting diode of claim 1, wherein an excited singlet energy level ($S_1^{H2}$) of the fourth compound is higher than an excited singlet energy level ($S_1^{FD2}$) of the fifth compound, and wherein an excited triplet energy level ($T_1^{H2}$) of the fourth compound is lower than an excited triplet energy level ($T_1^{FD2}$) of the fifth compound.

9. An organic light emitting diode, comprising:
a first electrode;
a second electrode facing the first electrode; and
an emitting material layer disposed between the first and second electrodes,
wherein the emitting material layer comprises a first emitting material layer disposed between the first and second electrodes and a second emitting material layer disposed between the first emitting material layer and the second electrode,
wherein the first emitting material layer comprises a first compound, a second compound and a third compound, and the second emitting material layer comprises a fourth compound and a fifth compound,
wherein the first compound comprises an organic compound selected from:

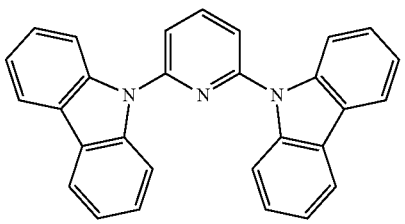

1-1

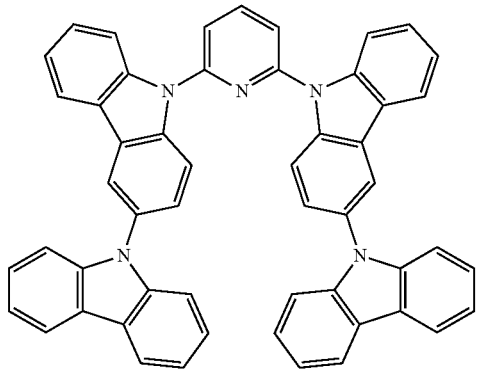

1-2

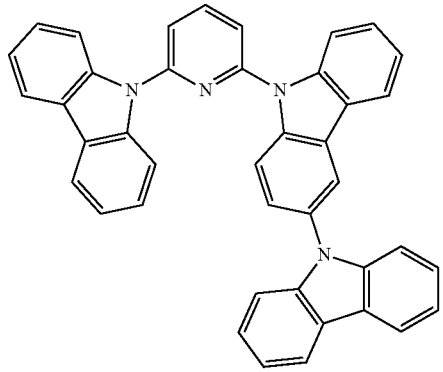

1-3

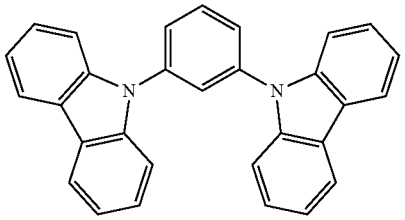

1-4

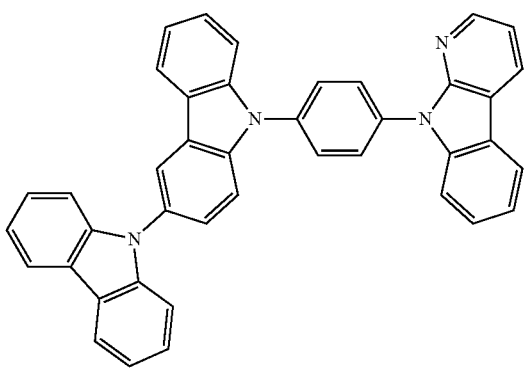

1-5

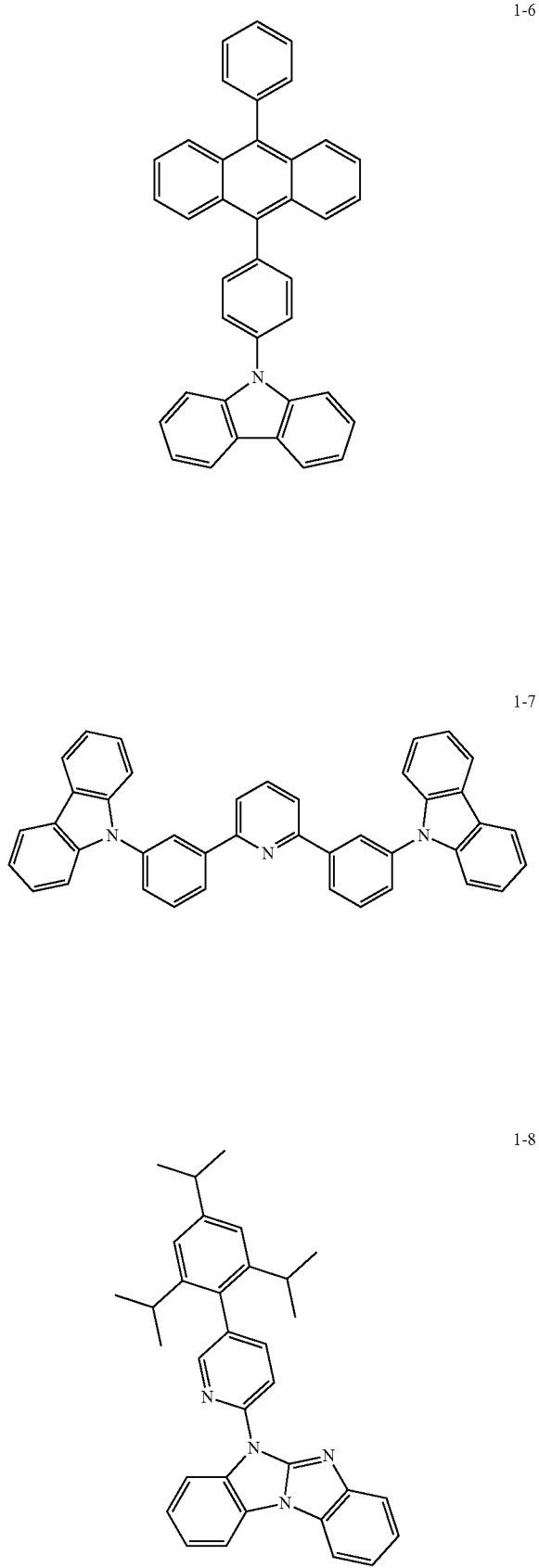
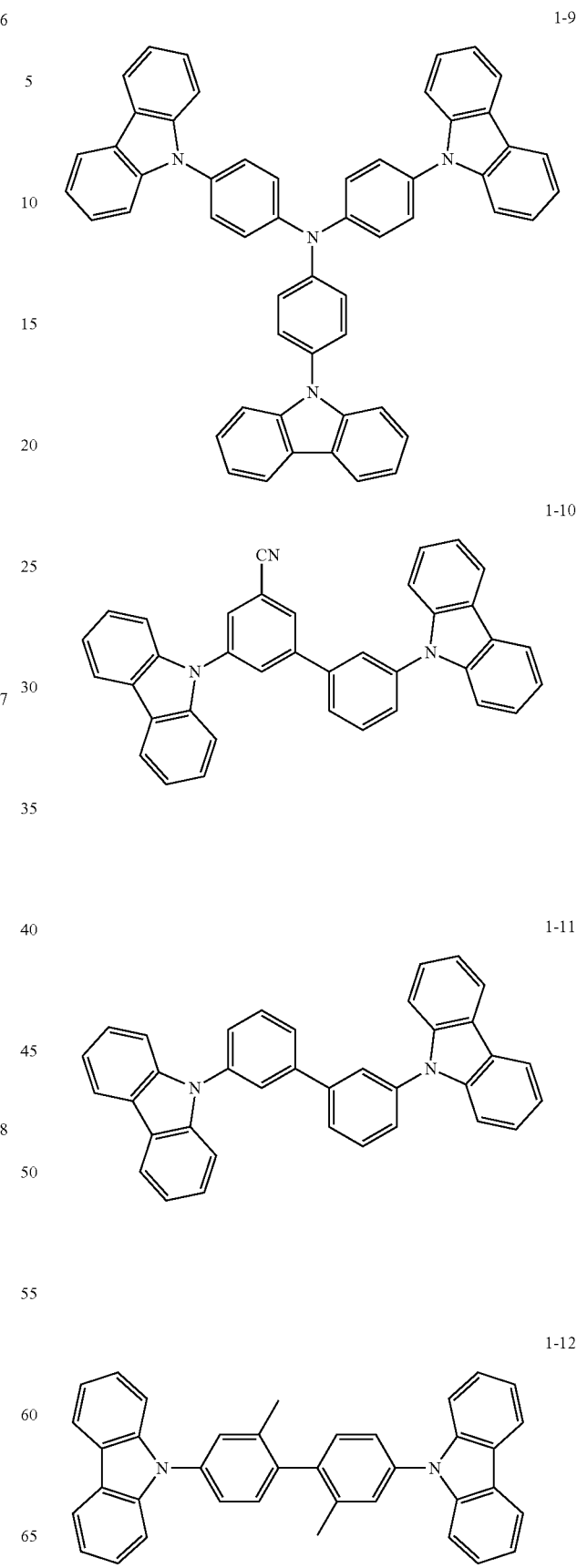

1-13
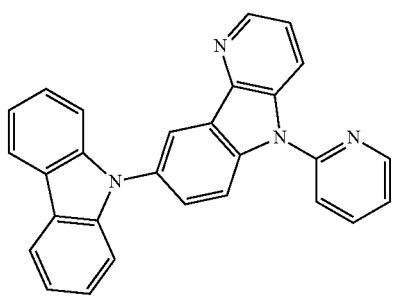
1-14
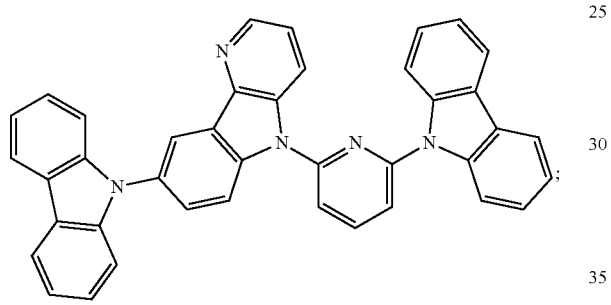
the fourth compound comprises an organic compound selected from:
5-1
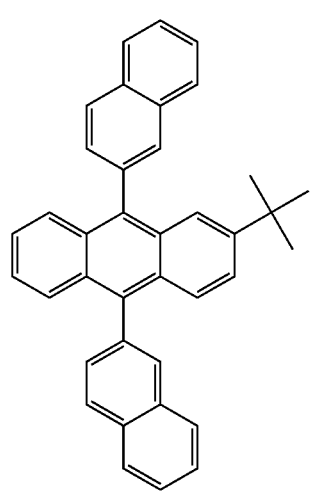
5-2
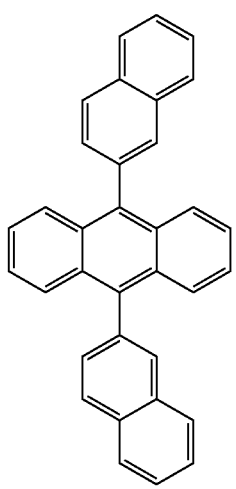
5-3
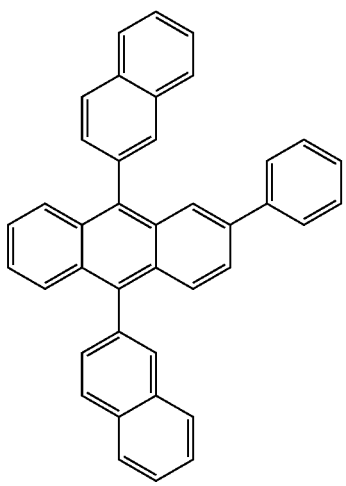
5-4
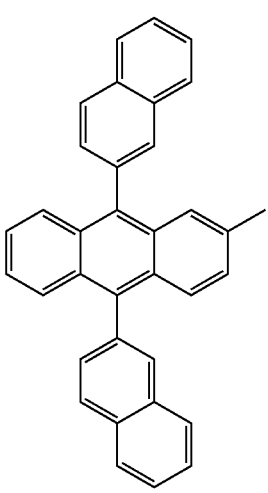

-continued 5-5
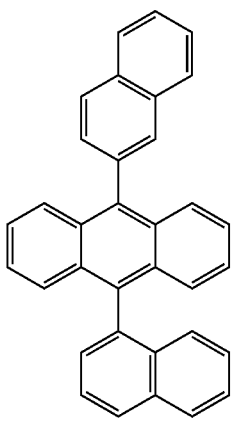

5-6
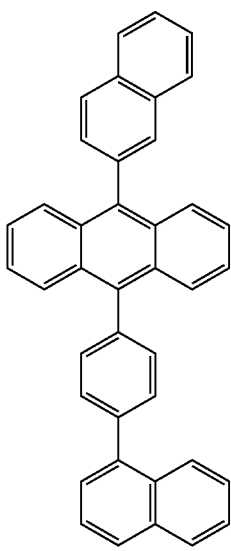

5-7
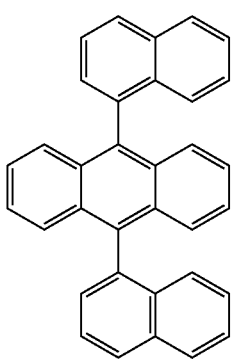

-continued 5-8
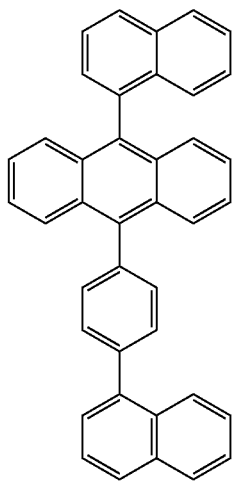

5-9
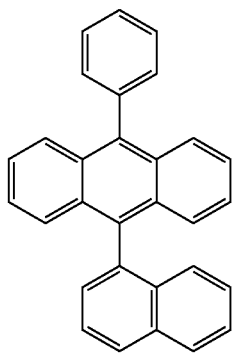

5-10
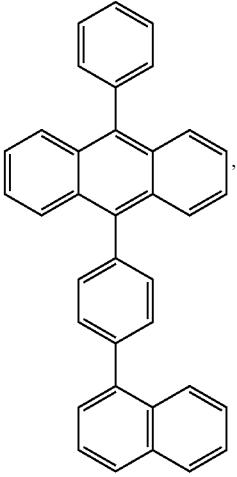

and
wherein an energy level bandgap ($\Delta E_{ST}^{TD}$) between an excited singlet energy level ($S_1^{TD}$) and an excited triplet energy level ($T_1^{TD}$) of the second compound is about 0.3 eV or less.

10. The organic light emitting diode of claim 9, wherein a LUMO (Lowest Unoccupied Molecular Orbital) energy level ($LUMO^{H1}$) of the first compound and a HOMO (Highest Occupied Molecular orbital) energy level ($HOMO^{TD}$) of the second compound satisfy the following relationship in Equation (1):

$$|LUMO^{H1} - HOMO^{TD}| > 2.4 \text{ eV} \qquad (1).$$

11. The organic light emitting diode of claim 9, wherein the second compound comprises an organic compound having the following structure of Chemical Formula 3:

Chemical Formula 3

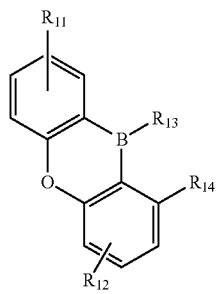

wherein each of $R_{11}$ and $R_{12}$ is independently protium, deuterium, tritium, an unsubstituted or substituted $C_1$-$C_{10}$ alkyl group or an unsubstituted or substituted fused hetero aromatic group selected from the group consisting of a carbazole moiety, an acridinyl moiety, a dihydro acridinyl moiety, a phenazinyl moiety and a phenoxazinyl moiety, wherein the fused hetero aromatic group can form a spiro structure, and at least one of $R_{11}$ and $R_{12}$ is the fused hetero aromatic group; and each of $R_{13}$ and $R_{14}$ is independently an unsubstituted or substituted $C_6$-$C_{20}$ aryl group or an unsubstituted or substituted $C_3$-$C_{30}$ hetero aryl group, wherein each of $R_{13}$ and $R_{14}$ is independently link directly or via a $C_6$-$C_{ao}$ arylene ring to boron atom or to the benzene ring, or $R_{13}$ and $R_{14}$ form a fused hetero aromatic ring containing at least one oxygen atom;

or selected from:

2-8

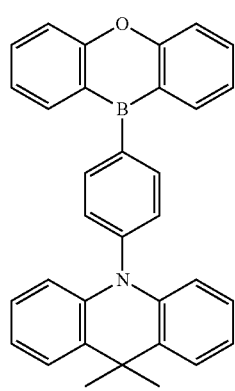

-continued 2-9

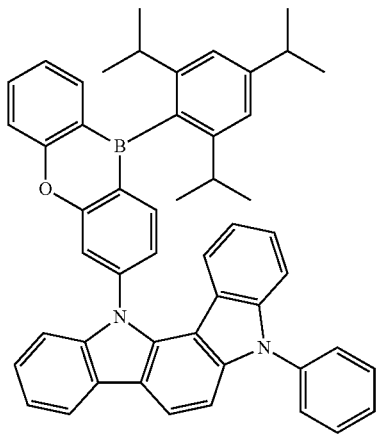

2-10

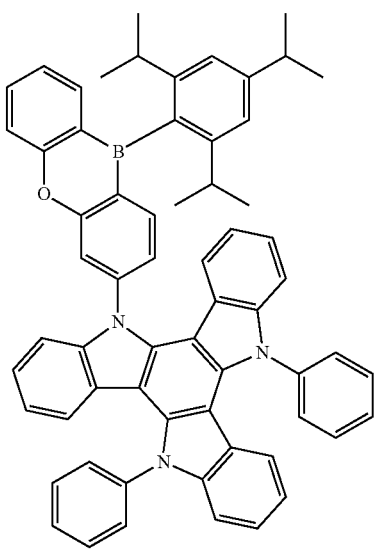

2-11

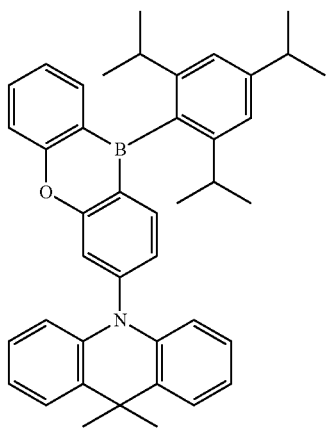

2-12

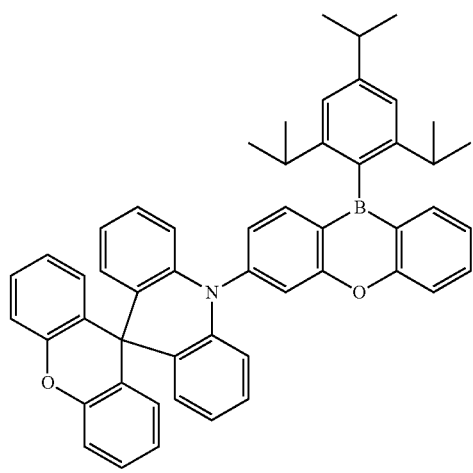

2-13

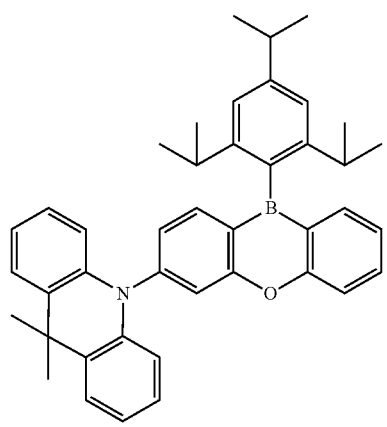

2-14

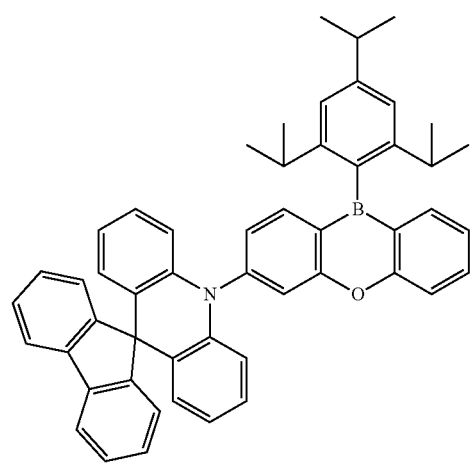

2-15

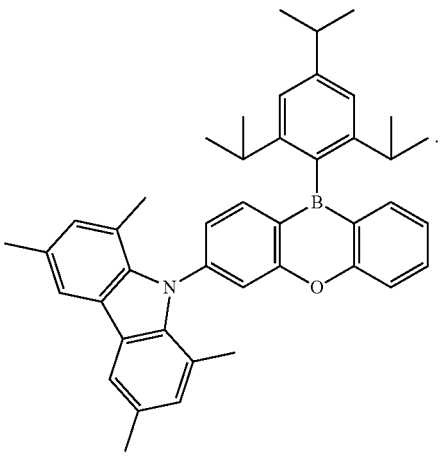

12. The organic light emitting diode of claim 9, wherein the third compound comprises an organic compound having the following structure of Chemical Formula 5 and the fifth compound comprises an organic compound having the following structure of Chemical Formula 7:

Chemical Formula 5

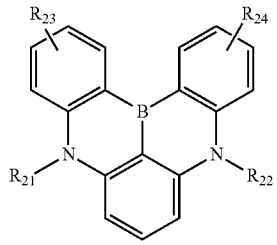

wherein each of $R_{21}$ to $R_{24}$ is independently protium, deuterium, tritium, an unsubstituted or substituted $C_6$-$C_{20}$ aryl group, an unsubstituted or substituted $C_3$-$C_{20}$ hetero aryl group, an unsubstituted or substituted $C_6$-$C_{20}$ aryl amino group or an unsubstituted or substituted $C_3$-$C_{20}$ hetero aryl amino group; and Chemical Formula 7

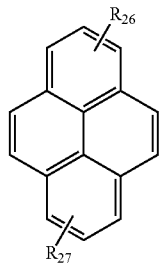

wherein each of $R_{26}$ and $R_{27}$ is independently an unsubstituted or substituted $C_6$-$C_{20}$ aryl amino group or an unsubstituted or substituted $C_3$-$C_{20}$ hetero aryl amino group.

13. The organic light emitting diode of claim 9, further comprises an electron blocking layer disposed between the first electrode and the first emitting material layer.

14. The organic light emitting diode of claim 13, wherein a HOMO energy level ($HOMO^{H1}$) of the first compound and a HOMO energy level ($HOMO^{EBL}$) of a material of the electron blocking layer satisfy the following relationship in Equation (2):

$$0 \text{ eV} \leq |HOMO^{H1} - HOMO^{EBL}| < 0.8 \text{ eV} \qquad (2).$$

15. The organic light emitting diode of claim 9, wherein an excited singlet energy level ($S_1^{H1}$) and an excited triplet energy level ($T_1^{H1}$) of the first compound are higher than an excited singlet energy level ($S_1^{TD}$) and an excited triplet energy level ($T_1^{TD}$) of the second compound, respectively.

16. The organic light emitting diode of claim 9, wherein an excited singlet energy level ($S_1^{TD}$) of the second compound is higher than an excited singlet energy level ($S_1^{FD1}$) of the third compound.

17. The organic light emitting diode of claim 9, wherein an excited singlet energy level ($S_1^{H2}$) of the fourth compound is higher than an excited singlet energy level ($S_1^{FD2}$) of the fifth compound, and wherein an excited triplet energy level ($T_1^{H2}$) of the fourth compound is lower than an excited triplet energy level ($T_1^{FD2}$) of the fifth compound.

18. An organic light emitting device comprising:
a substrate; and
the organic light emitting diode of claim 1 over the substrate.

19. An organic light emitting device comprising:
a substrate; and
the organic light emitting diode of claim 11 over the substrate.

20. The organic light emitting diode of claim 9, wherein the third compound comprises any organic compound selected from:

3-1
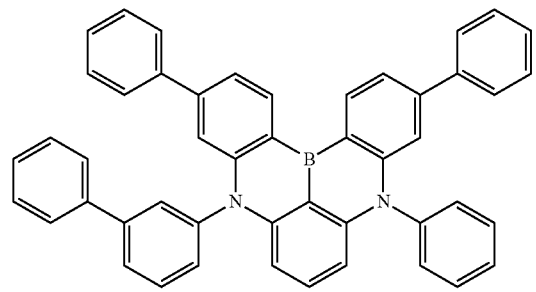

3-2
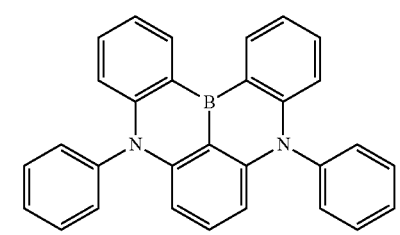

3-3
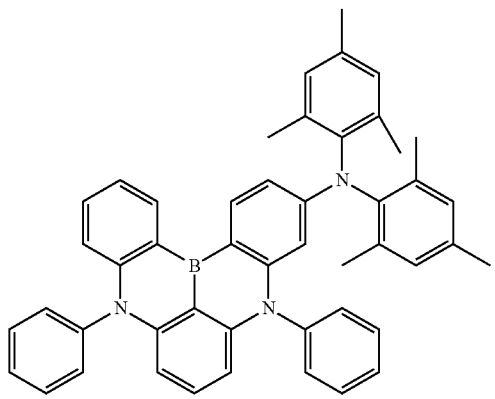

3-4
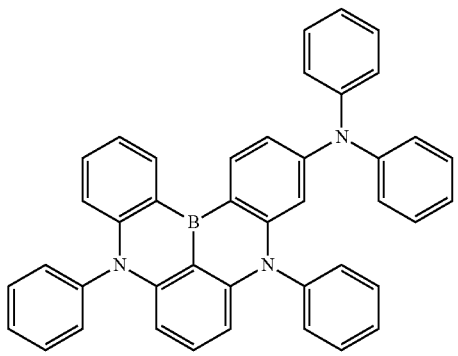

3-5
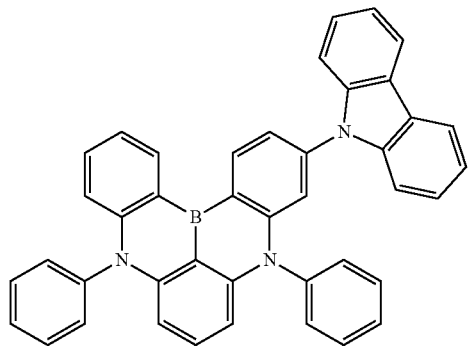

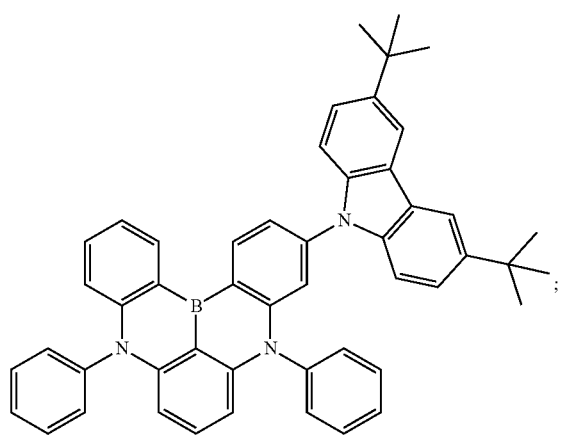
3-6
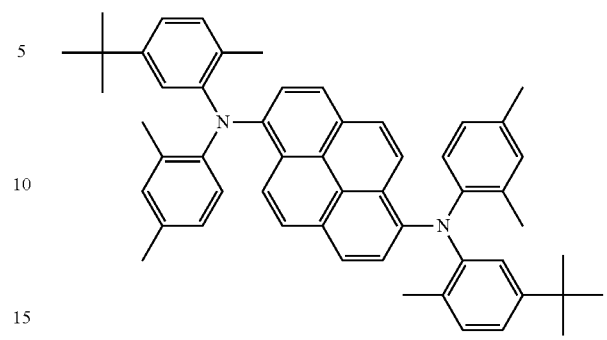
4-2
and wherein the fifth compound comprises any organic compound selected from:
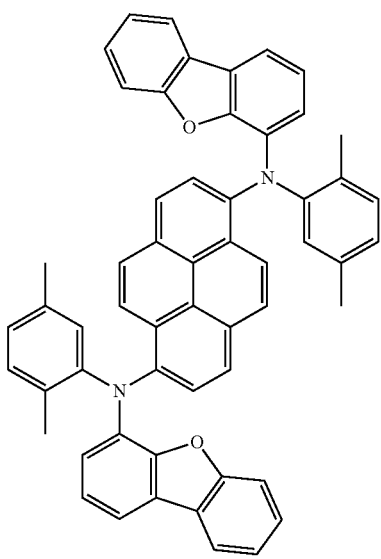
4-1
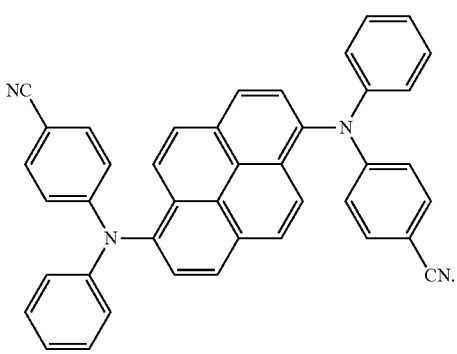
4-3
* * * * *